US 8,431,817 B2

(12) United States Patent
Kim et al.

(10) Patent No.: US 8,431,817 B2
(45) Date of Patent: Apr. 30, 2013

(54) MULTI-JUNCTION SOLAR CELL HAVING SIDEWALL BI-LAYER ELECTRICAL INTERCONNECT

(75) Inventors: James C. Kim, Mountain View, CA (US); Sungsoo Yi, Sunnyvale, CA (US); Danny E. Mars, Los Altos, CA (US)

(73) Assignee: Sundiode Inc., Sunnyvale, CA (US)

( * ) Notice: Subject to any disclaimer, the term of this patent is extended or adjusted under 35 U.S.C. 154(b) by 275 days.

(21) Appl. No.: 12/796,589

(22) Filed: Jun. 8, 2010

(65) Prior Publication Data
US 2011/0297214 A1 Dec. 8, 2011

(51) Int. Cl.
*H01L 31/00* (2006.01)
(52) U.S. Cl.
USPC ............ 136/256; 136/255; 257/81; 257/231; 257/746; 257/748; 257/774; 438/57; 438/94; 438/98; 438/129; 438/584; 438/595; 438/596; 438/597; 977/720; 977/825; 977/932; 977/948; 977/949; 977/950
(58) Field of Classification Search .......... 136/243–265; 438/57, 129, 584, 595, 596, 98; 257/81, 257/231, 746, 748, 774, 14
See application file for complete search history.

(56) References Cited

U.S. PATENT DOCUMENTS

| | | | |
|---|---|---|---|
| 4,980,553 A | 12/1990 | Henry | |
| 5,332,910 A | 7/1994 | Haraguchi et al. | |
| 6,352,777 B1 * | 3/2002 | Bulovic et al. | 428/411.1 |
| 6,677,624 B2 | 1/2004 | Ihm | |
| 6,830,981 B2 | 12/2004 | Lee et al. | |
| 6,833,567 B2 | 12/2004 | Choi et al. | |
| 6,864,557 B2 | 3/2005 | Turner et al. | |
| 6,894,265 B2 | 5/2005 | Merrill et al. | |
| 6,914,256 B2 * | 7/2005 | Zhang et al. | 257/15 |
| 6,914,314 B2 | 7/2005 | Merrill et al. | |
| 6,930,336 B1 | 8/2005 | Merrill | |
| 7,164,444 B1 | 1/2007 | Merrill | |
| 7,166,880 B2 | 1/2007 | Merrill et al. | |
| 7,202,173 B2 * | 4/2007 | Hantschel et al. | 438/694 |
| 7,235,475 B2 * | 6/2007 | Kamins | 438/618 |

(Continued)

FOREIGN PATENT DOCUMENTS

| | | | |
|---|---|---|---|
| EP | 0341121 A1 | | 11/1989 |
| WO | WO2008156421 | * | 12/2008 |
| WO | 2009135078 A2 | | 11/2009 |

OTHER PUBLICATIONS

HyperPhysics, "P-N Junction", posted online May 25, 2000, http://hyperphysics.phy-astr.gsu.edu/hbase/solids/pnjun.html.*

(Continued)

*Primary Examiner* — Nicholas A Smith
*Assistant Examiner* — Liesl C Baumann
(74) *Attorney, Agent, or Firm* — Vierra Magen Marcus LLP

(57) ABSTRACT

Nanostructure array optoelectronic devices are disclosed. The optoelectronic device may be a multi junction solar cell. The optoelectronic device may have a bi-layer electrical interconnect that is physically and electrically connected to sidewalls of the array of nanostructures. The optoelectronic device may be operated as a multi junction solar cell, wherein each junction is associated with one portion of the device. The bi-layer electrical interconnect allows current to pass from one portion to the next. Thus, the bi-layer electrical interconnect may serve as a replacement for a tunnel junction, which is used in some conventional multi junction solar cells.

14 Claims, 46 Drawing Sheets

U.S. PATENT DOCUMENTS

| | | | |
|---|---|---|---|
| 7,339,216 B1 | 3/2008 | Lyon et al. | |
| 7,396,696 B2 | 7/2008 | Kim et al. | |
| 7,402,531 B1* | 7/2008 | Kuekes et al. | 438/755 |
| 7,449,776 B2* | 11/2008 | Wang et al. | 257/714 |
| 7,514,725 B2* | 4/2009 | Wojtczuk et al. | 257/103 |
| 7,589,880 B2* | 9/2009 | Kempa et al. | 359/245 |
| 7,754,964 B2* | 7/2010 | Kempa et al. | 136/255 |
| 8,314,439 B2* | 11/2012 | Tan et al. | 257/98 |
| 2002/0172820 A1* | 11/2002 | Majumdar et al. | 428/357 |
| 2004/0157354 A1 | 8/2004 | Kuriyama et al. | |
| 2005/0161662 A1 | 7/2005 | Majumdar et al. | |
| 2006/0008942 A1* | 1/2006 | Romano et al. | 438/99 |
| 2006/0207647 A1* | 9/2006 | Tsakalakos et al. | 136/256 |
| 2006/0223211 A1 | 10/2006 | Mishra et al. | |
| 2007/0037365 A1* | 2/2007 | Ranganath et al. | 438/478 |
| 2007/0164270 A1* | 7/2007 | Majumdar et al. | 257/14 |
| 2008/0110486 A1* | 5/2008 | Tsakalakos et al. | 136/244 |
| 2008/0135089 A1* | 6/2008 | Tsakalakos et al. | 136/248 |
| 2008/0156366 A1 | 7/2008 | Kim et al. | |
| 2008/0169017 A1* | 7/2008 | Korevaar et al. | 136/249 |
| 2008/0178924 A1* | 7/2008 | Kempa et al. | 136/244 |
| 2008/0202581 A1* | 8/2008 | Kempa | 136/252 |
| 2009/0145477 A1* | 6/2009 | Moon et al. | 136/256 |
| 2009/0179192 A1 | 7/2009 | Kamins | |
| 2010/0018579 A1* | 1/2010 | Curran | 136/261 |
| 2010/0019355 A1* | 1/2010 | Kamins et al. | 257/627 |
| 2010/0024869 A1* | 2/2010 | Wang et al. | 136/249 |
| 2010/0044679 A1 | 2/2010 | Buh et al. | |
| 2010/0078066 A1* | 4/2010 | Darling et al. | 136/256 |
| 2010/0108132 A1* | 5/2010 | Tsakalakos et al. | 136/256 |
| 2010/0112748 A1* | 5/2010 | Vidu et al. | 438/94 |
| 2010/0175748 A1* | 7/2010 | Karg | 136/256 |
| 2010/0313941 A1* | 12/2010 | Huang et al. | 136/255 |
| 2011/0126892 A1* | 6/2011 | Putnam et al. | 136/255 |
| 2011/0129714 A1* | 6/2011 | Kelzenberg et al. | 429/111 |
| 2011/0162698 A1* | 7/2011 | Wenxu et al. | 136/255 |

OTHER PUBLICATIONS

International Search Report and Written Opinion of the International Searching Authority dated Dec. 29, 2011, Patent Cooperation Treaty, PCT Application No. PCT/US2011/039257 filed Jun. 6, 2011, 17 pages.

English Abstract of European Foreign Reference EP0341121, Published Nov. 8, 1989, Applicant Thomson CSF [FR], 1 page.

U.S. Appl. No. 12/796,569, filed Jun. 8, 2010.

U.S. Appl. No. 12/796,600, filed Jun. 8, 2010.

U.S. Appl. No. 12/848,722, filed Aug. 2, 2010.

Gurski et al. Display Technology Overview, Lytica White Paper, Jul. 1, 2005.

Office Action Restriction dated Aug. 13, 2012, U.S. Appl. No. 12/848,722, filed Aug. 2, 2010, 8 pages.

Office Action dated Sep. 18, 2012, U.S. Appl. No. 12/796,569, filed Jun. 8, 2010, 22 pages.

Response to Office Action dated Dec. 14, 2012, U.S. Appl. No. 12/796,569, filed Jun. 8, 2010, 14 pages.

Notice of Allowance and Fee(s) Due dated Jan. 23, 2013, U.S. Appl. No. 12/796,569, filed Jun. 8, 2010, 15 pages.

* cited by examiner

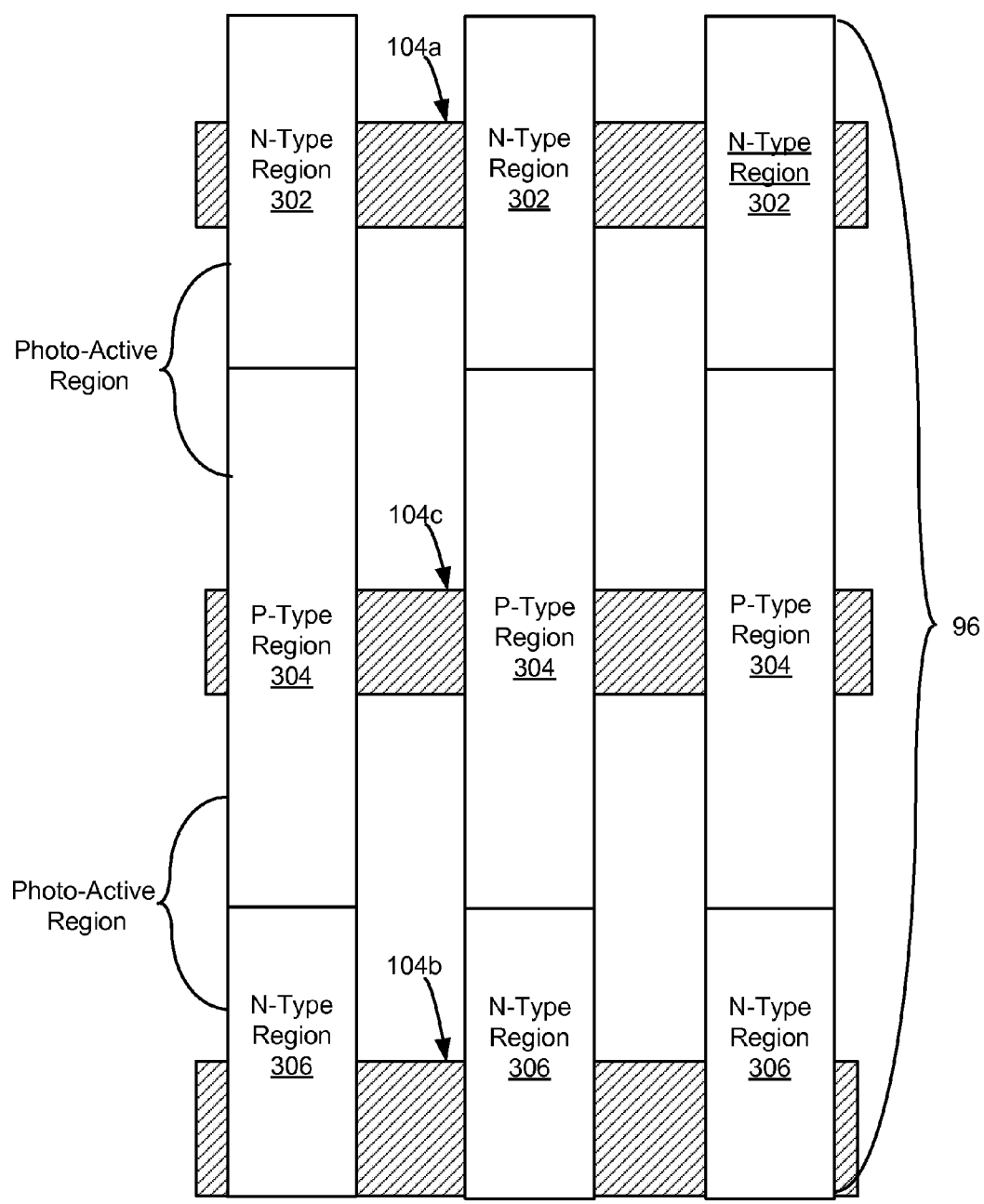

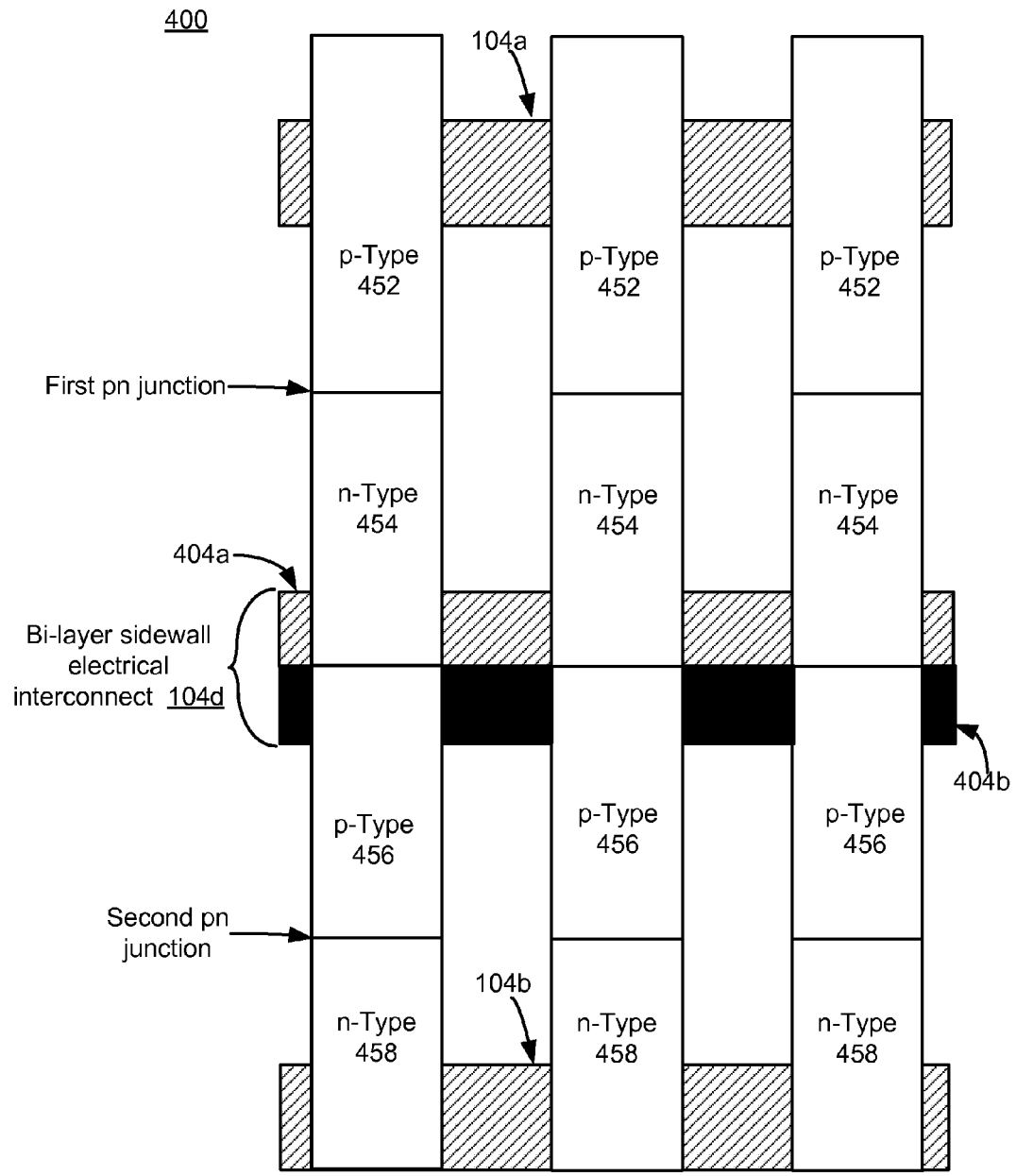

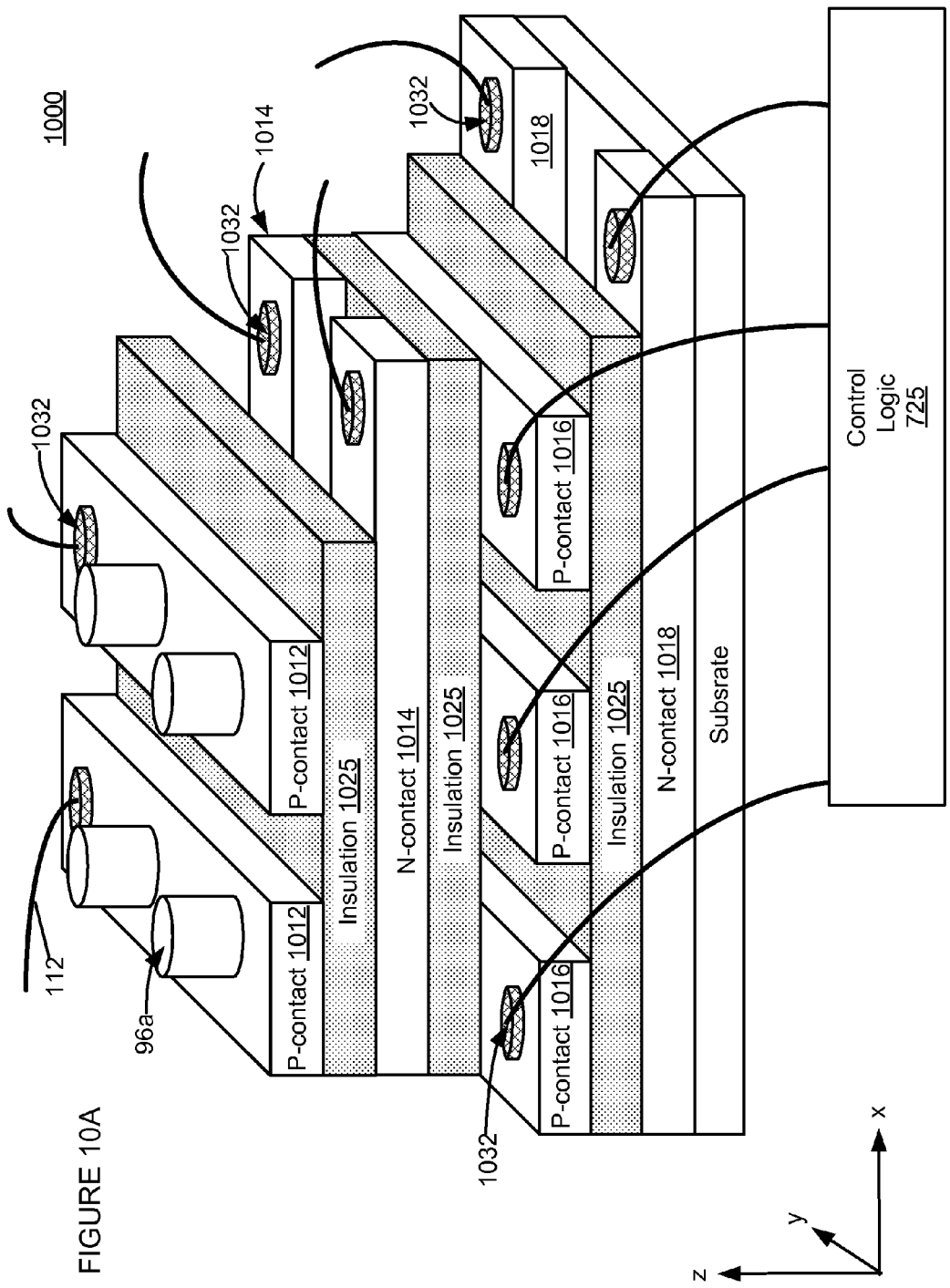

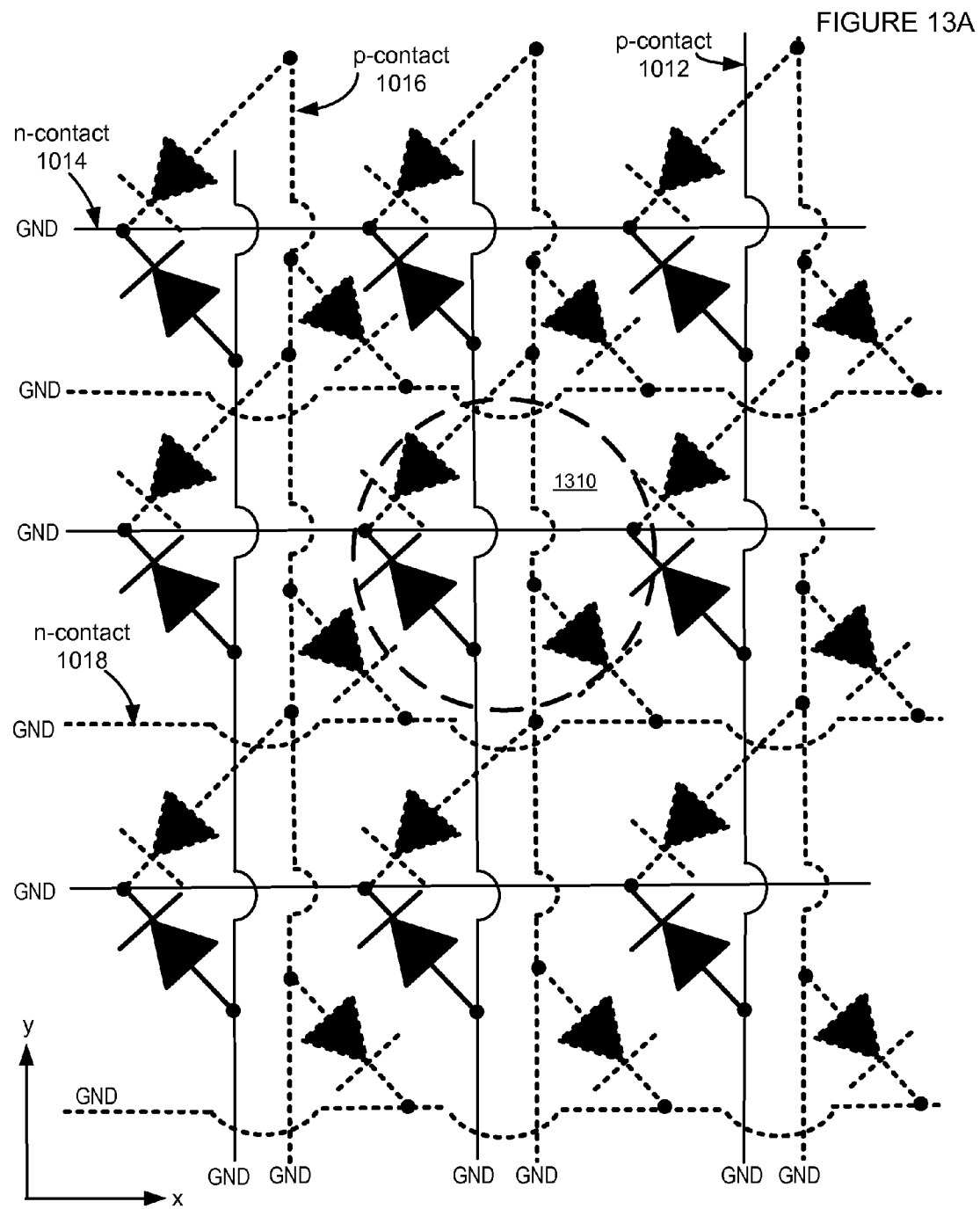

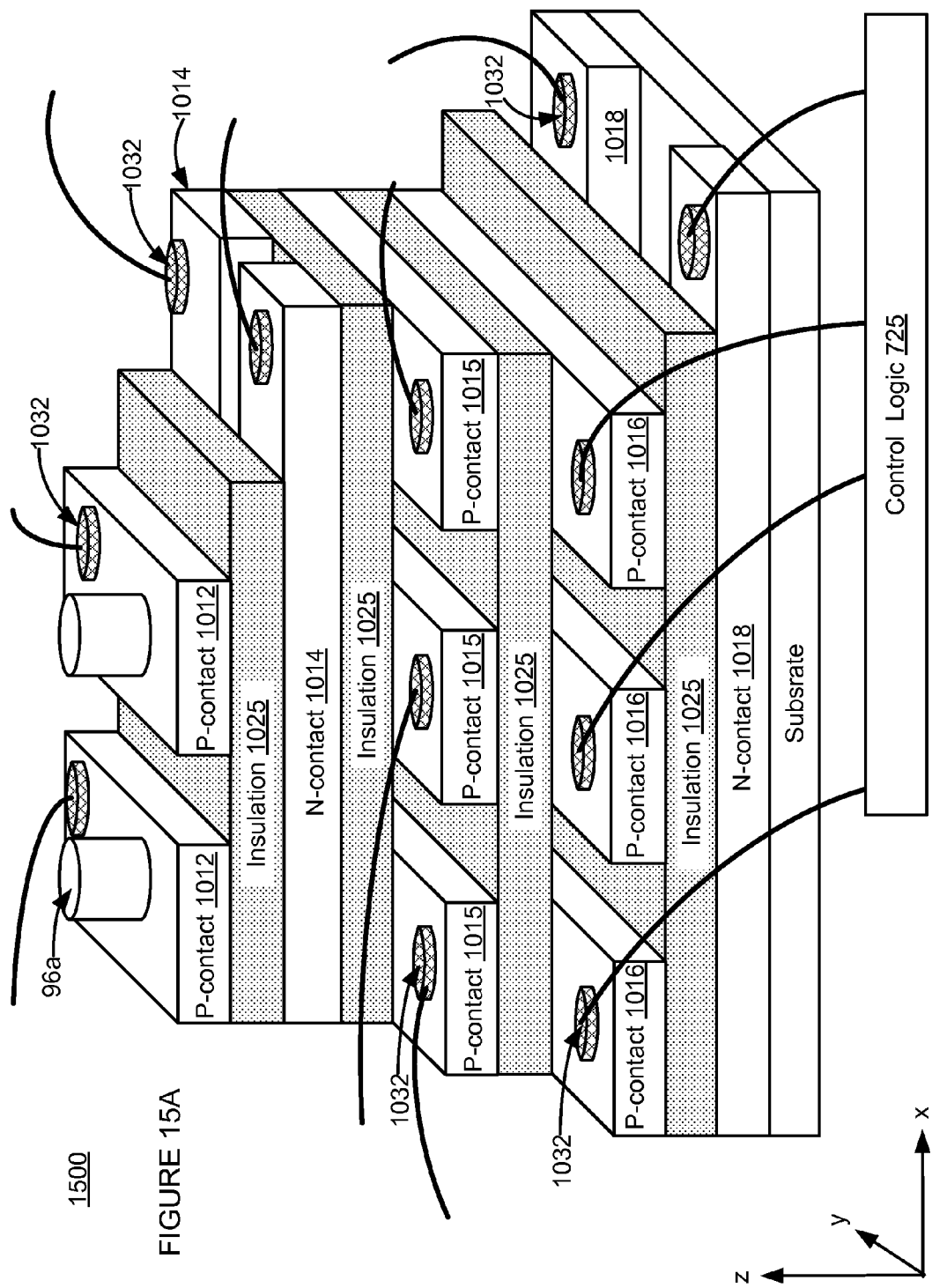

MULTI-JUNCTION SOLAR CELL HAVING SIDEWALL BI-LAYER ELECTRICAL INTERCONNECT

CROSS-REFERENCE TO RELATED APPLICATIONS

The following applications are cross-referenced and incorporated by reference herein in their entirety:

U.S. patent application Ser. No. 12/796,569, entitled "Nanostructure Optoelectronic Device Having Sidewall Electrical Contact," by Kim et al., filed on the same day as the present application; and U.S. patent application Ser. No. 12/796,600, entitled "Nanostructure Optoelectronic Device with Independently Controllable Junctions," by Kim et al., filed on the same day as the present application.

FIELD

The present disclosure relates to optoelectronic devices.

BACKGROUND

Semiconductor based solar cells pass solar radiation from a front side of the solar cell through one or more photoactive regions to a back side of the solar cell. Charge carriers are generated due to absorption of photons in the photoactive region. Each photoactive region may be associated with one p-n junction. For some devices, a given photoactive region absorbs light over only a limited range of wavelengths, depending on the materials used to form the p-n junction. In order to increase the solar cell's efficiency, the p-n junctions may be formed from different materials such that light over a greater range of wavelengths can be absorbed. This is typically referred to as a "multi-junction" design.

However, the charge carriers that are generated by each photoactive regions need a path to flow. In some devices, "tunnel junctions" allow charge carriers to flow through the solar cell. For example, a separate tunnel junction may join each part of the solar cell that has a different photoactive region. Unfortunately, tunnel junctions can be difficult to fabricate.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The present disclosure is illustrated by way of example, and not by way of limitation, in the figures of the accompanying drawings and in which like reference numerals refer to similar elements and in which:

FIG. 3B depicts a side perspective cross-sectional view of one embodiment of an optoelectronic device having an intermediate sidewall electrical contact.

FIG. 4B depicts a side sectional view of an optoelectronic device having a bi-layer sidewall electrical interconnect.

FIG. 10A depicts one embodiment of a pixilated nanostructure optoelectronic device.

FIGS. 13A, 13B, 13C, 13D, 13E, 13F, 13G, and 13H depict one embodiment of a biasing scheme in which three different color sub-pixels are operated simultaneously for LED operation.

FIG. 15A is a diagram of one embodiment of a pixilated nanostructure optoelectronic device.

DETAILED DESCRIPTION

Figure 1A:
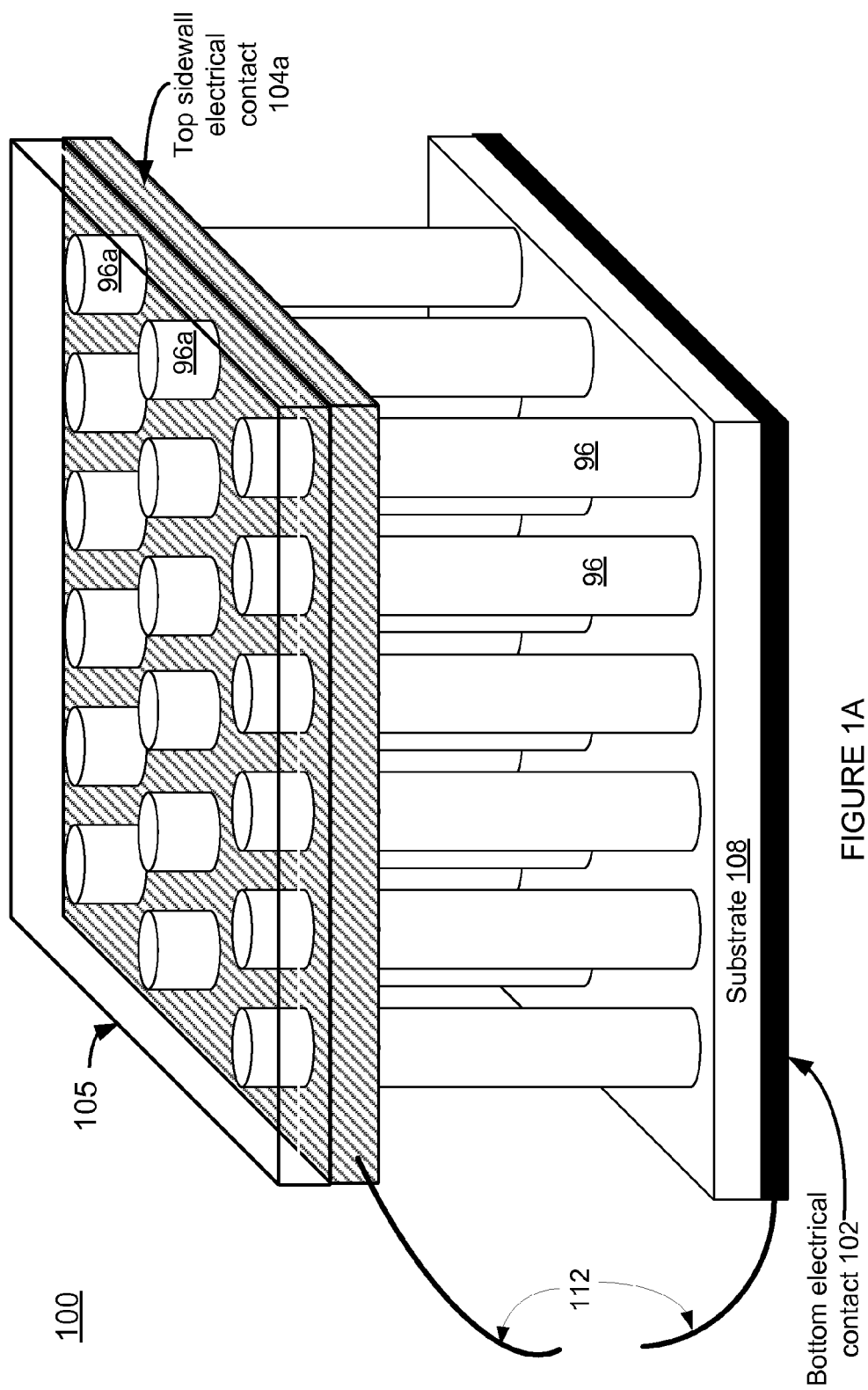
FIG. 1A depicts one embodiment of an optoelectronic device having a top sidewall electrical contact.

In the following description, for the purposes of explanation, numerous specific details are set forth in order to provide a thorough understanding of the present invention. It will be apparent, however, that embodiments may be practiced without these specific details. In other instances, well-known structures and devices are shown in block diagram form in order to avoid unnecessarily obscuring the disclosure.

Optoelectronic devices having photo-active regions ("active regions") are disclosed herein. The optoelectronic device comprises nanostructures, in some embodiments. The nanostructures may be nanocolumns, nanowires, nanorods, nanotubes, etc. In some embodiments, the nanostructures are grouped in an array. For example, the nanostructures may be grown vertically on a substrate. However, the nanostructures could also be formed from the top down by patterning a stack of planar layers and subsequent etching. The nanostructures may be formed from a variety of materials. In some embodiments, the nanostructures are formed from one or more semiconductors.

Optoelectronic devices described herein may be used for solar photo-conversion devices (also referred to as solar cells), photo-detectors (also referred to as light detectors), imaging devices, monochrome LEDs, multi-constituent color LEDs, spectrometers, and other devices not specifically mentioned.

In some embodiments, the optoelectronic device has a top electrical contact that is physically and electrically connected to sidewalls of the array of nanostructures (e.g., nanocolumns). The top electrical contact may be located such that light can enter or leave the nanostructures without passing through the top electrical contact. Therefore, the top electrical contact can be opaque to light having wavelengths that are absorbed or generated by active regions in the nanostructures. Moreover, the top electrical contact can be made from a material that is highly conductive, as no tradeoff needs to be made between optical transparency and electrical conductivity.

In some embodiments, the optoelectronic device has one or more intermediate electrical contact that are physically and electrically connected to sidewalls of the array of nanostructures. The contacts may allow different photo-active regions of the optoelectronic device to be independently controlled. For example, a top and intermediate electrical contact can be used to control an upper photo-active regions and the intermediate and bottom electrical contact may be used to control lower photo-active regions. Note that each nanostructure may have one of the lower- and one of the upper photo-active regions.

In some embodiments, the optoelectronic device has a bi-layer electrical interconnect that is physically and electrically connected to sidewalls of the array of nanostructures. The optoelectronic device may be operated as a multi junction solar cell, wherein each junction is associated with one portion of the device. The bi-layer electrical interconnect allows current to pass from one portion to the next. Thus, the bi-layer electrical interconnect may serve as a replacement for a tunnel junction, which is used in some conventional multi junction solar cells.

In some embodiments, the optoelectronic device is a pixilated device that may serve as an LED display or imaging sensor, for example. The optoelectronic device may have an array of nanostructures with alternating rows and columns of sidewall electrical contacts at different layers. In this embodiment, the electrical contacts may be long strips. This allows a group of one or more nanostructures to serve as a pixel having sub-pixels. For example, a pixel may be formed at the intersection of a row contact and a column contact. In some embodiments, a single group of one or more nanostructures has a blue sub-pixel, a green sub-pixel, and a red sub-pixel. Each pixel may have any number of sub-pixels.

Nanostructure Array Optoelectronic Device with Top Sidewall Electrical Contact

FIG. 1A depicts one embodiment of an optoelectronic device 100 having a top sidewall electrical contact 104a. In one embodiment, the optoelectronic device 100 is a solar cell. In one embodiment, the optoelectronic device 100 is an LED. In one embodiment, the optoelectronic device 100 is a photo-detector. For example, the device 100 may be a single junction solar cell. In other embodiments, the device 100 has multiple junctions. The example device 100, in general, comprises an array of nanostructures 96, a top sidewall electrical contact 104a, a substrate 108, a bottom electrical contact 102, an optional window 105, and electrical leads 112. Note that the top sidewall electrical contact 104a and the bottom electrical contact 102 may be externally accessible.

Each of the nanostructures 96 may have one or more photo-active regions (not depicted in FIG. 1A). Each of the nanostructures 96 has a top, a bottom, and sidewalls. In one embodiment, the lateral width of the nanostructures 96 may range from about 5 nm-500 nm. However, nanostructures 96 may have a lesser or greater lateral width. The entire range of widths may be present in a single device. Thus, there may be considerable variance in width of individual nanostructures 96. Also note that the width of an individual nanostructures 96 may vary from top to bottom. For example, a nanostructure 96 could be narrower, or wider, at the top. Also note that nanostructures 96 are not necessarily columnar in shape. As depicted, there are spaces or gaps between the nanostructures 96. These spaces may be filled with an insulator; however, the spaces may also be left open such that there may be an air gap between nanostructures 96. The nanostructures 96 are not coalesced, in some embodiments. That is to say, that individual nanostructures 96 are not required to be joined together laterally at some level. For example, in some conventional devices the nanostructures 96 are coalesced at the tops such that a continuous sheet is formed. Note that although each nanostructure 96 is depicted in FIG. 1A as completely separate from others, some of the nanostructures 96 might touch a neighbor at some point on the sidewalls.

The nanostructures 96 may include one or more segments. A given segment may be p-doped, n-doped, co-doped, or intrinsic (not intentionally doped) for various purposes including, but not limited to, creating photo-active junctions. A segment may be heavily doped to create a tunnel junction. Different segments may be formed from different materials.

For example, different segments may be formed from different materials such that different photo-active junctions emit or detect light different wavelengths of light. As another example, the nanostructures 96 may be formed from a material that comprises a III-V compound semiconductor and an element that alters the band gap of the III-V compound semiconductor, such an indium. Different segments may have different amounts of indium in order to create energy wells. Further details of solar cells having nanostructures 96 with energy wells are described in U.S. Pat. No. 7,629,532, filed on Dec. 29, 2006, titled "Solar Cells having Active Region with Nanostructures having Energy Wells," which is hereby incorporated by reference in its entirety.

The top sidewall electrical contact 104a is in electrical and physical contact with the sidewalls near the tops of the nanostructures 96. However, the top sidewall electrical contact 104a leaves a top portion 96a of the nanostructures 96 exposed to allow light to enter or leave the nanostructures 96 from the tops 96a without passing through the top electrical contact 104a. Therefore, the top electrical contact 104a may be substantially opaque to light having a wavelength that is absorbed or generated by the photo-active regions. The top sidewall electrical contact 104a has a substantially planar structure in some embodiments. However, note that the thickness of the top sidewall electrical contact 104a is allowed to vary. Note that the top sidewall electrical contact 104a may be formed substantially around the sidewalls of each of the nanostructures 96. The top electrical contact 104a may completely fill the spaces between the nanostructures 96 at a level near the tops 96a of the nanostructures 96.

The top electrical contact 104a may be formed from a different material than the nanostructures 96. In some embodiments, the top sidewall electrical contact 104a is formed from a metal. Example metals include, but are not limited to, nickel and aluminum. Therefore, the top sidewall electrical contact 104a may have a very high conductivity. For example, the top electrical contact 104a may have a higher electrical conductivity than the nanostructures 96; although this is not required. In some embodiments, the top electrical contact 104a forms an Ohmic contact with the nanostructures 96. Therefore, a good electrical connection may be made to the nanostructures 96. In some embodiments, the top electrical contact 104a forms a Schottky contact with the nanostructures 96.

The optional window 105 allows light to enter or leave the device 100. The window 105 protects the device 100 and may passivate the top surface. The window 105 may be formed from a material that is highly transparent to light of the relevant wavelengths. Because the window 105 does not need to pass an electrical current, the window 105 does not need to be electrically conductive. Therefore, no tradeoff between optical transparency and electrical conductivity needs to be made for the window 105. Note that another material, such as an insulator, may be present between the window 105 and the top electrical contact 104a.

Examples of suitable materials for the substrate 108 include, but are not limited to, Si, germanium (Ge), silicon carbide (SiC), zinc oxide (ZnO), and sapphire. If the substrate 108 is either Si, or Ge, the substrate 108 may be (111) plane oriented, as one example. If the substrate 108 is SiC, or ZnO, the substrate 108 may be (0001) plane oriented, as one example. The substrate 108 is doped with a p-type dopant, in one embodiment. An example of a p-type dopant for Si substrates includes, but is not limited to, boron (B). The p-type doping level may be p, $p^+$ or, $p^{++}$. The substrate 108 is doped with an n-type dopant, in one embodiment. Examples of n-type dopants for Si substrates include, but are not limited to, arsenic (As) and phosphorous (P). The n-type doping level may be n, $n^+$ or, $n^{++}$. Note that the substrate 108 is not required for device operation. In some embodiments, the substrate 108 on which the nanostructures 96 were grown is removed (e.g., by etching), which allows for a more flexible device.

The bottom electrical contact 102 may be made of a suitable metal, and does not need to be optically transparent. The bottom electrical contact 102 is electrically connected to the nanostructures 96. In some embodiments, the bottom electrical contact 102 is in physical contact with the sidewalls of the nanostructures 96; however, sidewall contact is not required. Thus, the bottom electrical contact 102 may, or may not be, a sidewall electrical contact. As depicted in FIG. 1A, the bottom electrical contact 102 is attached to the back side (or bottom) of the substrate 108. As mentioned, the substrate 108 may be doped such that it is conductive. If desired, portions of the substrate 108 may be etched away and filled with a conductive material, such as a metal, to allow a better conductive contact between the bottom electrical contact 102 and the nanostructures 96. As mentioned, the substrate 108 is not an absolute requirement. In this case, the bottom electrical contact 102 may be bonded to the nanostructures 96. In one embodiment, the bottom electrical contact 102 is between the substrate 108 and the nanostructures 96 (but is not a sidewall contact).

Overview of operation of an embodiment in which the device 100 is a solar cell will now be discussed. Solar radiation (e.g., photons) enters through the window 105 and into the top portions 96a of nanostructures 96 and may be absorbed in the active regions (not explicitly depicted in FIG. 1A) of nanostructures 96. Absorption of a photon promotes an electron to the conduction band. Electrons promoted to a conduction band by the absorption of photons may conduct to the electrical contacts 104a, 102. The electrons conduct through the electrical leads 112. Typically, a bias voltage is not applied to the device 100 when being operated as a solar cell.

Overview of operation of an embodiment in which the device 100 is an LED will now be discussed. A bias voltage is applied through the leads 112 to forward bias a p-n junction (not depicted in FIG. 1A) in the nanostructures 96, resulting in emission of photons through the top portions 96a of the nanostructures 96 and out the window 105 (note that the window 105 is optional). Note that the emitted photons need not pass through the top sidewall electrical contact 104a.

Overview of operation of an embodiment in which the device 100 is a photo-detector or imaging device will now be discussed. A bias voltage may be applied through the leads 112 to reverse bias a p-n junction (not depicted in FIG. 1A) in the nanostructures 96. Photons that enter through the window 105 (if present) are absorbed in the photo-active regions of the nanostructures 96, which promotes electrons to the conduction band. Electrons promoted to the conduction band may conduct to the contacts 104a, 102 and through the electrical leads 112. The amount of current that conducts may be detected to determine the intensity of light at the relevant wavelength of the photo-active junctions. In some embodiments, a bias voltage is not applied to the device 100 when being operated as a photo-detector or imaging device.

Thus, electrical conduction may occur along the length of nanostructures 96 for the various optoelectronic devices. For example, electrical conduction may occur along the length of nanocolumns. Note that the device 100 may be used for other devices than the examples provided.

Figure 1B:
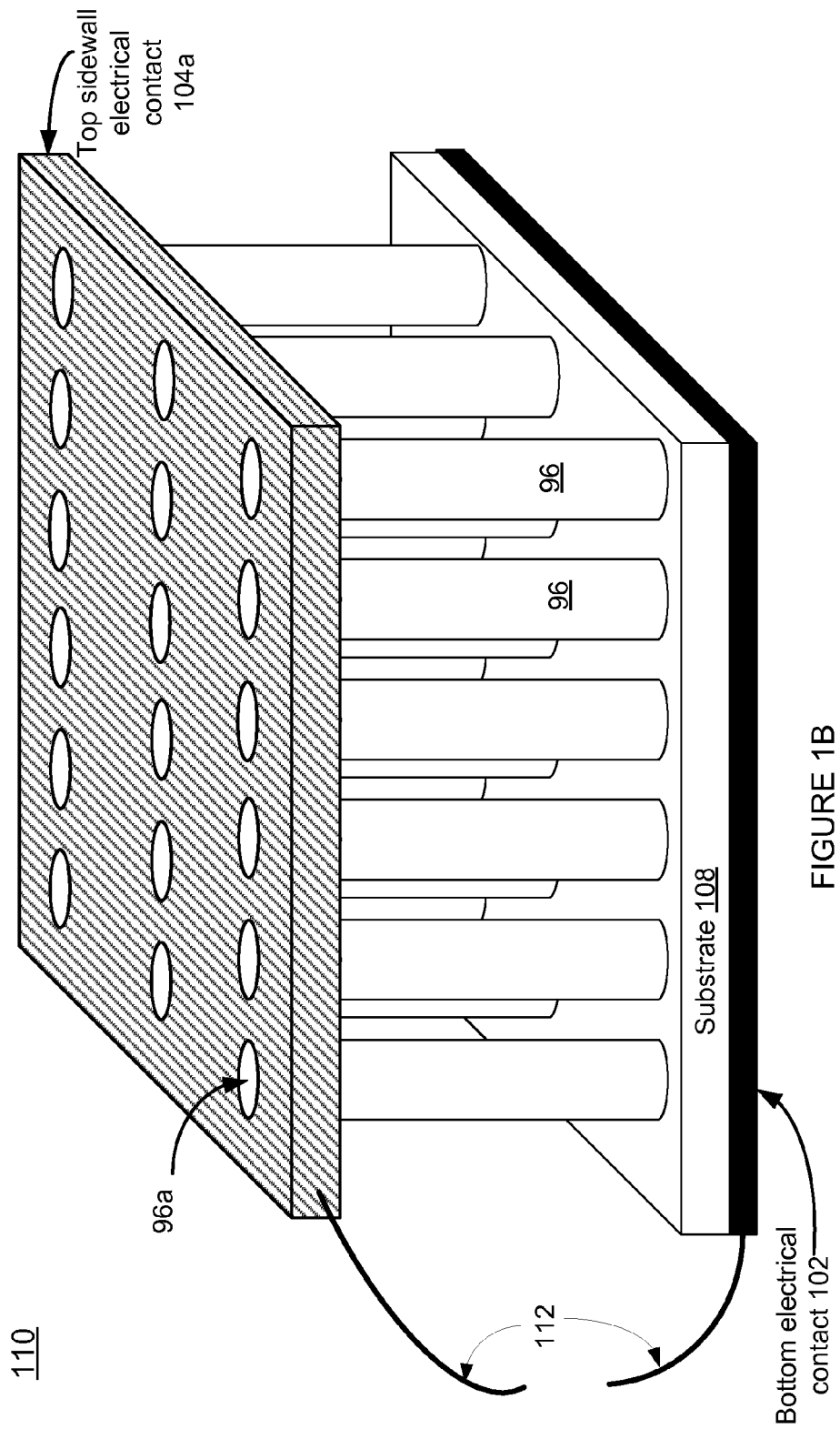
FIG. 1B depicts one embodiment of an optoelectronic device having a top sidewall electrical contact.

Note that a portion of the sidewalls of the nanostructures 96 is not required to be above the top sidewall electrical contact 104a. FIG. 1B depicts one embodiment of an optoelectronic device 110 having a top sidewall electrical contact 104a. In this embodiment, no portion of the sidewalls of the nanostructures 96 is above the top sidewall electrical contact 104a. However, top portions 96a of the nanostructures 96 are exposed to allow light to enter or leave the nanostructures 96a from the tops 96a without passing through the top electrical contact 104a. Note that the top sidewall electrical contact 104a may completely fill the spaces between the nanostructures 96 at a level near the tops 96a of the nanostructures.

Figure 2A:
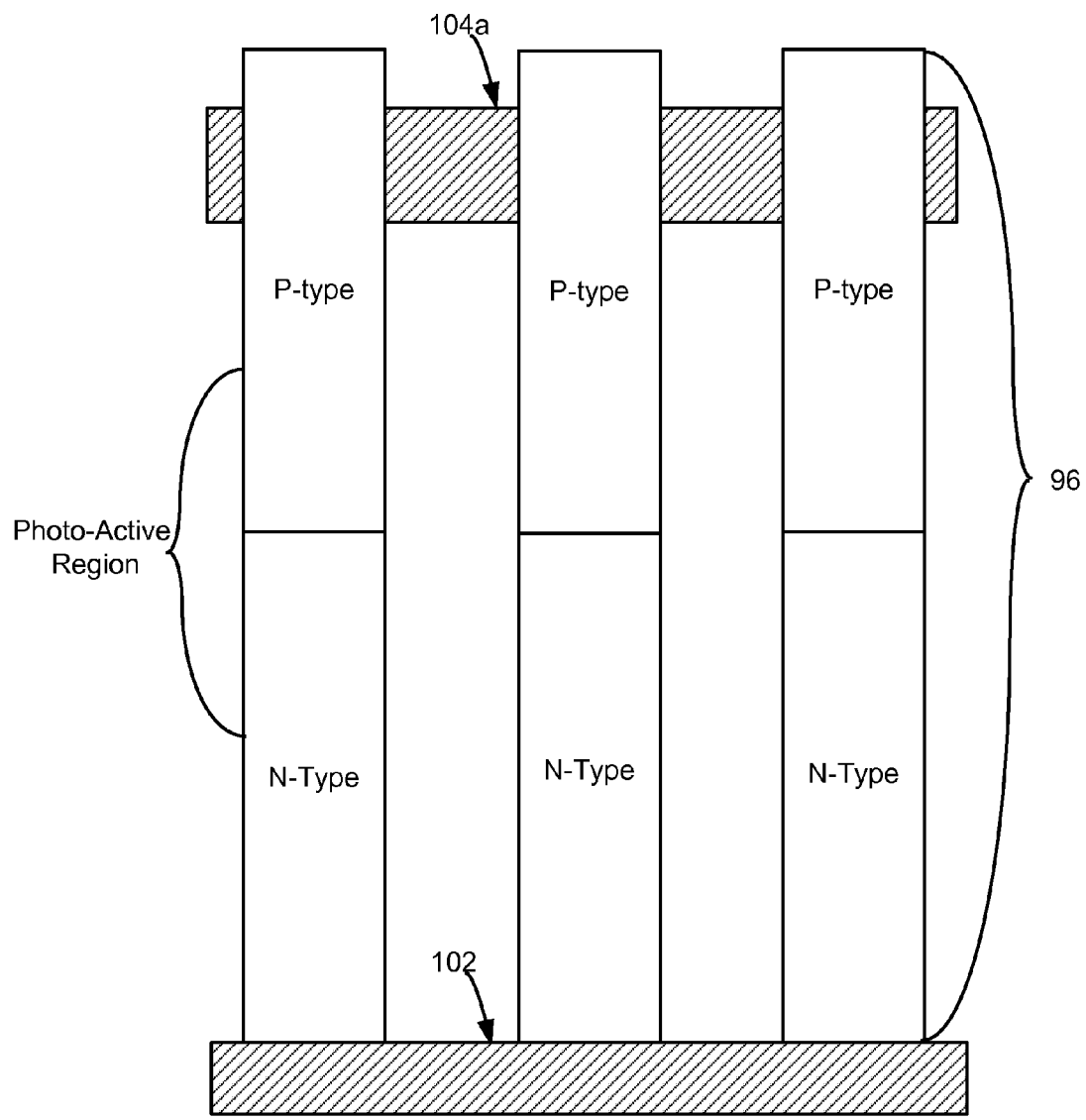
FIG. 2A is a side sectional perspective view of one embodiment of an optoelectronic device having a top sidewall electrical contact.

FIG. 2A depicts a side cross sectional showing one embodiment of how the top sidewall electrical contact 104a is in physical contact with the sidewalls of the nanostructures 96. In this embodiment, the device 100 has a p-n junction and active region associated therewith. The top sidewall electrical contact 104a is electrically and physically connected to the p-type regions of the nanostructures 96. However, note that the top electrical contact 104a may instead be in contact with a p-doped region, n-doped region, intrinsic region, or co-doped region. In some embodiments, the material for the top sidewall electrical contact 104a is selected such that it makes a good Ohmic contact with the type of material (e.g., semiconductor and type of doping) of the nanostructures 96 that it contacts. However, other contacts such as a Schottky contact are also possible.

The bottom electrical contact 102 is electrically connected to the n-type regions of the nanostructures 96. The bottom electrical contact 102 may be in physical contact with the sidewalls of the nanostructures 96; however, that is not required. In another embodiment, the n-type and p-type regions are switched, such that the top sidewall electrical contact 104a is electrically and physically connected to an n-type region. In some embodiments, there is an intrinsic region between the p-type region and n-type region. In some embodiments, each of the nanostructures 96 has a photo-active region associated with the p-n junction. The extent of one example photo-active region is depicted; however, it will be appreciated that the extent of the photo-active region does not necessarily have fixed boundaries.

Figure 2B:
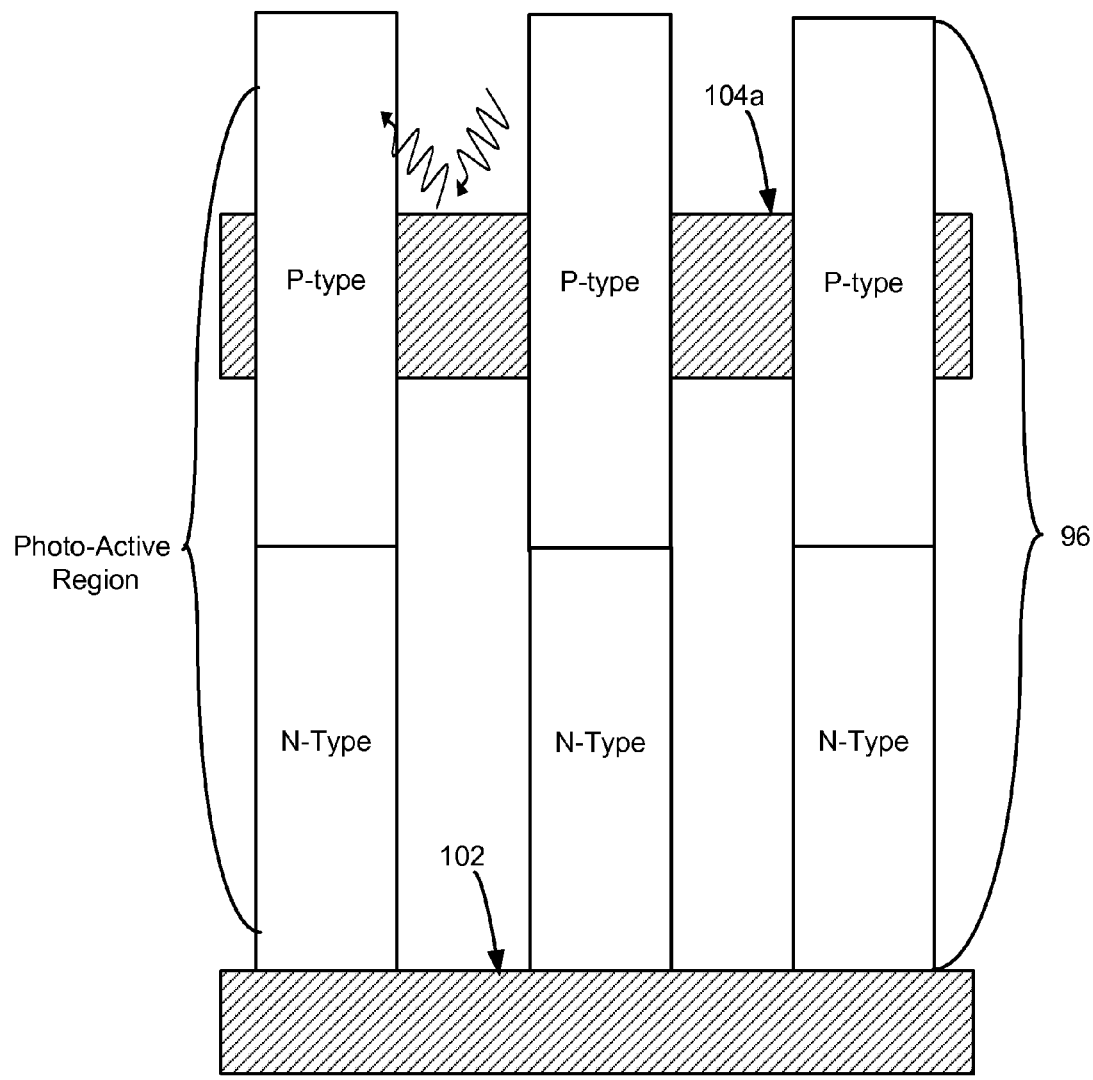
FIG. 2B depicts an embodiment in which a portion of the photo-active region extends above a top sidewall electrical contact.

Also, note that in some embodiments, a portion of the photo-active region may extend above the top sidewall electrical contact 104a. FIG. 2B depicts such an embodiment. In some embodiments, the top surface of the top electrical contact 104a is at least partially reflective to light of relevant wavelengths such that incoming light that is not directly received by one of the nanostructures 96 is reflected off from the top electrical contact 104a and into the sidewalls of the nanostructures 96 above the top electrical contact 104a. Therefore, this reflected light may be absorbed by the photo-active region above the top electrical contact 104a.

Figure 2C:
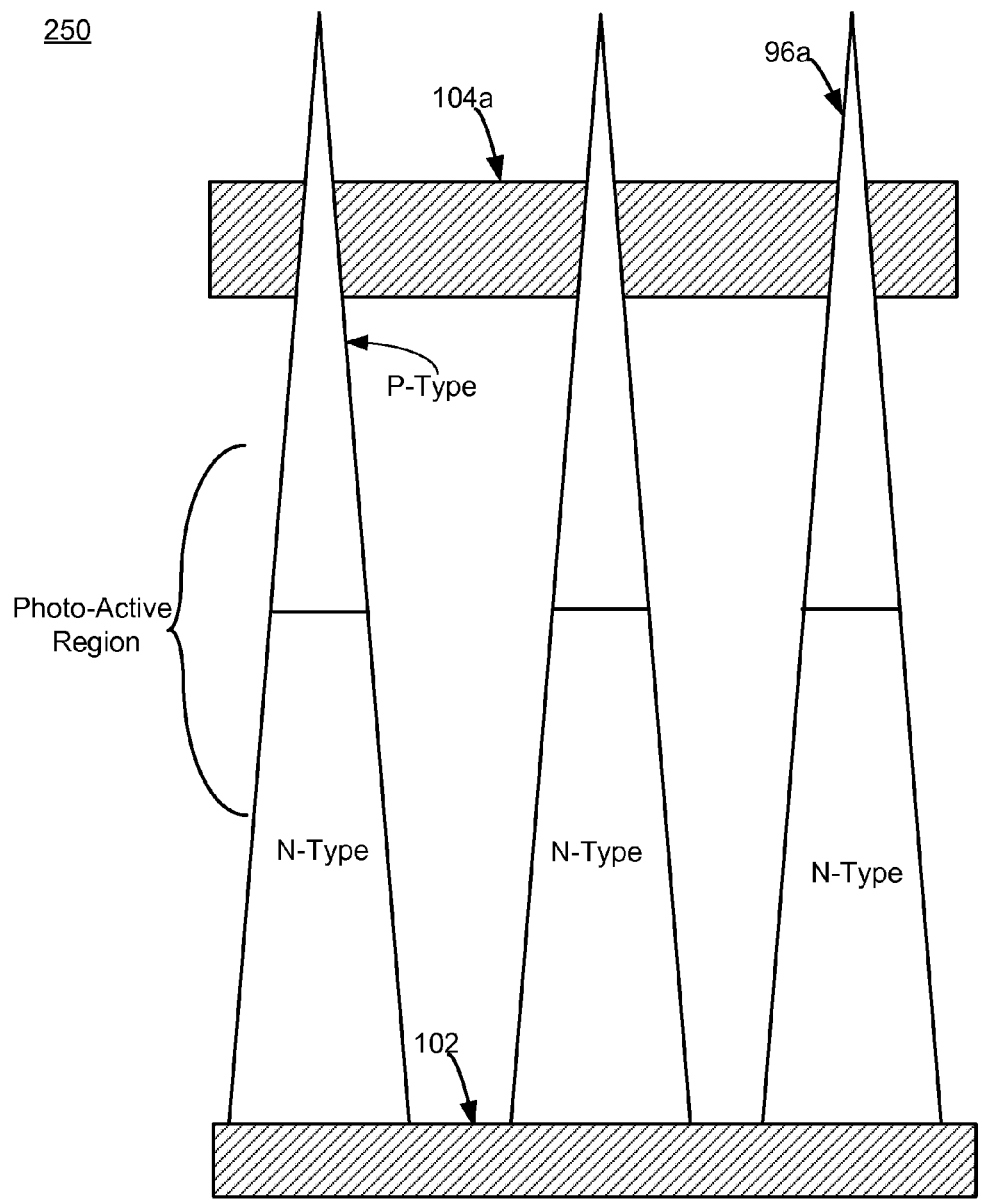
FIG. 2C is a side sectional perspective view of one embodiment of an optoelectronic device having a top sidewall electrical contact.

Note that the tops 96a of the nanostructures do not necessarily have a flat surface at the very top. For example, one or more of the nanostructures 96 may have a point or rounded top. FIG. 2C is a side sectional perspective view of one embodiment of an optoelectronic device 100 in which the tops 96a are not flat. In this example, the tops 96a are somewhat pointed. The tops 96a may have other shapes. The tops 96a extend above the top electrical contact 104a such that light may enter or leave the nanostructures 96 through the tops 96a without passing through the top electrical contact 104a.

In the embodiment of FIG. 2C, the device 250 has a p-n junction. The device may have a p-i-n junction instead. The top sidewall electrical contact 104a is electrically and physically connected to the p-type regions of the nanostructures 96 in this example. However, note that the top electrical contact may instead be in contact with a p-doped region, n-doped region, intrinsic region, or co-doped region. In some embodiments, the material for the top contact 104a is selected such that it makes a good Ohmic contact with the type of material (e.g., semiconductor and type of doping) of the nanostructures 96 that it contacts. However, other contacts such as a Schottky contact are also possible.

Note that in the devices of FIGS. 2A, 2B and 2C the top sidewall electrical contact 104a and the bottom electrical contact 102 may be externally accessible by attaching electrical leads 112 to the contacts.

Nanostructure Array Optoelectronic Device with Intermediate Sidewall Electrical Contacts Note that the optoelectronic device may have one or more intermediate sidewall electrical contacts. By an intermediate sidewall electrical contacts it is meant an electrical contact that is neither a top electrical contact nor a bottom electrical contact and is physically touching sidewalls of the nanostructures 96. Therefore, the device has more than two electrical contacts in these embodiments. For example, the device may have three, four, or more electrical contacts.

Figure 3A:
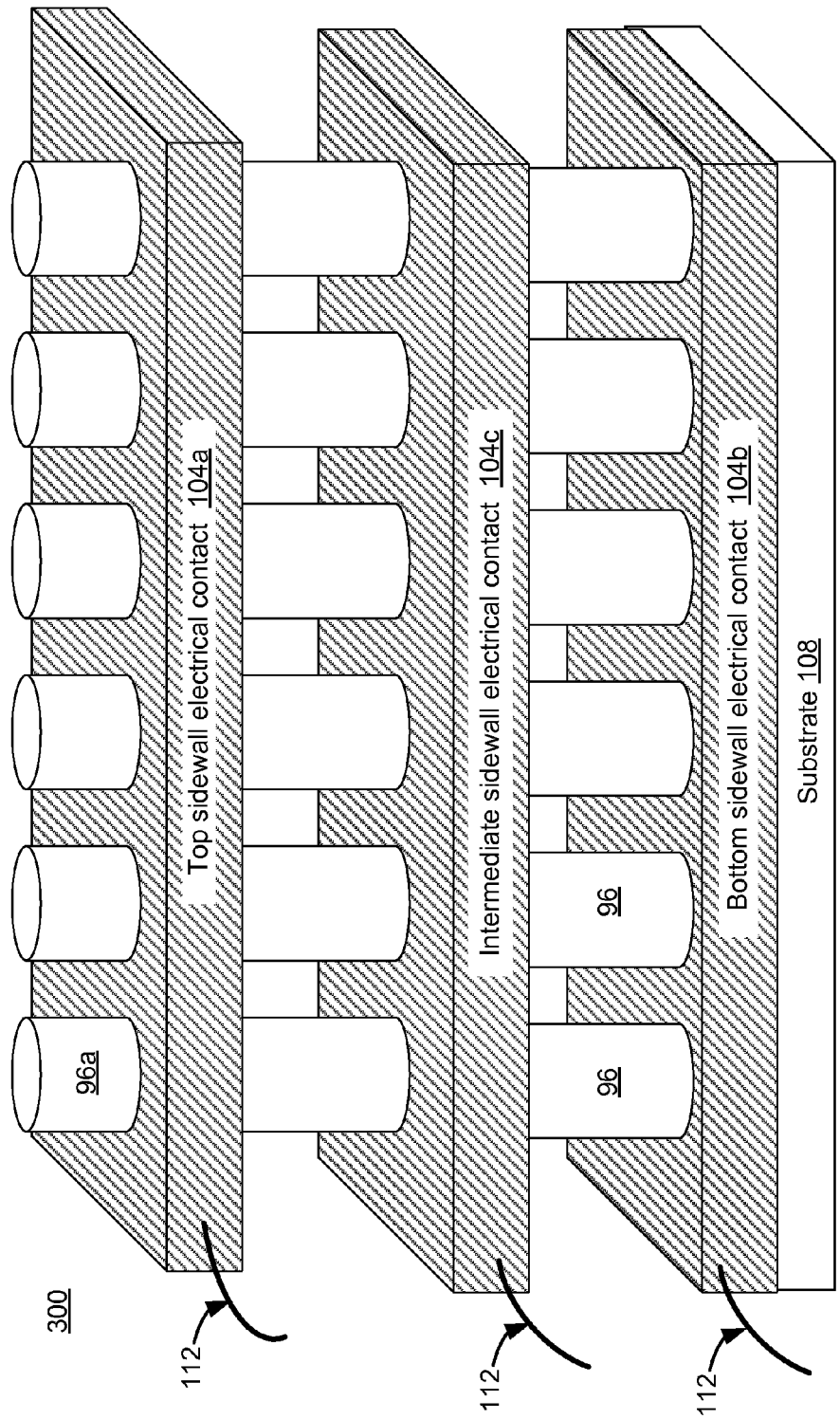
FIG. 3A depicts one embodiment of an optoelectronic device having an intermediate sidewall electrical contact.

FIG. 3A depicts one embodiment of an optoelectronic device 300 having three sidewall electrical contacts 104a, 104b, 104c. Specifically, the device 300 has a top sidewall electrical contact 104a, an intermediate sidewall electrical contact 104c, and a bottom sidewall electrical contact 104b, in this embodiment. Note that each contact may have an electrical lead 112 attached to it such that a voltage or current may be provided or received.

Note that the bottom electrical contact is not required to be on the sidewalls. For example, it could be below the substrate 108 or attached to the bottoms of the nanostructures 96. Moreover, the top electrical contact is not required to be on the sidewalls. For example, it could be attached to the tops of the nanostructures 96. Other elements of the device 300 (such as leads, insulation, front window) are not depicted so to not obscure the diagram.

FIG. 3B depicts a side perspective cross-sectional view of one embodiment of an optoelectronic device 300 having an intermediate sidewall electrical contact 104c. The device is similar to the one depicted in FIG. 3A and also has a top sidewall electrical contact 104a and a bottom sidewall electrical contact 104b. Electrical leads 112 are not explicitly depicted, but may be attached to each electrical contact. FIG. 3B depicts an example in which each of the nanostructures 96 has, from top to bottom, an n-type region 302, a p-type region 304 and an n-type region 306. Therefore, the device has first and second photo-active regions (which are roughly depicted) associated with the two p-n junctions. Note that there could be intrinsic regions between the n-type regions and p-type regions.

Each photo-active region may have different bandgap energy. Therefore, each photo-active region may emit or detect light of a different range of wavelengths. Alternatively, the device could have a p-type region, an n-type region, and a p-type region. Thus, in general, the nanostructures 96 each have an upper and lower region having one type of conductivity and a middle region having the opposite type of conductivity.

In this example, the top sidewall electrical contact 104a makes electrical and physical contact with upper n-type semiconductor regions of the nanostructures 96, the intermediate sidewall electrical contact 104c makes electrical and physical contact with p-type semiconductor regions of the nanostructures 96, and the bottom sidewall electrical contact 104b makes electrical and physical contact with lower n-type semiconductor regions of the nanostructures 96.

In some embodiments, the sidewall contacts 104a-104c each make Ohmic contact with their region. Thus, sidewall contacts 104 that contact the n-type semiconductor regions may be made of a suitable material to form an Ohmic contact with an n-type semiconductor. Sidewall contacts 104 that contact the p-type semiconductor regions may be made of a suitable material to form an Ohmic contact with a p-type semiconductor. Herein, the term "n-type" contact will refer to a material that forms an Ohmic contact with an n-type semiconductor. Herein, the term "p-type" contact will refer to a material that forms an Ohmic contact with a p-type semiconductor.

Figure 3C:
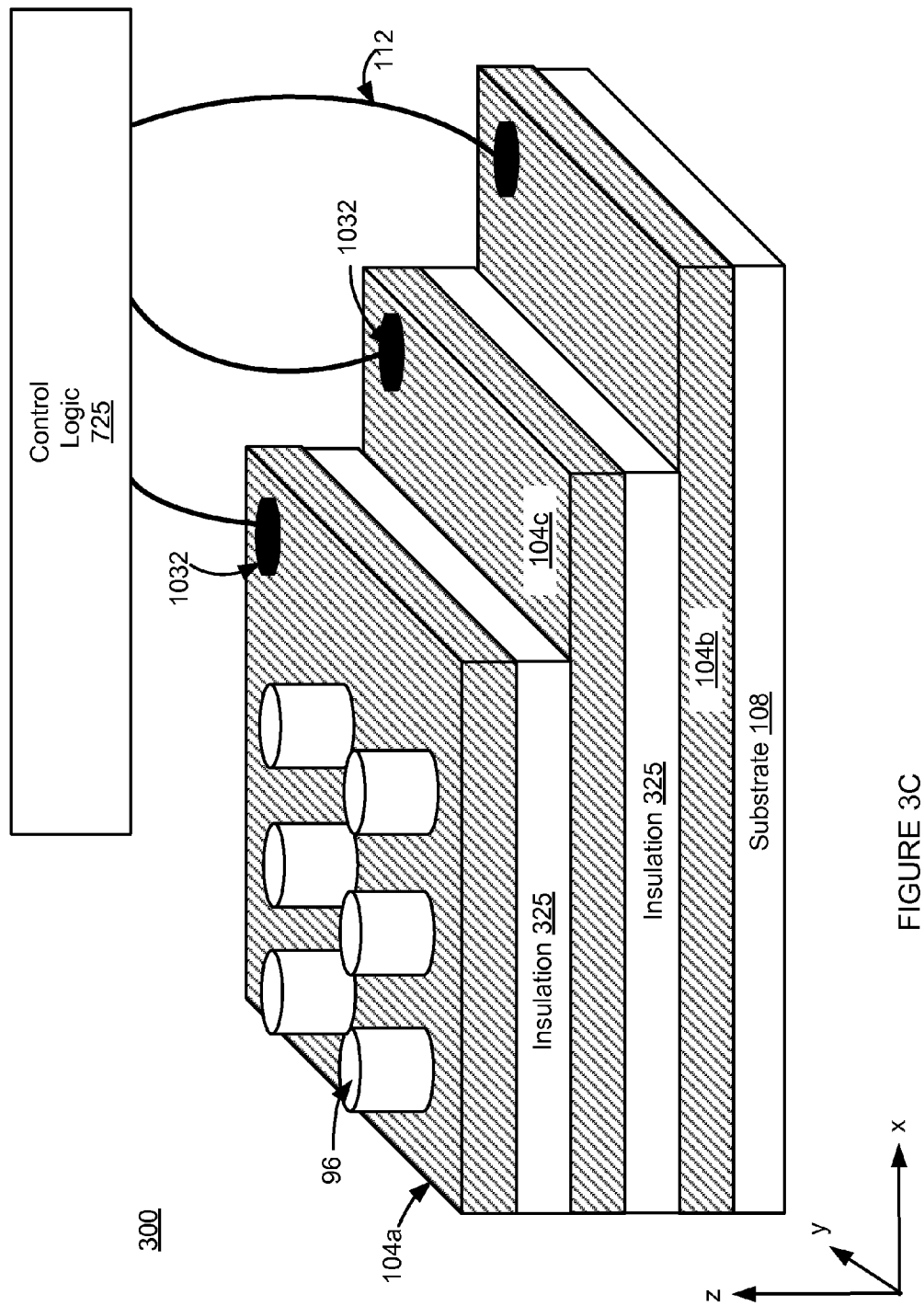
FIG. 3C depicts one embodiment of an optoelectronic device having three sidewall electrical contacts and exposed edges.

FIG. 3C depicts one embodiment of an optoelectronic device 300 having three sidewall electrical contacts and exposed edges. The device 300 is similar to the ones depicted in FIGS. 3A and 3B. Two layers of insulation 325 are depicted between the contacts. FIG. 3C only depicts a small portion of the device 300 near one edge. The device 300 has a contact pad 1032 attached to each electrical contact 104 and an electrical lead 112 attached to each electrical contact 104. Control logic 725 connects to the leads 112. The control logic 725 may be used to independently control different photo-active regions in the nanostructures 96. Further details are discussed below. The edges can be exposed using a wide variety of techniques such as photolithography and etching.

Bi-Layer Nanostructure Sidewall Electrical Interconnect

In some embodiments, the optoelectronic device has a bi-layer sidewall electrical interconnect. A bi-layer sidewall electrical interconnect may include an n-type contact and a p-type contact. Therefore, the bi-layer sidewall electrical interconnect may make contact to both n-type semiconductor regions and p-type semiconductor regions of the nanostructures 96.

Figure 4A:
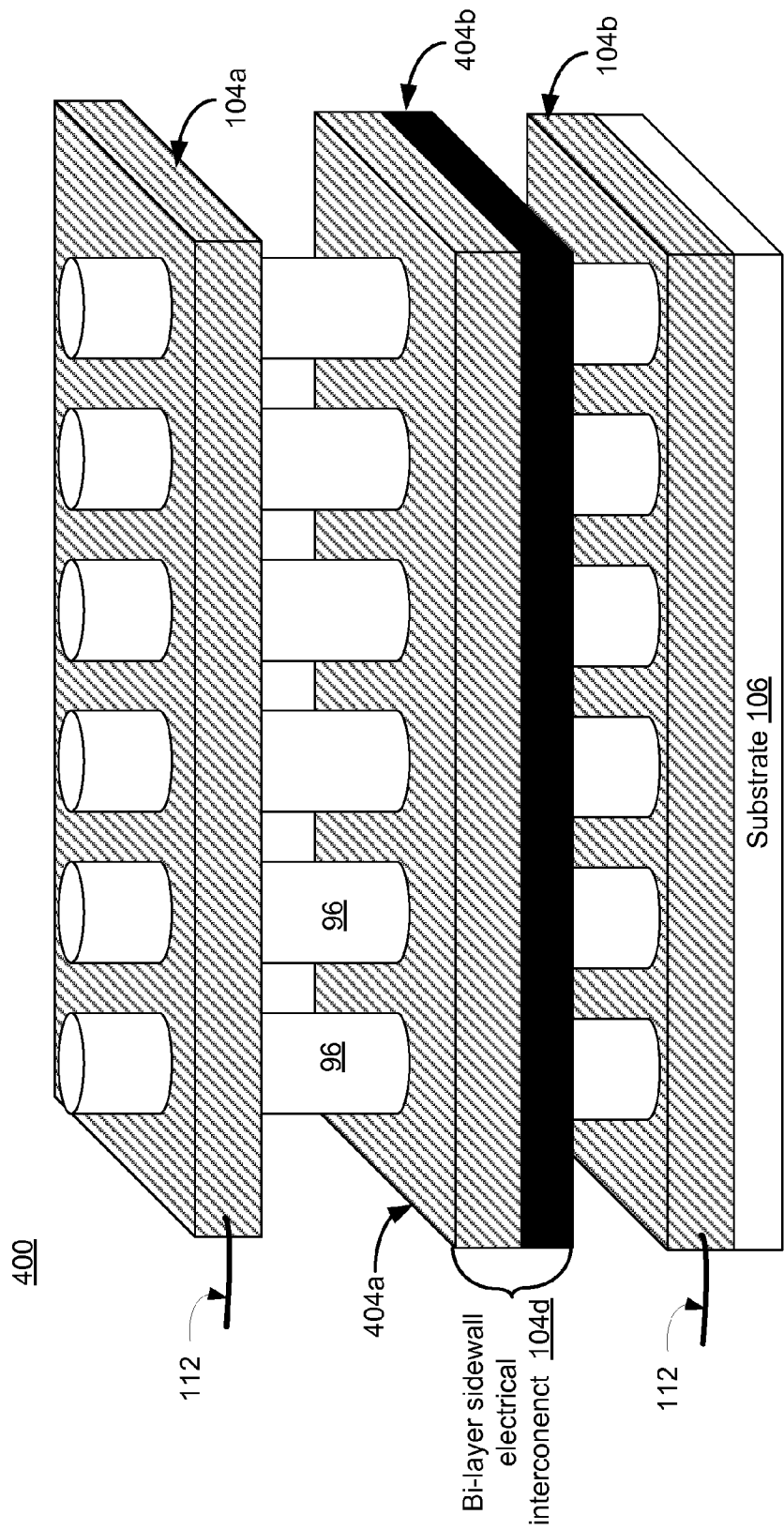
FIG. 4A depicts one embodiment of an optoelectronic device having a bi-layer sidewall electrical interconnect.

FIG. 4A depicts one embodiment of an optoelectronic device 400 having a bi-layer sidewall electrical interconnect 104d. The optoelectronic device 400 also has a top sidewall electrical contact 104a and a bottom sidewall electrical contact 104b. However, top and bottom electrical contacts are not required to be on the sidewalls of the nanostructures 96. The bi-layer sidewall electrical interconnect 104d includes a top layer 404a and a bottom layer 404b. As mentioned, one layer is an n-type contact, and the other is a p-type contact. Either layer may be n-type contact, depending on the doping of the nanostructures 96.

In some embodiments, the optoelectronic device 400 of FIG. 4A is a multi-junction solar cell. The device 100 may have a first lead 112 electrically connected to the top sidewall electrical contact 104a and a second lead 112 electrically connected to the bottom sidewall electrical contact 104b. However, as will be explained below, the device 100 does not necessarily have electrical leads 112 connected to the bi-layer sidewall electrical interconnect 104d.

FIG. 4B depicts a side sectional perspective view of an optoelectronic device 400 having a bi-layer sidewall electrical interconnect 104d. The device is similar to the one of FIG. 4A. Note that in this example the nanostructures 96 have p-type regions 452, n-type regions 454, p-type regions 456, and n-type regions 458. In this example, the top layer 404a of bi-layer sidewall electrical interconnect 104d contacts n-type regions 454 and the bottom layer 404b of bi-layer sidewall electrical interconnect 104d contacts p-type regions 456. In one embodiment, the layer 404a makes Ohmic contact with the n-type regions. For example, layer 404a may be aluminum and the nanostructures 96 may be nitride semiconductors. In one embodiment, layer 404b makes Ohmic contact with the p-type regions. For example, layer 404b may be nickel and the nanostructures 96 may be nitride semiconductors. The top sidewall electrical contact 104a contacts the top p-type regions 452 and the bottom sidewall electrical contact 104b contacts the lower n-type regions 458. Note that the p-type and n-type regions could be reversed.

Also note that the junction between the top layer 404a and bottom layer 404b does not need to be perfectly aligned with the p-n junction of regions 454 and 456. A reason for this is that, in some embodiments, a given layer of the bi-layer interconnect 104d only makes Ohmic contact with semiconductor of the correct conductivity type. For example, top layer 404a may be in physical contact with part of p-type region 456 (as well as n-type region 454). In this case, top layer 404a will still have Ohmic contact with the n-type region 454 and the bottom layer 404b will still have Ohmic contact with the p-type region 456. However, the top layer 404a should not have Ohmic contact with the p-type region 456 even if there is some physical contact. Similarly, bottom layer 404b may be in physical contact with part of n-type region 454 (as well as p-type region 456). In this case, bottom layer 404b will still have Ohmic contact with the p-type region 456 and the top layer 404a will still have Ohmic contact with the n-type region 454. However, the bottom layer 404b should not have Ohmic contact with the n-type region 454 even if there is some physical contact.

As mentioned, the optoelectronic device 400 of FIGS. 4A and 4B may be a multi junction solar cell. The p-n junction between p-type regions 452 and n-type regions 454 may operate as a first p-n junction, whereas the p-n junction between p-type regions 456 and n-type regions 458 may operate as a second p-n junction. Note that p-i-n junctions are also possible. The bi-layer sidewall electrical interconnect 104d may allow charge to flow between the n-type regions 454 and the p-type regions 456 through the bi-layer electrical interconnect. Each p-n junction may have different bandgap energy. Therefore, the active region associated with each p-n junction may emit or detect light of a different range of wavelengths.

Figure 4C:
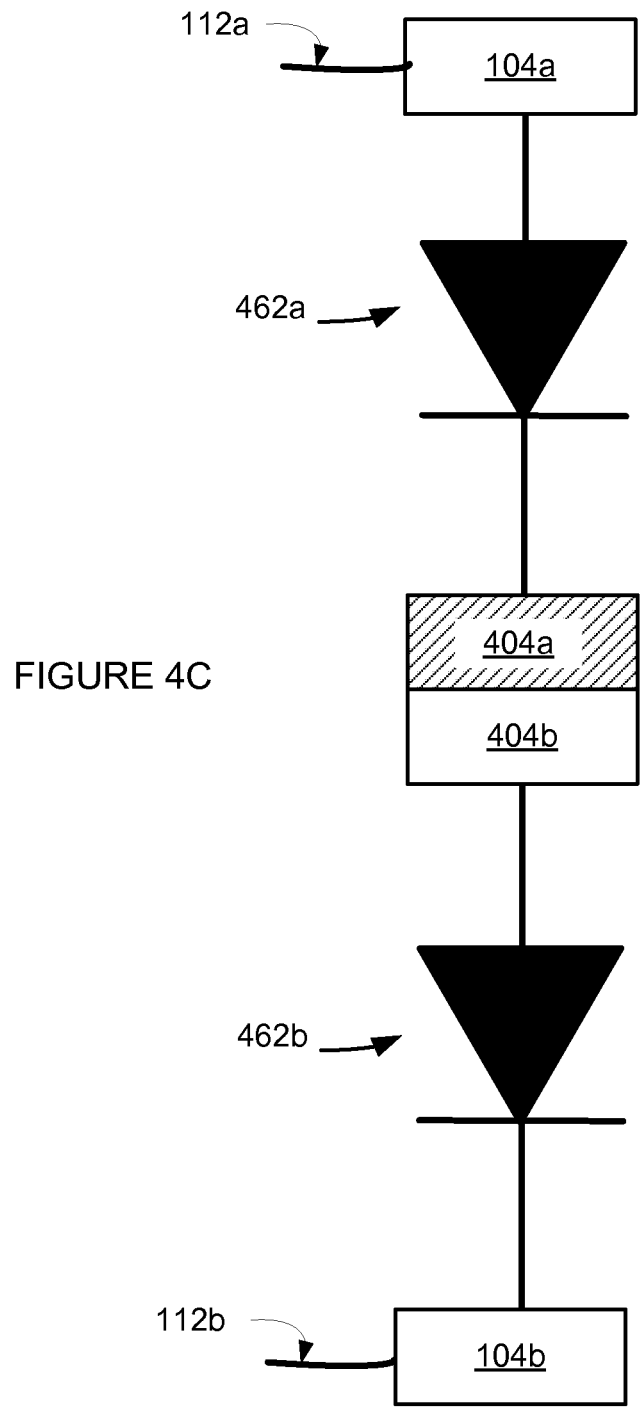
FIG. 4C depicts an example circuit schematic of one possible operation of the device of FIG. 4B.

FIG. 4C depicts an example circuit schematic of one possible operation of the device 400 of FIG. 4B. The optoelectronic device 400 may be considered to be two diodes 462a, 462b that are connected by the bi-layer sidewall electrical interconnect 104d. Current that is generated by absorption of photons may flow from the upper diode 462a to the upper portion 404a of the bi-layer interconnect 104d, then to the lower portion 404b of the bi-layer interconnect 104d. Then, the current flows through the lower diode 462b and into the lower lead 112. The upper lead 112a completes the circuit. Note that some multi-junction solar cell have a tunnel junction between diodes. However, tunnel junctions are sometimes difficult to form. The bi-layer 104d sidewall electrical interconnect may thus serve as a replacement for a tunnel junction.

Figure 5A:
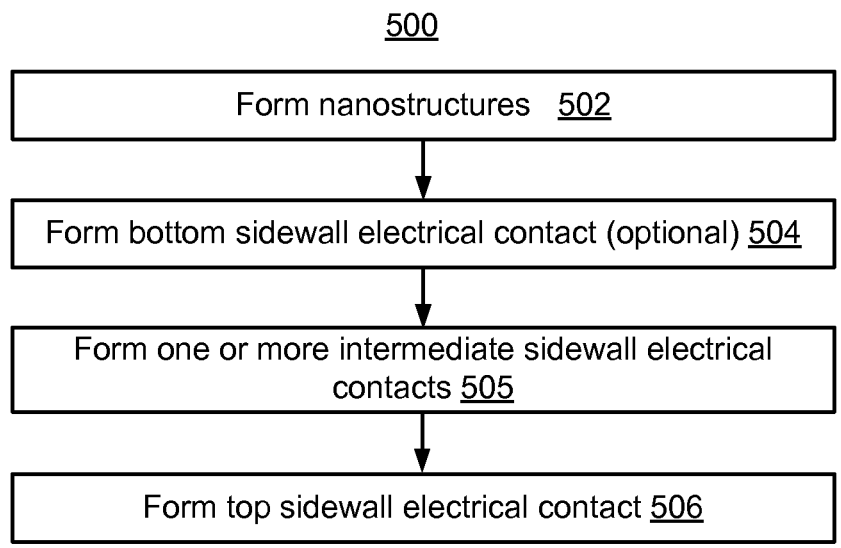
FIG. 5A is a flowchart depicting one embodiment of a process of fabricating an optoelectronic device having one or more sidewall electrical contacts.
Figure 6A:
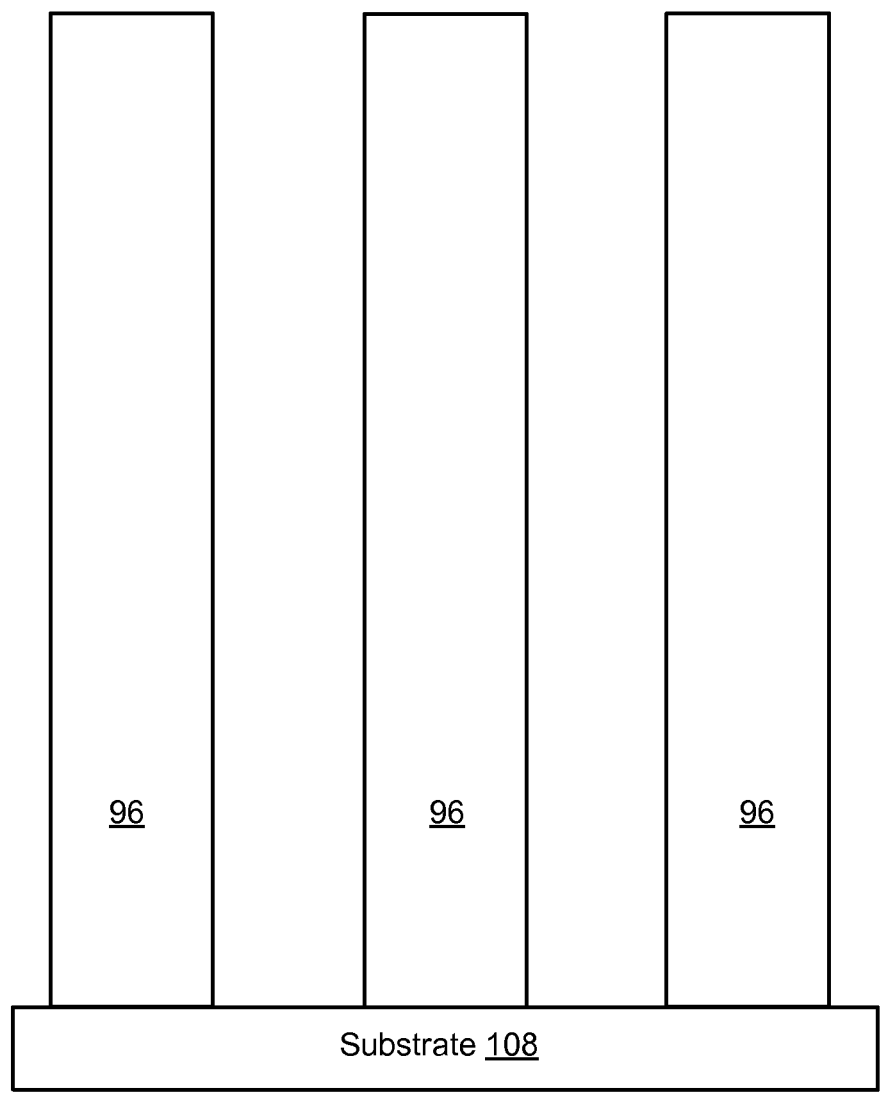
FIG. 6A and FIG. 6B show results after various steps in one embodiment of the process of FIG. 5A.
Figure 6B:
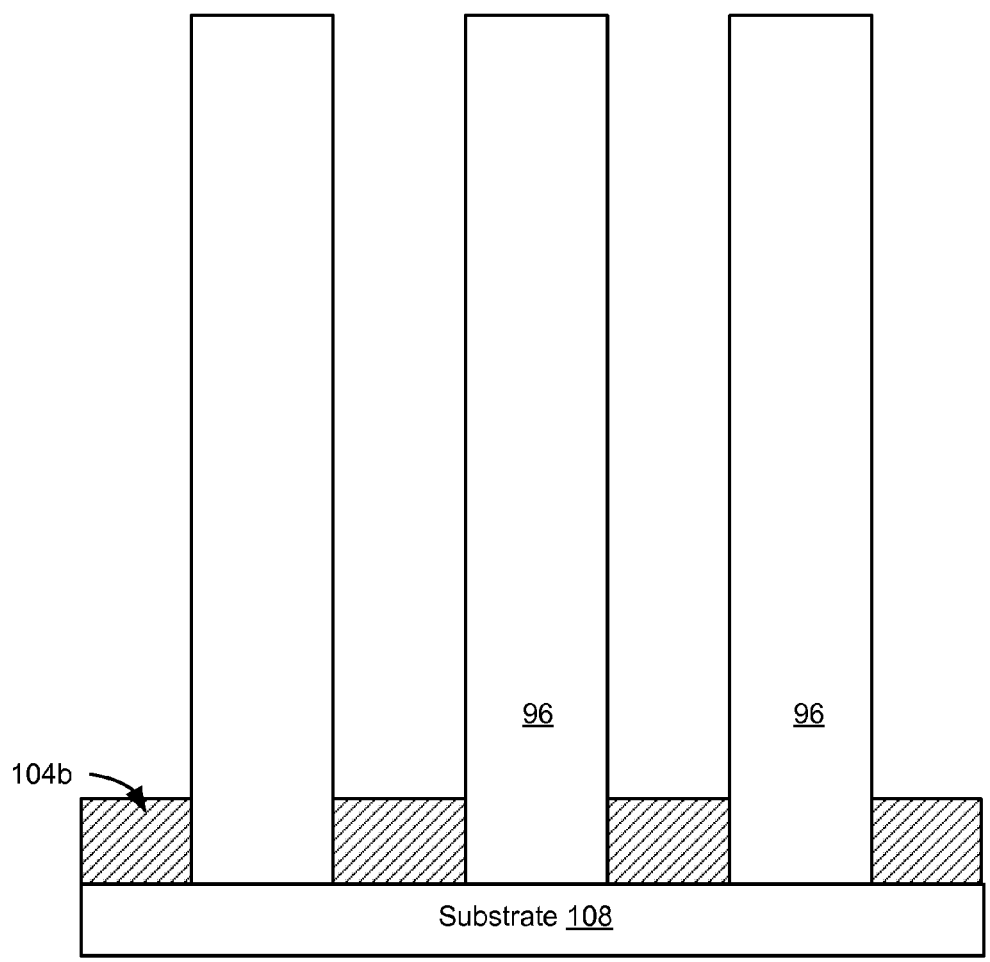

Fabricating a Nanostructure Array Optoelectronic Device Having one or more Sidewall Electrical Contacts FIG. 5A is a flowchart depicting one embodiment of a process 500 of fabricating an optoelectronic device that has one or more sidewall electrical contacts. Process 500 may be used to fabricate a device such as those depicted in FIGS. 1A, 1B, 2A, 2B, 2C, 3A, 3B, 4A, and 4B. However, process 500 is not limited to fabricating those devices. Not all process steps are depicted so as to simplify the explanation. FIGS. 6A-6B show results after various steps in one embodiment of process 500. FIGS. 6A-6B show a side perspective view showing a cutaway portion of a few nanostructures 96.

In step 502, nanostructures 96 are formed. In one embodiment, an array of nanostructures 96 are grown vertically on a substrate 108. The nanostructures 96 may be grown either by self-assembly or by patterned growth using epitaxial growth techniques such as metalorganic chemical vapor deposition, molecular beam epitaxy and hydride vapor phase epitaxy. In patterned growth, a portion of the substrate surface which is not covered by mask material such as $SiO_2$, $SiN_x$, or metal is exposed to serve as nucleation sites for the nanostructures 96. The nanostructures 96 may also be grown using nanoparticles such as gold (Au) and nickel (Ni), which may act as nucleation sites for the nanostructures 96.

In some embodiments the nanostructures 96 are formed by patterning and etching. For example, one or more planar layers of material for the nanostructures 96 is deposited. Each layer may be doped appropriately in situ or by implantation. After depositing and doping all layers, photolithography may be used to pattern and etch in order to form the nanostructures 96.

In some embodiments, the nanostructures 96 are doped with one or more impurities to create one or more p-type semiconductor regions and one or more n-type semiconductor regions. Intrinsic regions may also be formed. Note that the substrate 108 may be doped prior to forming the nanostructures 96. FIG. 6A depicts results after step 502. Specifically, a few nanostructures 96 out of an array of nanostructures 96 are depicted over a substrate 108.

In step 504, a bottom electrical contact (102, 104b) is formed. In one embodiment, the bottom electrical contact surrounds the sidewalls of the nanostructures 96. In such embodiments, the bottom electrical contact 104b may be formed by depositing a material over the substrate 108 (after the nanostructures 96 have been formed) and etching back the material. The material may be metal. In patterned growth employing conductive material (such as metal) as mask material, the mask layer may serve as a bottom sidewall electrical contact 104b. However, it is not required that the bottom electrical contact is a sidewall electrical contact. FIG. 6B depicts results after step 504 for an embodiment in which the bottom electrical contact is a sidewall contact 104b. For some embodiments, the bottom electrical contact may be added below the substrate 108 later.

In step 505, one or more intermediate sidewall electrical contacts 104c are formed. In step 506, a top sidewall electrical contact 104a is formed. Further details of steps 505 and 506 are discussed below. Note that for some devices both steps 505 and 506 are performed. For other devices, only one of steps 505 and 506 is performed.

Figure 5B:
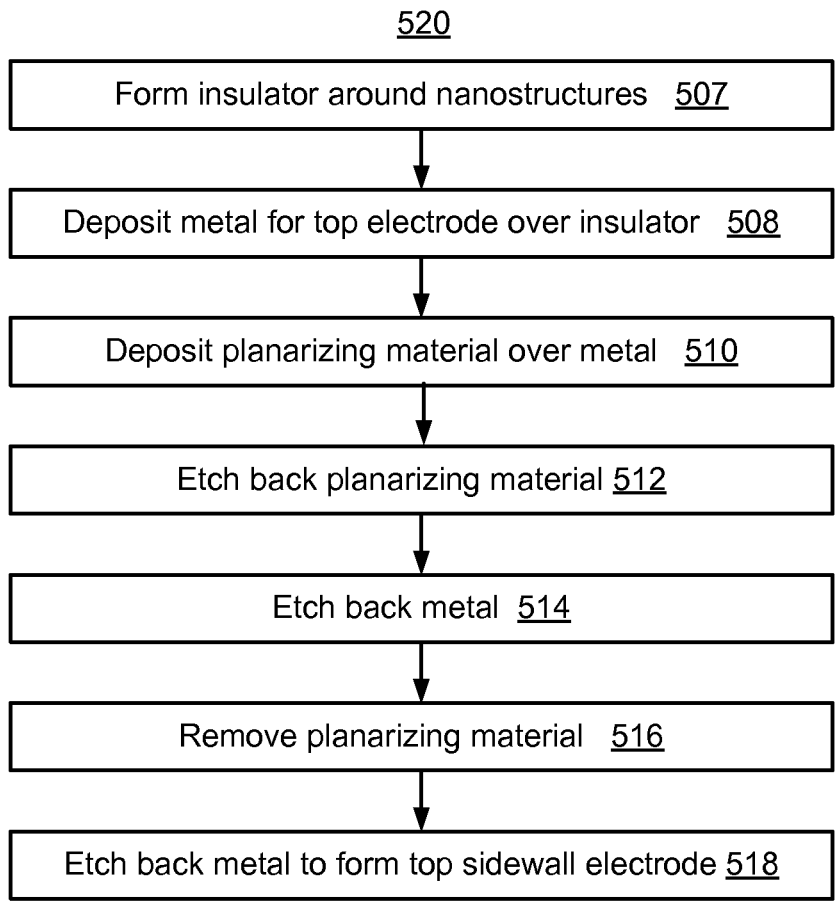
FIG. 5B is a flowchart depicting one embodiment of a process of fabricating a sidewall electrical contact.

FIG. 5B is a flowchart depicting one embodiment of a process 520 of fabricating a sidewall electrical contact for an optical device that has one or more sidewall electrical contacts. Process 520 is one embodiment of step 506 of FIG. 5A. Process 520 may also be used for step 505 of FIG. 5A. FIGS. 6C-6H show results after various steps in one embodiment of the process of FIG. 5B. FIGS. 6C-6H show a side perspective view showing a cutaway portion of a few nanostructures 96 and continue from the processing depicted in FIGS. 6A-6B. However, note that it is not that the bottom electrical contact be a sidewall electrical contact as depicted in the FIGS. 6B-6H.

Figure 6C:
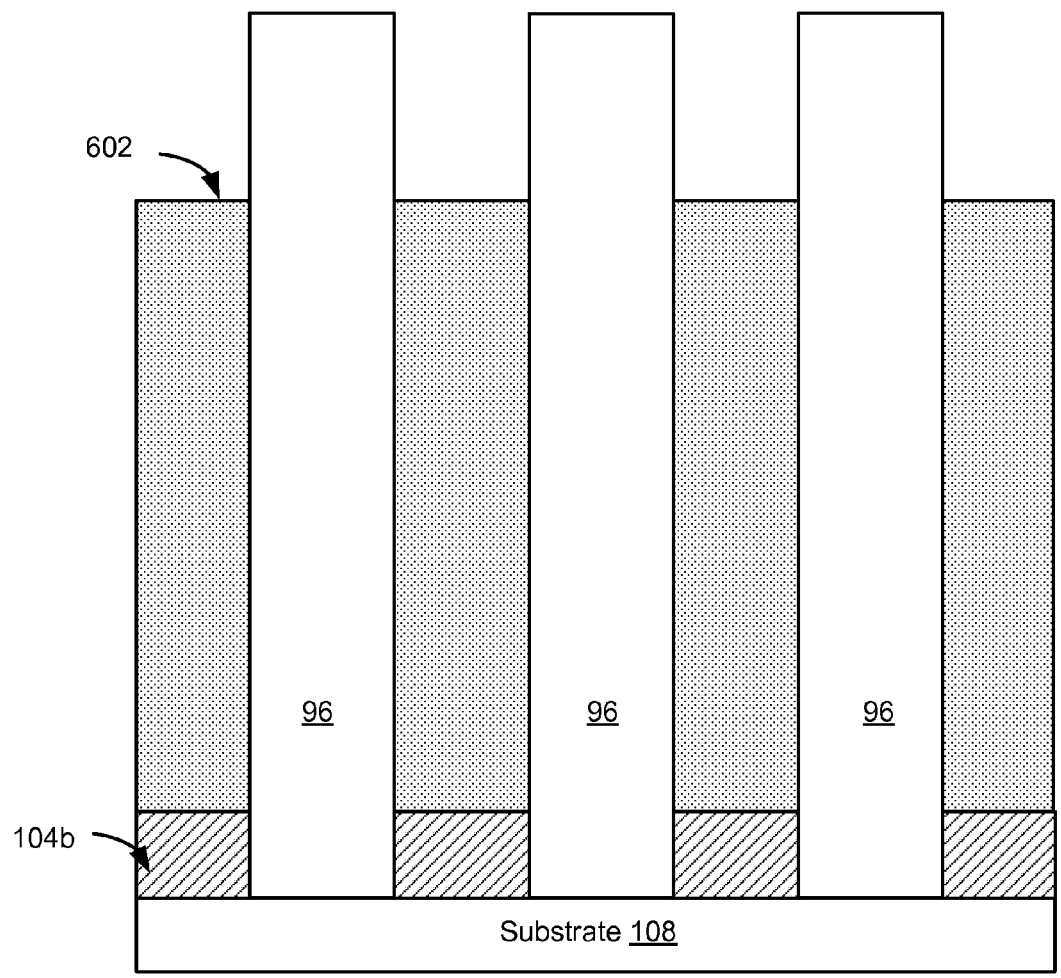
FIG. 6C, FIG. 6D, FIG. 6E, FIG. 6F, FIG. 6G, and FIG. 6H show results after various steps in one embodiment of the process of FIG. 5B.

In step 507, an insulator is formed around the sidewalls of the nanostructures 96 above the substrate 108 (and above the bottom sidewall electrical contact 104b, if formed). In one embodiment, spin-on-glass (SOG) is applied. In one embodiments, silicon dioxide is sputtered. In another embodiment, photoresist is added. Note that more than one type of material could be used. For example, layers of different materials could be deposited or a single layer could include multiple materials. After depositing, the insulator is etched back to expose tops 96a of the nanostructures 96. Note that the insulator may serve purposes such as passivating the nanostructures 96, or modifying the electrical or optical properties of the nanostructures 96. FIG. 6C depicts results after step 507 showing the insulator 602 surrounding the nanostructure sidewalls.

Figure 6D:
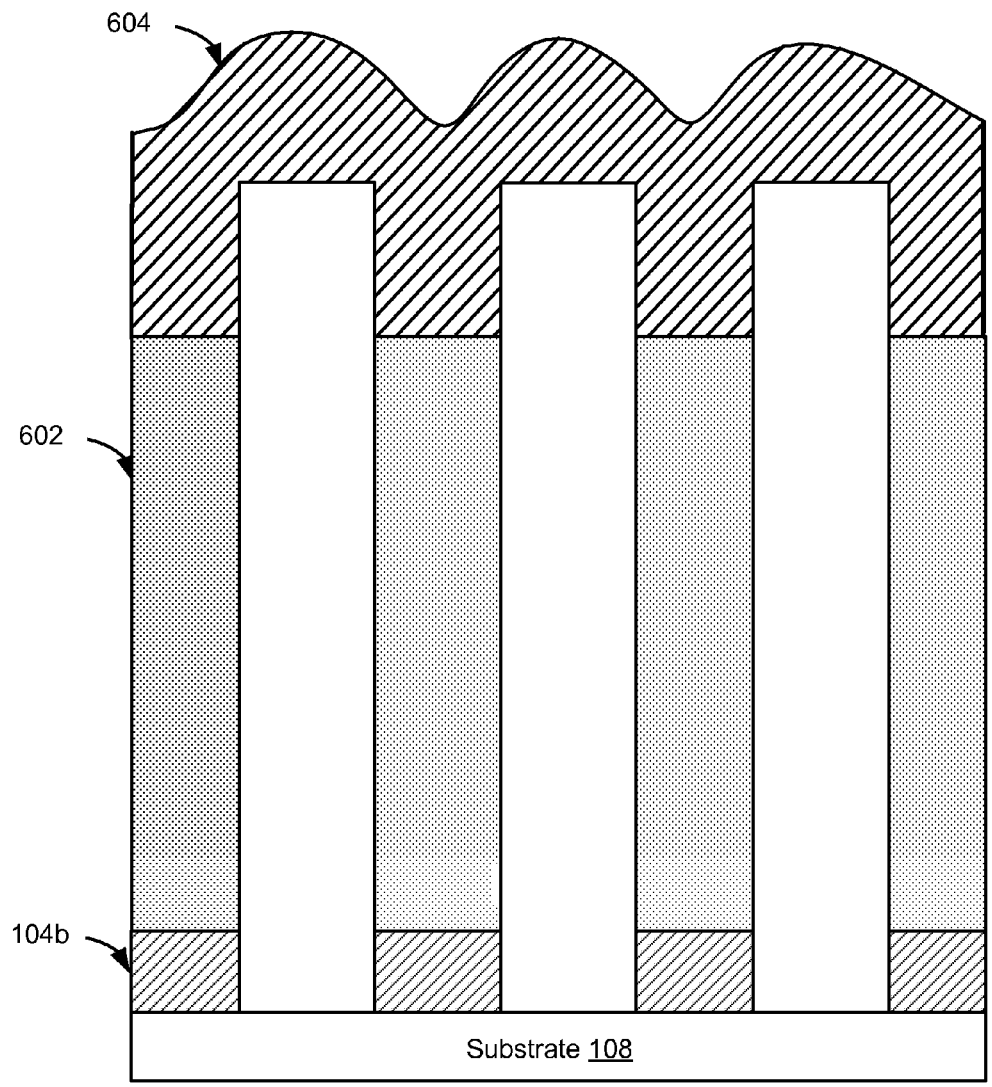

In step 508, metal is deposited over the insulator 602 such that it surrounds the nanostructure sidewalls. At this stage, portions of the metal might cover the tops of the nanostructure. FIG. 6D depicts results after step 508 in which metal 604 forms a conformal layer around and over the tops of the nanostructures 96.

Figure 6E:
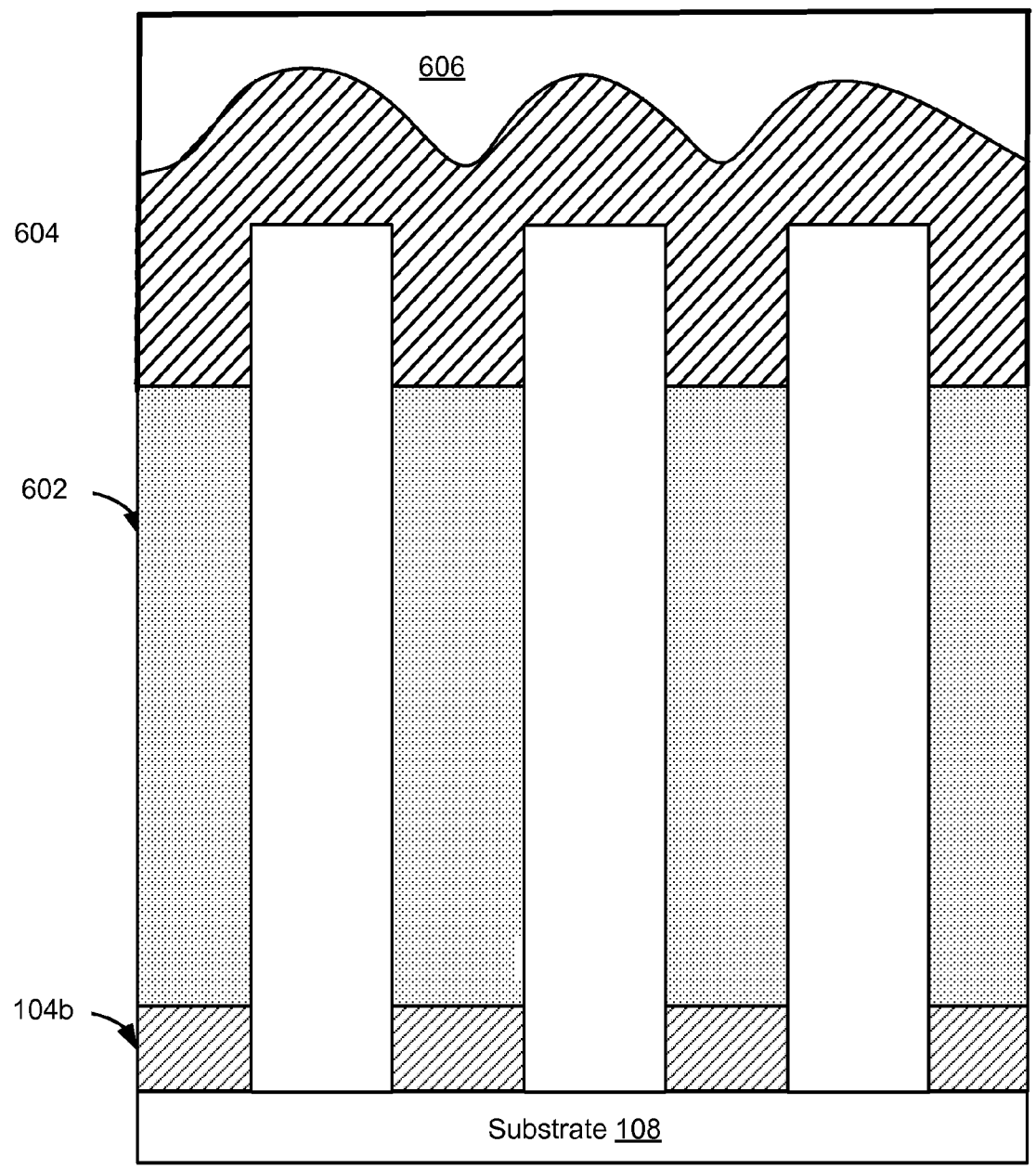

In step 510, a layer of photoresist, SOG, or other planarizing material is formed over the metal 604 and planarized. FIG. 6E depicts results after step 510 showing planarizing material 606 over the metal 604.

Figure 6F:
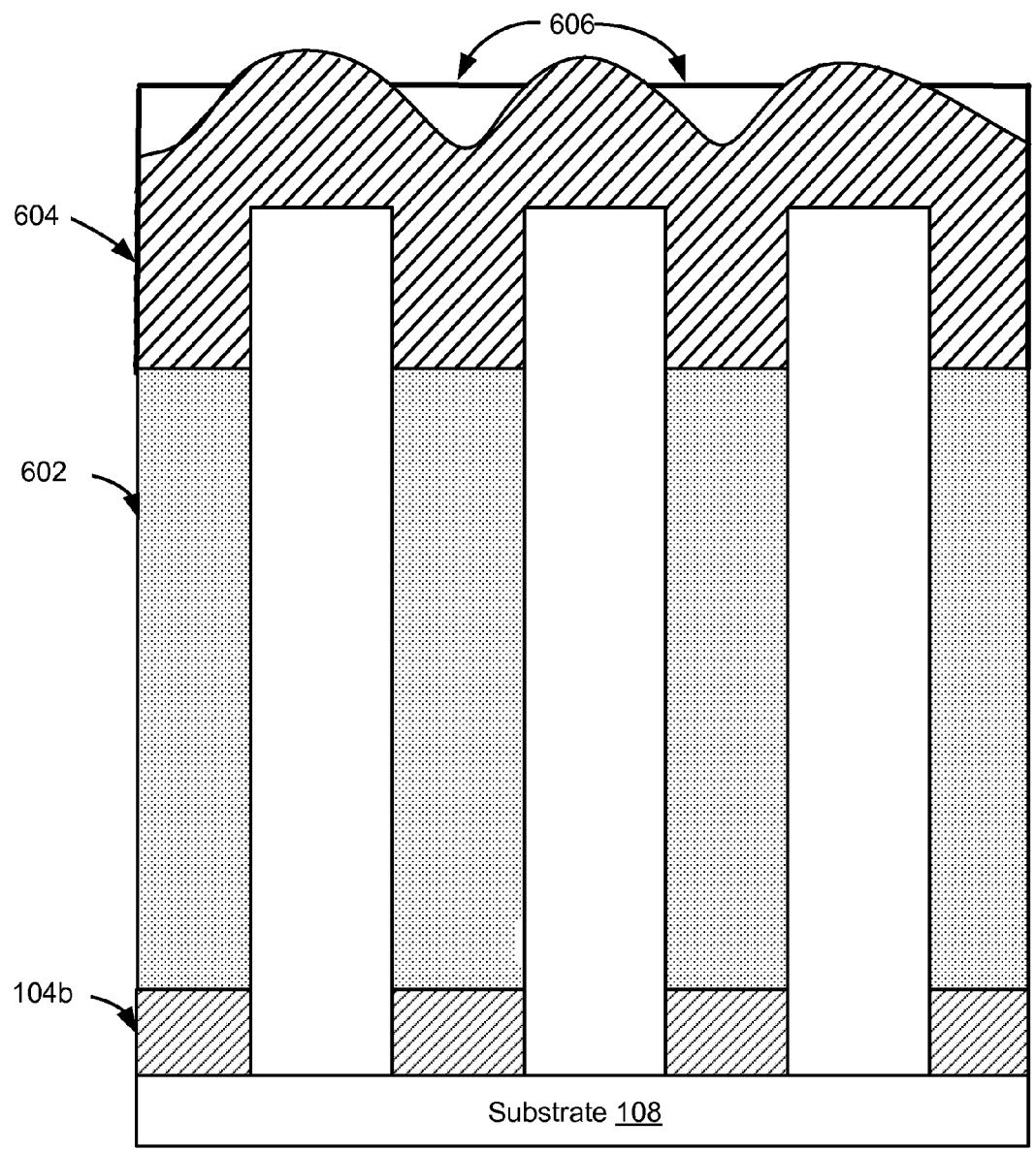

In step 512, the planarizing material 606 is etched back to reveal tops of nanostructures 96 covered with the metal 604. FIG. 6F depicts results after step 512 showing that the planarizing material 606 has been etched back to reveal portions of the metal 604 over the tops of the nanostructures 96. However, some of the planarizing material 606 remains in regions between the nanostructures 96.

Figure 6G:
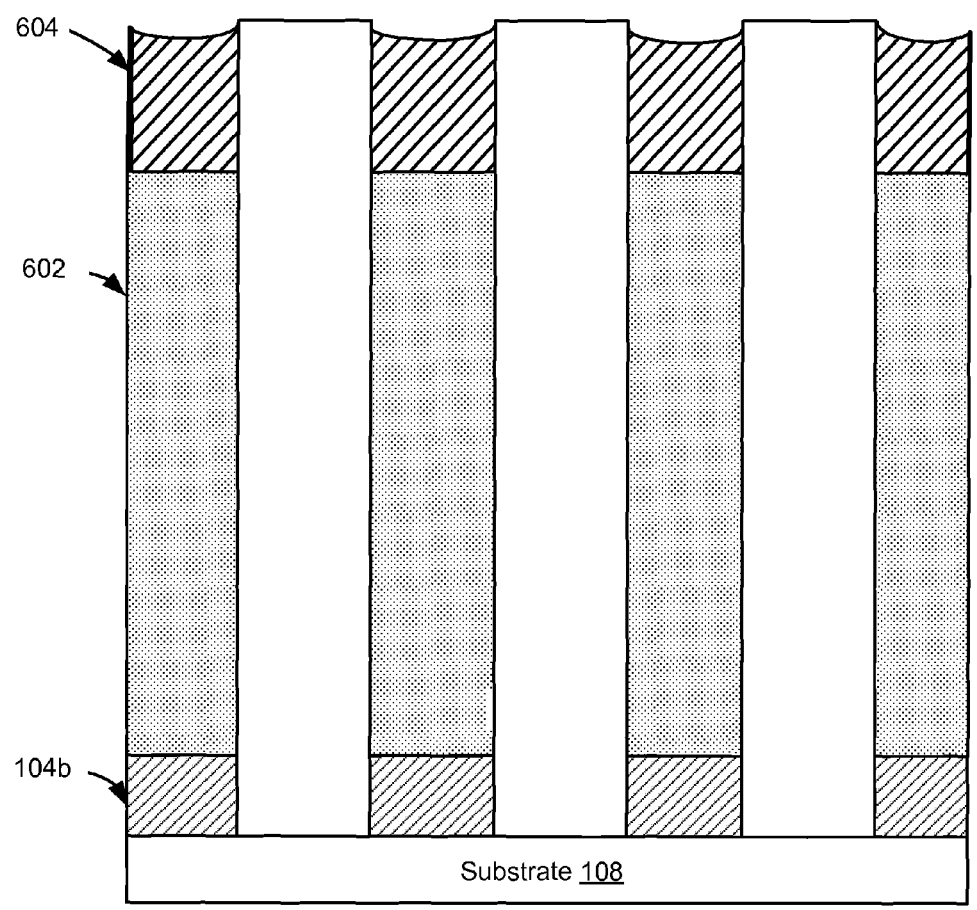

In step 514, the metal 604 is etched back with the remaining protective planarizing material 606 in place in order to reveal tops of nanostructures 96. In step 516, the planarizing material 606 is removed. FIG. 6G depicts results after step 516. FIG. 6G shows that the tops of the nanostructures 96 are exposed.

Figure 6H:
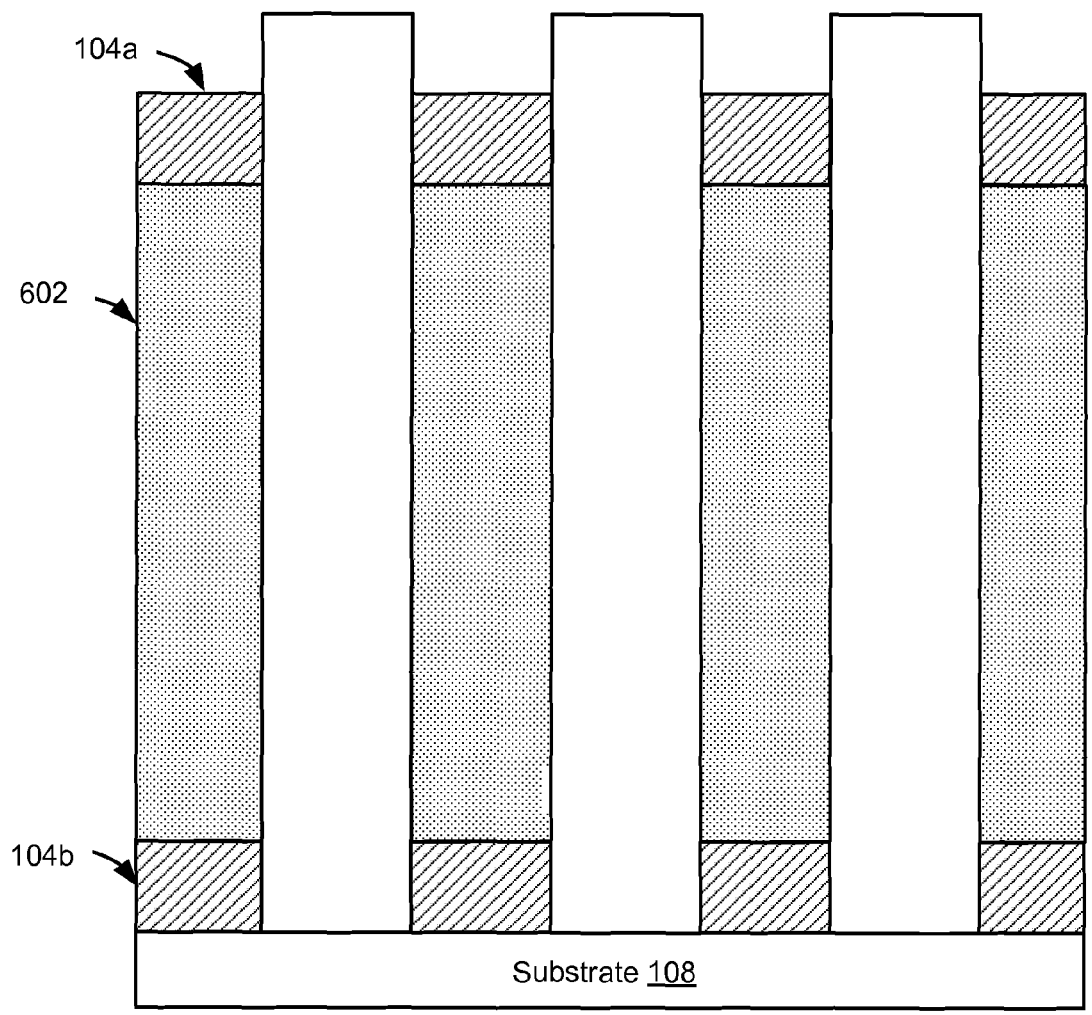

In step 518, the metal 604 is etched back to a position that leaves tops of the nanostructures 96 exposed. FIG. 6H depicts results after step 518 showing the top sidewall electrical contact 104a.

Note that steps similar to steps 507-518 may be performed to form metal contacts at other levels. For example, steps similar to steps 507-518 may be used for form an intermediate sidewall electrical contact. Thus, the process 520 may also be used for step 505 of FIG. 5A. Note that more than one intermediate sidewall electrical 104c contact may be formed.

Figure 5C:
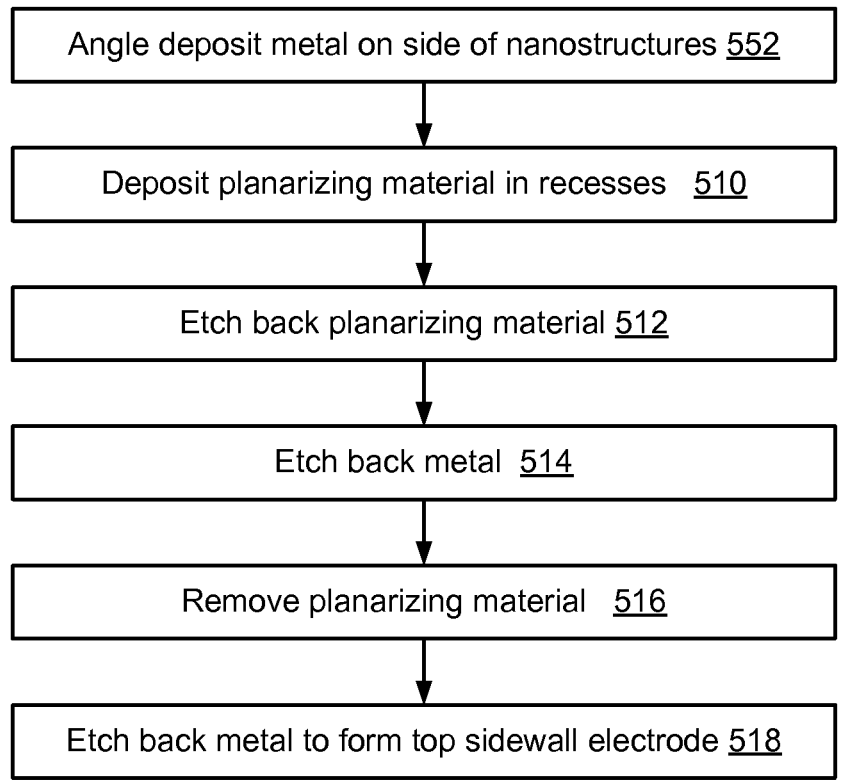
FIG. 5C is a flowchart depicting one embodiment of a process of fabricating a sidewall electrical contact using angle deposited metal.

FIG. 5C is a flowchart depicting one embodiment of a process 550 of fabricating a sidewall electrical contact for an optoelectronic device 100 that has one or more sidewall electrical contacts. Process 550 is one embodiment of step 506 of FIG. 5A. Not all process steps are depicted so as to simplify the explanation. In this embodiment, an insulating layer is not formed around the nanostructures 96. However, an insulating layer may be formed, if desired.

In step 552, metal is angle deposited such that it surrounds the nanostructure sidewalls at the tops. The metal should coalesce such that a continuous region of metal is formed at the tops of the nanostructure array. Note that the device may be rotated during the angle deposition in order to coat all sidewalls of the nanostructures at the top with metal. The angle of deposition may be selected in order to control the depth of the metal (e.g., how far down the sidewalls of the nanostructures that the metal extends).

Next steps 510-518 may be performed in order to etch the metal. Steps 510-518 may be similar to steps 510-518 of FIG. 5B and will not be discussed in detail.

Figure 5D:
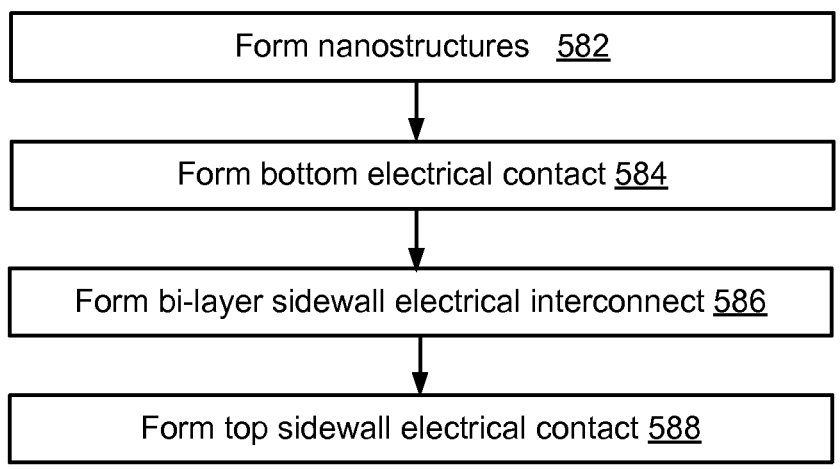
FIG. 5D is a flowchart depicting one embodiment of a process of fabricating an optoelectronic device that has at least one bi-layer sidewall electrical interconnect.

FIG. 5D is a flowchart depicting one embodiment of a process 580 of fabricating an optoelectronic device that has at least one bi-layer electrical interconnect. Process 580 may be used to fabricate a device such as those depicted in FIGS. 4A and 4B. However, process 580 is not limited to fabricating those devices. Not all process steps are depicted so as to simplify the explanation. In step 582, nanostructures 96 are formed. Step 582 is similar to step 502 of FIG. 5A. The nanostructures may have first regions of a first conductivity type and second regions of a second conductivity type to form first p-n junctions. The nanostructures may have third regions of the first conductivity type and fourth regions of the second conductivity type to form second p-n junctions.

In step 584, a bottom electrical contact (102, 104b) is formed. Forming bottom contacts has been discussed in connection with FIG. 5A.

In step 586, one or more bi-layer sidewall electrical interconnects 104d are formed. The bi-layer sidewall electrical interconnect 104d may have a first material in electrical and physical contact with the second regions and a second material in electrical and physical contact with the third regions. The first material and the second material may be in electrical contact with each other to allow charge to flow between the second regions and the third regions through the bi-layer electrical interconnect.

Forming the lower portion 404b of the bi-layer interconnect 104d may be similar to forming an intermediate sidewall contact, which has already been discussed. After forming the lower portion 404b, metal may be deposited for the upper portion 404a and etched back. In some embodiments, forming the upper portion 404a is similar to the process for forming an intermediate sidewall contact.

In step 588, a top sidewall electrical contact 104a is formed, which has already been discussed. Note that the top contact is not required to be a sidewall contact.

Independently Controlling Different Photo-Active Junctions

Figure 7A:
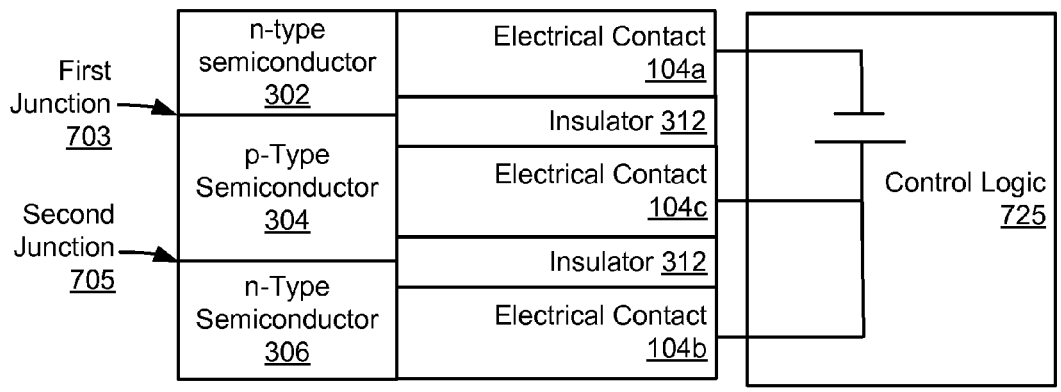
FIG. 7A, FIG. 7B, and FIG. 7C depict side section perspective views of the device of FIGS. 3A and 3B.
Figure 7B:
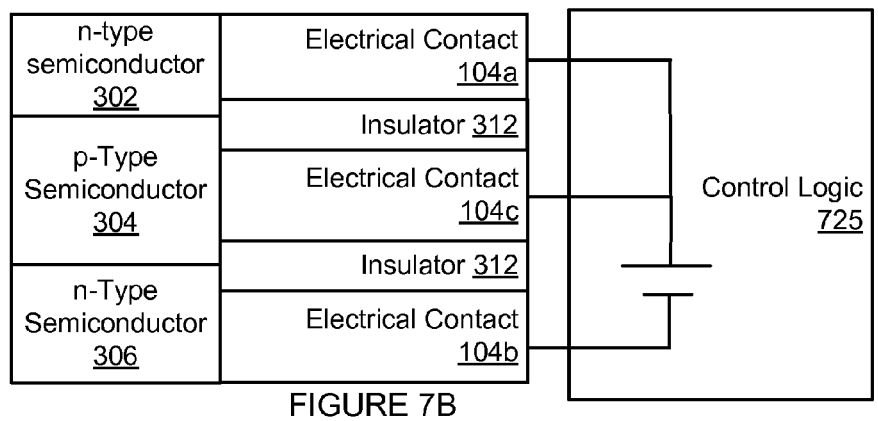
Figure 7C:
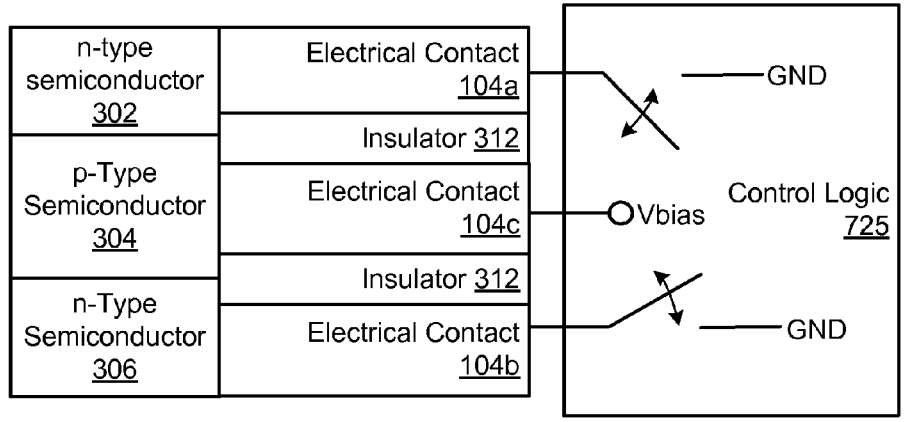

In some embodiments, different photo-active junctions of the optoelectronic device are controlled independently. In some embodiments a device 300 such as the embodiment depicted in FIGS. 3A and 3B has its junctions independently controlled. FIGS. 7A, 7B, and 7C depict a side sectional perspective view of a portion of the device of FIGS. 3A and 3B with control logic 725 that independently controls different photo-active junctions. The device 300 has a first photo-active junction 703 formed by n-type semiconductor region 302 and p-type semiconductor region 304. The device 300 has a second photo-active junction 705 formed by p-type semiconductor region 304 and n-type semiconductor region 306. Note that only one nanostructure 96 has been shown. However, typically there is an array of nanostructures 96.

In some embodiments, the device is an LED. Each photo-active junction may be able to output light of a different range of wavelengths. For example, the first photo-active junction 703 may output blue light and the second photo-active junction 705 may output green light. In some embodiments, there are three or more photo-active junctions. Therefore, the device may output three or more different colors.

FIG. 7A shows the control logic 725 activating the first photo-active junction 703 and de-activating the second photo-active junction 705. FIG. 7B shows the control logic 725 activating the second photo-active junction 705 and de-activating the first photo-active junction 703. FIG. 7C shows the logic 725 controlling (e.g., activating/de-activating) the photo-active junctions 703, 705 independently. Thus, the device 300 might output blue light when the first photo-active junction 703 is active and red light when the second photo-active junction 705 is active.

The control logic 725 may be implemented with hardware, software, or some combination of hardware and software. The software used may be stored on one or more processor readable storage devices including hard disk drives, CD-ROMs, DVDs, optical disks, floppy disks, tape drives, RAM, ROM, flash memory, or other suitable storage devices. The software can be used to program one or more processors to perform the functions of the control logic 725 described herein. In alternative embodiments, some or all of the control logic 725 can be implemented by dedicated hardware including custom integrated circuits, gate arrays, FPGAs, PLDs, and special purpose computers.

Figure 8A:
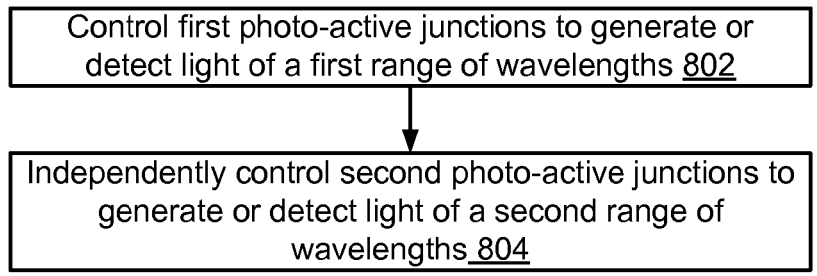
FIG. 8A is a flowchart of one embodiment of a process of independently controlling different photo-active junctions of an optoelectronic device.

FIG. 8A is a flowchart of one embodiment of a process 800 of independently controlling different photo-active junctions of an optoelectronic device. Process 800 may be performed by the control logic 725. In step 802, the control logic 725 controls first photo-active junctions 703 to generate or detect light having a first range of wavelengths. Note that each nanostructure 96 may have its own photo-active junctions. Therefore, process 800 will refer to controlling photo-active "junctions" of different nanostructures 96. For example, the control logic 725 causes the first photo-active junctions 703 of different nanostructures 96 to output blue light. Alternatively, the control logic 725 causes the first photo-active junctions 703 of different nanostructures to detect blue light. In step 804, the control logic 725 independently controls second photo-active junctions 705 to generate or detect light having a second range of wavelengths. For example, the control logic 725 causes the second photo-active junctions 703 of different nanostructures 96 to output red light (or some other color). Alternatively, the control logic 725 causes the second photo-active junctions 705 of different nanostructures to detect red light.

Figure 8B:
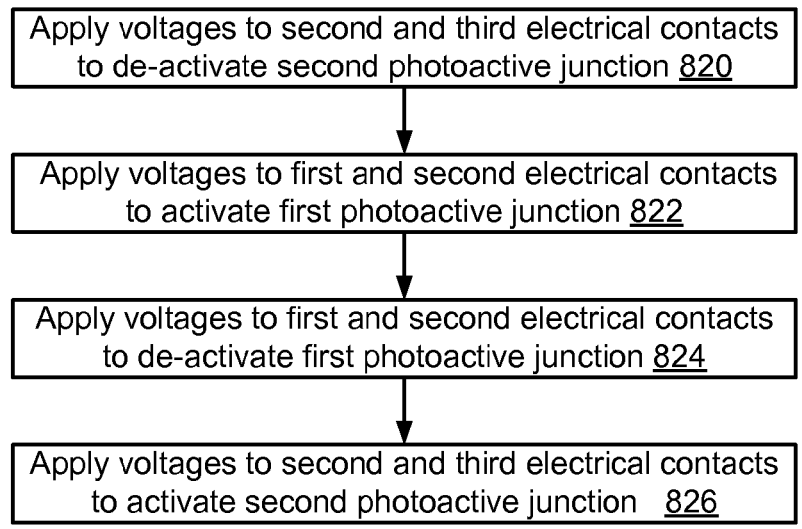
FIG. 8B is a flowchart of one embodiment of a process of independently controlling different photo-active junctions of an optoelectronic device.

FIG. 8B is a flowchart of one embodiment of a process 815 of independently controlling different photo-active junctions of an optoelectronic device. FIGS. 7A-7B will be referred to when discussing process 815. Process 815 provides more details of one embodiment of process 800. In step 820, the control logic 725 applies voltages to second and third electrical contacts (e.g., contacts 104c, 104b) in order to de-activate the second photo-active junctions 705. For example, the same magnitude voltage is applied to each contact 104b, 104c. Such as strategy may de-activate a photo-active junction for an LED. The junction might also be reverse biased to de-activate for LED operation. Note that junctions of photo-detectors may be de-activated by breaking a circuit in which the diode junction resides. Therefore, one way of activating/de-activating photo-detector junctions is to reverse bias for activation and open the circuit for de-activation.

In step 822, the control logic 725 applies voltages to first and second electrical contacts to activate the first photo-active junctions 703. For example, the control logic 725 applies a positive voltage to top sidewall electrical contact 104c while grounding intermediate sidewall electrical contact 104a in order to forward bias the first photo-active junctions 703 if the device of FIG. 7A is being used as an LED. If the device of FIG. 7A is being used as a photo-detector (or imaging device), the voltages may be reversed in order to reverse bias the first photo-active junctions 703. Note that detection of light may not require that the diode junction be biased. However, the previously mentioned circuit should be closed such that current generated by the photo-active junction may be detected. If the n-type regions 302 and p-type regions 304 are switched the voltages applied to the contacts 104a, 104c may be reversed for each case in order to activate the first junctions 703. If the n-type regions 302 and p-type regions 304 are switched the voltages applied to the contacts 104a, 104c may be reversed for each case in order to activate the first junctions 703.

Step 822 may be performed concurrently with step 820. As one example, the control logic 725 applies the same voltage to the bottom sidewall electrical contact 104b as is applied to the intermediate sidewall electrical contact 104c. Therefore, no net voltage exists across the second photo-active junctions 705. However, a different voltage might be applied to the bottom electrical contact 104b in order to de-activate it. For example, for an LED the junction might be reversed biased to de-activate it. Alternatively, for an LED, the junction might be biased with small voltage that is not sufficient to generate much, if any, light. Together, steps 820 and 822 are one embodiment of step 802 of process 800.

In step 824, the control logic 725 applies voltages to the first electrical contact (e.g., contact 104*a*) and the second electrical contact (e.g., contact 104*b*) in order to de-activate the first photo-active junctions 703. For example, the same magnitude voltage is applied to each contact 104*a*, 104*b*. Such as strategy may de-activate a photo-active junction for an LED. The junction might also be reverse biased to de-activate for LED operation. Note that junctions of photo-detectors may be de-activated by breaking a circuit in which the diode junction resides. Therefore, one way of activating/de-activating photo-detector junctions is to reverse bias for activation and open the circuit for de-activation.

In step 826, the control logic 725 applies voltages to the second and third electrical contacts to activate the second photo-active junctions 705. For example, the control logic 725 applies a positive voltage to intermediate sidewall electrical contact 104*c*, while grounding the bottom sidewall electrical contact 104*b* in order to forward bias the second photo-active junctions 705 if the device of FIG. 7B is being used as an LED. If the device of FIG. 7B is being used as a photo-detector, the voltages may be reversed in order to reverse bias the second photo-active junctions 705. As mentioned, detection of light may not require that the diode junction be biased, but the circuit should be closed. If the n-type regions 306 and p-type regions 304 are switched, then the voltages applied to the contacts 104*b*, 104*c* may be reversed for each case in order to activate the second junctions 705. If the n-type regions 306 and p-type regions 304 are switched, then the voltages applied to the contacts 104*b*, 104*c* may be reversed for each case in order to activate the second junctions 705.

Step 826 may be performed concurrently with step 824. As one example, the control logic 725 applies the same voltage to the top sidewall electrical contact 104*a* as is applied to the intermediate sidewall electrical contact 104*c*. Therefore, no net voltage exists across the first photo-active junctions 703. However, a different voltage might be applied to the top electrical contact 104*a* in order to de-activate the first photo-active junctions 703. Together, steps 824 and 826 are one embodiment of step 804 of process 800.

Figure 8C:
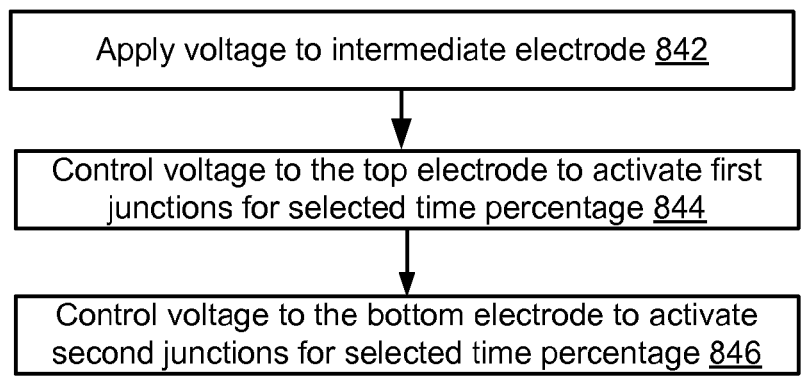
FIG. 8C is a flowchart of one embodiment of a process of independently controlling different photo-active junctions of an optoelectronic device.

In one embodiment, independently controlling the photo-active junctions includes activating the junctions 703, 705 for different percentages of time. Each junction 703, 705 may or may not be active at the same time. FIG. 8C is a flowchart of one embodiment of a process 840 of independently controlling different photo-active junctions of an optoelectronic device. FIG. 7C will be referred to when discussing process 840. Process 840 provides more details of one embodiment of process 800.

In step 842, the control logic 725 applies some voltage to the intermediate electrical contact 104*b*. As an example, a voltage that is sufficient to forward bias the junctions is applied, assuming the other contacts are grounded.

In step 844, the control logic 725 controls the voltage to the top electrical contact 104*a* in order to activate the first photo-active junctions 703 for some percentage of time. For example, the control logic 725 grounds top electrical contact 104*a* in order to forward bias the first photo-active junctions 703 (assuming the device is being used as an LED). The control logic 725 may de-activate the first photo-active junctions 703 by applying Vbias to the top electrical contact 104*a* such that there is no voltage across. Thus, by controlling the voltage to the top electrical contact 104*a* the percentage of time that the first photo-active junctions 703 are active can be controlled. Note that other suitable voltages may be used if the device is being used as a photo-detector or if the p-type and n-type regions are switched. Together, steps 842 and 844 are one embodiment of step 802 of process 800.

In step 846, the control logic 725 controls the voltage to the bottom electrical contact 104*b* in order to activate the second photo-active junctions 705 for some percentage of time. For example, the control logic 725 grounds bottom electrical contact 104*b* in order to forward bias the second photo-active junctions 705 (assuming the device is being used as an LED). The control logic 725 may de-activate the second photo-active junctions 705 by applying Vbias to the bottom electrical contact 104*b* such that there is no voltage across. Together, steps 842 and 846 are one embodiment of step 802 of process 800.

Note that the control logic 725 is able to control each junction 703, 705 by selecting the amount of time that each junction is active. For example, the control logic 725 could activate the first photo-active junctions 703 for 50 percent of the time and the second photo-active junctions 705 for 100 percent of the time. If the device is being used as an LED, this may result in a brighter light intensity of the light that is generated by the second photo-active junctions 705 than the light that is generated by the first photo-active junctions 703.

Another option for independently controlling the junctions 703, 705 is to vary the magnitude of the voltages across the junctions 703, 705. For example, a large voltage may be applied to the first photo-active junctions 703 to heavily forward bias the first junctions 703. On the other hand a relatively small voltage may be applied to the second photo-active junctions 705 to weakly forward bias the second junctions 705. The control logic 725 may accomplish this by selecting the magnitude of the voltage applied to the top 104*a* and bottom 104*b* contacts, respectively.

Figure 9:
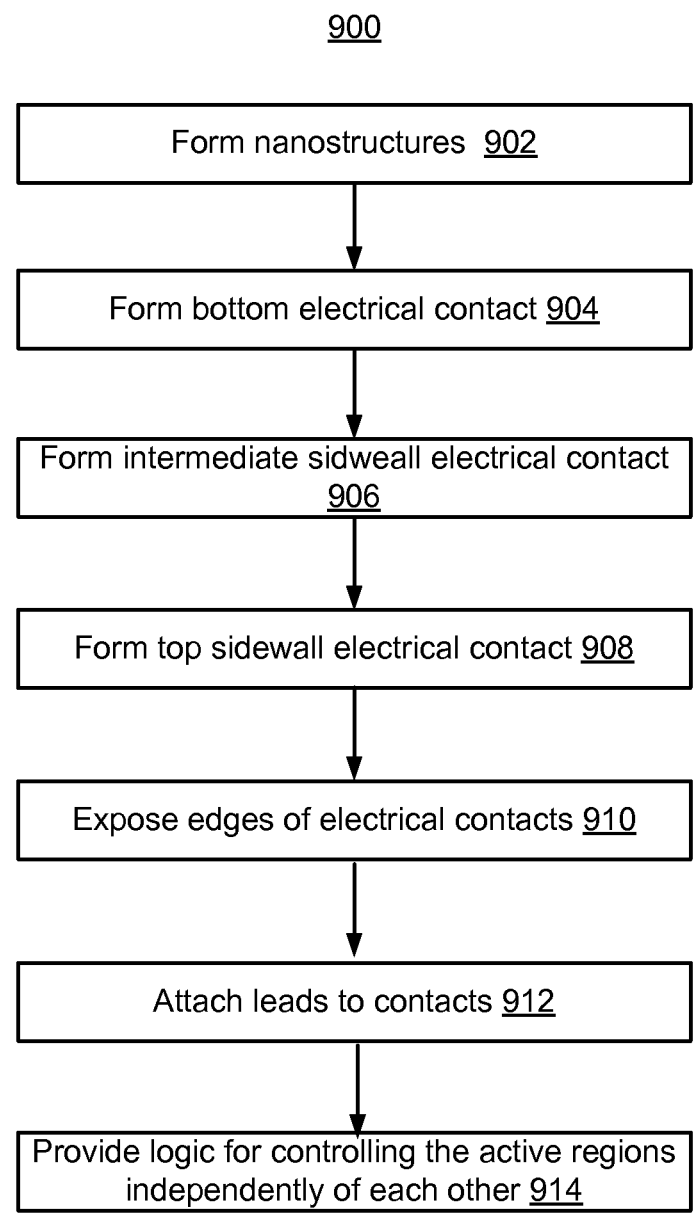
FIG. 9 depicts one embodiment of a process of fabricating an optoelectronic device that has active regions in a nanostructure array that can be independently controlled.

FIG. 9 depicts one embodiment of a process 900 of fabricating an optoelectronic device. Process 900 may be used to form a device such as devices depicted in FIGS. 3A, 3B, 7A, 7B, and 7C. In step 902, nanostructures are formed. Step 902 may be similar to step 502 of process 500 and will not be discussed in detail. In step 904, a bottom electrical contact 104*b* is formed. Step 904 may be similar to step 504 of process 500 and will not be discussed in detail. In one embodiment, the bottom electrical contact is not a sidewall electrical contact. For example, the bottom electrical contact could be located below the substrate or between the substrate and the nanostructures 96.

In step 906, an intermediate sidewall electrical contact 104*b* is formed. Step 906 may include depositing an insulator over the bottom electrical contact 104*b*, etching back the insulator to a desired level, depositing a metal over the insulator, and etching back the metal.

In step 908, a top electrical contact is formed. In one embodiment, the top electrical contact is a top sidewall electrical contact 104*a*. A process similar to the ones in either FIG. 5B or 5C might be used to form a top sidewall electrical contact 104*a*. In one embodiment, the top electrical contact is not a sidewall contact.

In step 910, edges of the electrical contacts are exposed. The edges may be exposed using a wide variety of techniques including etching and photolithography. In step 912 leads are attached to the electrical contacts. FIG. 3C depicts an example of a device 300 having exposed edges with leads 112 attached.

In step 914, control logic 725 is provided. Step 725 may include forming switches to connect the contacts 104 to different voltage sources, and providing hardware or software to control the switches. Switches may be implemented by transistors, logic gates, etc. The control logic 725 may be operable to perform functions such as those discussed in connection with FIGS. 7A-7C and 8A-8C. The control logic 725 may include any combination of hardware and/or software.

Pixilated Device

One embodiment includes a pixilated nanostructure optoelectronic device. Different groups of one or more nanostructures 96 may be controlled separately as individual pixels. Each pixel may have multiple photo-active junctions. Each junction may be capable of generating or detecting light of a different range of wavelengths. For example, one junction may be capable of blue light generation, another red light, and still another green light. The different photo-active junctions in each nanostructure 96 may be independently controlled.

FIG. 10A depicts one embodiment of a pixilated nanostructure optoelectronic device 1000. Only a small portion of the device 1000 is depicted. The device 1000 includes a first layer of p-contacts 1012 that run in the y-direction, a first layer of n-contacts 1014 that run in the x-direction, a second layer of p-contacts 1016 that run in the y-direction, and a second layer of n-contacts 1018 the run in the x-direction. Each contact may be a long strip of metal, for example. Insulation 1025 between layers of contacts is depicted in FIG. 10A.

Note that the p-contacts 1012 may be one embodiment of top sidewall electrical contacts. Note that tops 96a of the nanostructures 96 are exposed to allow light to enter or leave the nanostructures 96 from the tops 96a without passing through the p-contacts 1012. In this case, the spaces between the nanostructures 96 are not completely filled by the top sidewall electrical contacts. The region between contacts at a given layer may be filled with insulation; however, this insulation is not depicted in FIG. 10A so as to not obscure the diagram. Therefore, in some embodiments, the combination of the top sidewall contacts and insulation completely fills the spaces between the nanostructures at a level near the tops of the nanostructures 96. In some embodiments, the top contacts are not sidewall contacts.

Each contact may have a contact pad 1032 at the end to which an electrical lead 112 is attached. Therefore, the control logic 725 may apply a separate voltage (or provide a current) to each contact. In some cases, a contact may be electrically isolated from the voltage source such that the contact is floated. Only some of the electrical connections between the control logic 725 and the electrical leads 112 are explicitly depicted so as to not obscure the diagram.

A sub-pixel corresponds to the intersection of certain p-contacts and n-contacts. For example, a blue sub-pixel may correspond to the intersection of one of the p-contacts 1012 in the first layer of p-contacts 1012 and one of the n-contacts 1014 in the first layer of n-contacts 1014. As another example, a green sub-pixel may correspond to the intersection of one of the n-contacts 1014 in the first layer of n-contacts 1014 and one of the p-contacts 1016 in the second layer of p-contacts 1016. As a further example, a red sub-pixel may correspond to the intersection of one of the p-contacts 1016 in the second layer of p-contacts 1016 and one of the n-contacts 1018 in the second layer of n-contacts 1018. Note that the p-contacts may be switched with n-contacts.

Figure 10B:
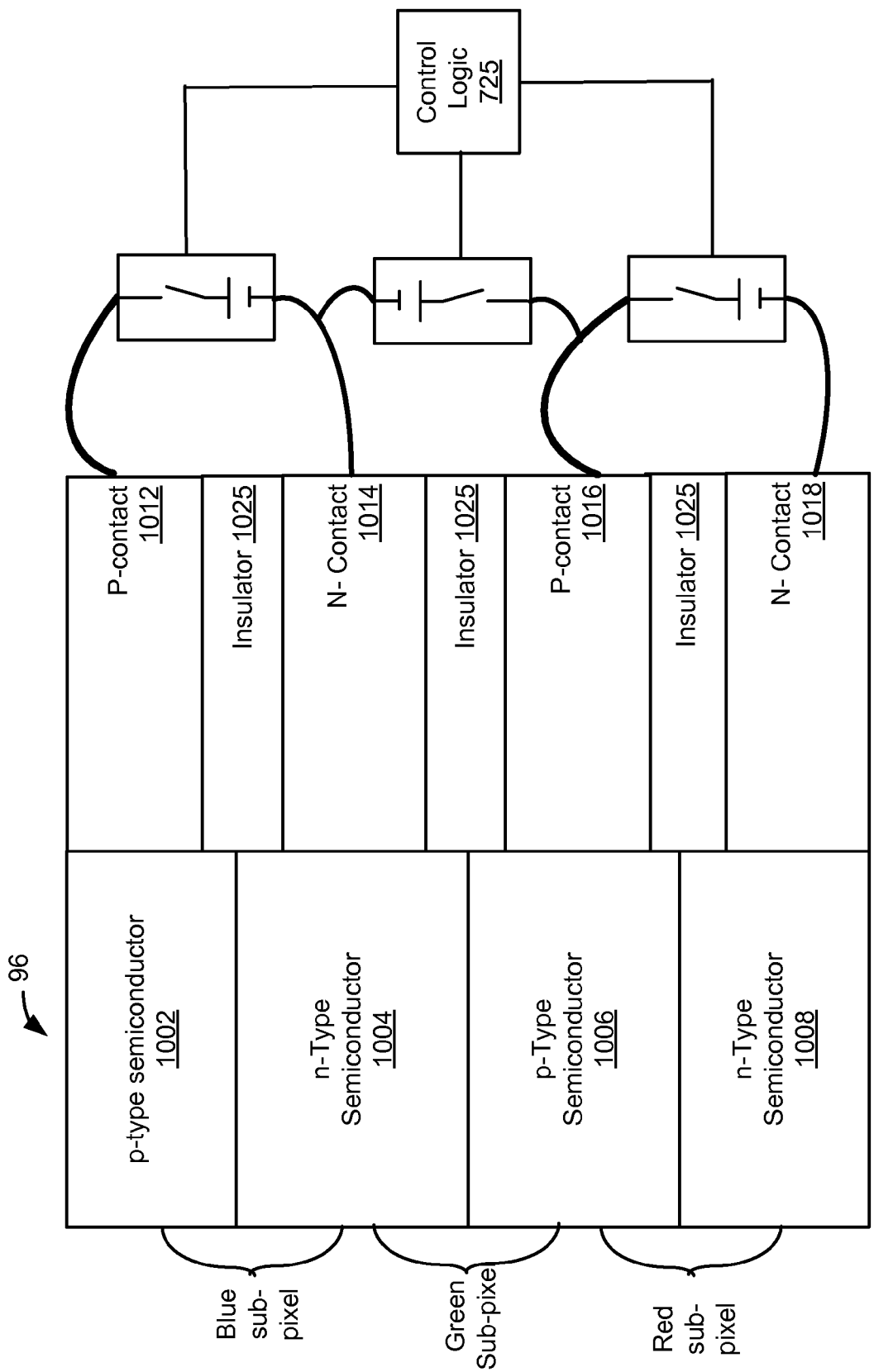
FIG. 10B depicts a side cross sectional perspective view of a portion of the device of FIG. 10A.

FIG. 10B depicts a side cross sectional perspective of a portion of the device 1000 of FIG. 10A. FIG. 10B shows a single nanostructure 96 and two p-contacts 1012, 1016, as well as two n-contacts 1014, 1018 that are physically and electrically connected to the nanostructure sidewall. Note that a given contact may surround the nanostructure 96. FIG. 10B also depicts control logic 725 that controls switches or other logic in order to bias the photo junctions appropriately to activate each photo junction separately.

The p-n junction of p-type region 1002 and n-type region 1004 may have a first band gap energy. The p-n junction of p-type region 1006 and n-type region 1004 may have a second band gap energy. The p-n junction of p-type region 1006 and n-type region 1008 may have a third band gap energy. Appropriate selection of the materials may be used such that a blue sub-pixel, a green sub-pixel and a red sub-pixel may be formed from a group of one or more nanostructures 96.

Returning again to FIG. 10A, at the junction of a given p-contact 1012 and a given n-contact 1014 there is a single nanostructure depicted (note that the single nanostructure is also the junction of one of the p-contacts 1016 and one of the n-contacts 1018). However, there may be a group of one or more nanostructures at the contact junction. Herein, the term "nanostructure group" will be used to refer to a group of one or more nanostructures that are being controlled by the same set of the p-contacts and n-contacts. For example, referring to FIG. 10A, each of the depicted nanostructures 96 is being controlled by its own set of p-contacts and n-contacts. For some embodiments, a pixel may be defined as including a blue sub-pixel, a red sub-pixel and a green sub-pixel. Therefore, a nanostructure group may function as a pixel.

Figure 10C:
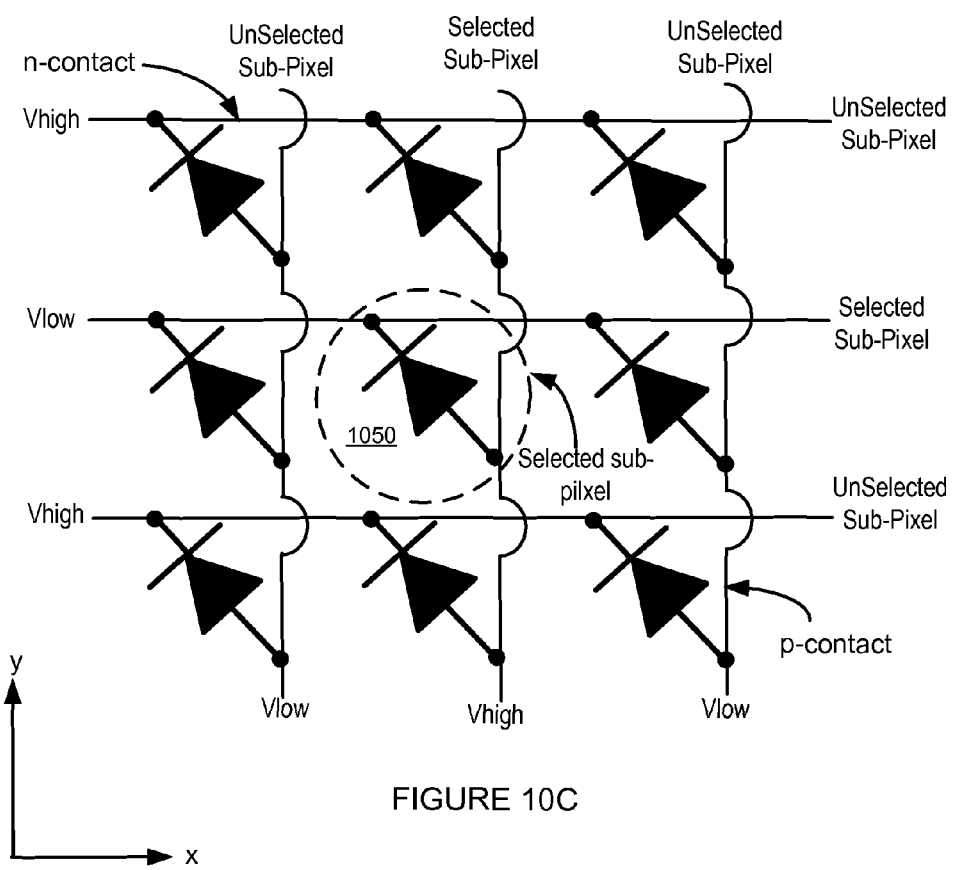
FIG. 10C depicts one embodiment of a biasing scheme for a pixilated device.

FIG. 10C depicts one embodiment of a biasing scheme for a pixilated device 1000 such as the example devices depicted in FIGS. 10A and 10B. The diagram shows three p-contacts running in the y-direction and three n-contacts running in the x-direction. For example, the contacts could be p-contacts 1012 and n-contacts 1014 from FIG. 10A. As another example, the contacts could be p-contacts 1016 and n-contacts 1018 from FIG. 10A. As still another example, the contacts could be n-contacts 1014 and p-contacts 1016 from FIG. 10A. Thus, the contacts may be on adjacent contact layers of the device 1000 of FIG. 10A. It will be understood that the p-contacts and n-contacts are not physically touching. Each diode represents one sub-pixel 1050. Each diode corresponds to a p-type region and an n-type region of a nanostructure group. Note that the diode could be a p-i-n diode.

Example bias voltages are shown applied to the contacts for LED operation. One of the sub-pixels (in the center) is selected and the others are un-selected. By selected it is meant that the photo-active region is activated by the applied voltages. For example, for an LED the sub-pixels may be biased to emit light.

Specifically, the selected sub-pixel 1050 has the voltage Vhigh applied to its p-contact and Vlow is applied to its n-contact. As one example, Vhigh-Vlow is sufficient to forward bias the diode for LED operation. As one example, Vlow may be a 0 Volts and Vhigh may be a voltage that is above the turn on voltage of the diode. However, Vlow is not required to be 0 Volts. Rather, Vlow could be greater or less than 0 Volts. Therefore, Vhigh is not necessarily a voltage that is above the turn on voltage of the diode.

Some of the unselected sub-pixels will have Vhigh-Vhigh across their diodes. Other sub-pixels have Vlow-Vlow across their diodes. Therefore, no net voltage appears across those diode junctions such that the sub-pixels are off. Some of the unselected sub-pixels will have Vlow-Vhigh across their diodes. The voltage Vlow-Vhigh should be one that does not activate the sub-pixels. For example, Vlow-Vhigh might reverse bias the diode such that the sub-pixel is off.

Note that more than one sub-pixel in a given layer may be selected at the same time by applying appropriate select voltages to the appropriate p-contact and n-contacts. For example, any number of blue sub-pixels may be selected at the same time. As another example, any number of red sub-pixels may be selected at the same time. In some embodiments, when the blue sub-pixels are being controlled, the red and green sub-pixels are dormant. For example, when the blue sub-pixels are being selected or unselected using a bias scheme such as depicted in FIG. 10C, all of the red and green sub-pixels are temporarily off. Note that FIG. 10C only shows contacts for two different levels. However, in some embodiments, there are four levels of contacts (see, for example, FIG. 10A). In some embodiments, the other contacts are floated when Vhigh and Vlow are applied to the contacts in FIG. 10C in order to keep the other sub-pixels off. However, other techniques may be used to keep the other sub-pixels off.

The foregoing biasing scheme of FIG. 10C is just one example. Other biasing schemes may be used. Modifications to the biasing scheme can be made for the case in which the diode is facing the opposite direction.

Figure 10D:
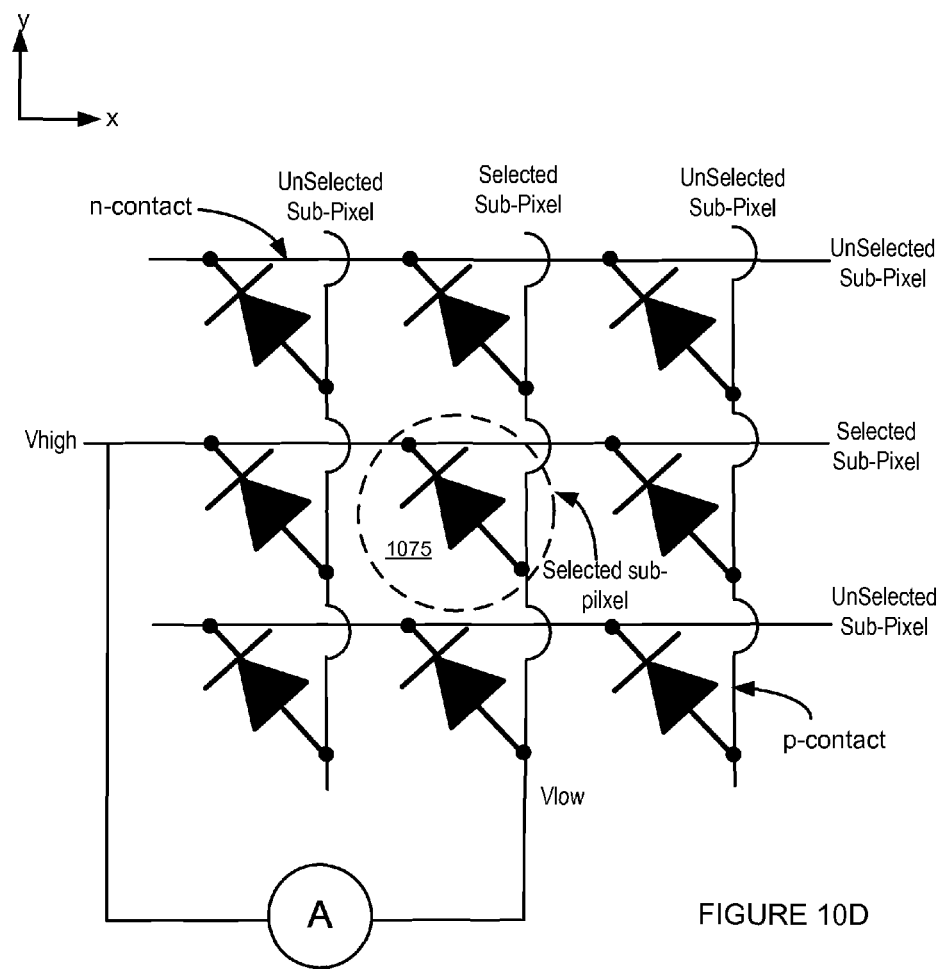
FIG. 10D shows one example biasing scheme for photodetector operation for a pixilated device such as the example devices depicted in FIGS. 10A and 10B.

FIG. 10D shows one example biasing scheme for photo-detector operation for a pixilated device 1000 such as the example devices depicted in FIGS. 10A and 10B. The diagram shows three p-contacts running in the y-direction and three n-contacts running in the x-direction. For example, the contacts could be p-contacts 1012 and n-contacts 1014 from FIG. 10A. As another example, the contacts could be p-contacts 1016 and n-contacts 1018 from FIG. 10A. As still another example, the contacts could be n-contacts 1014 and p-contacts 1016 from FIG. 10A. Thus, the contacts may be on adjacent contact layers of the device 1000 of FIG. 10A. It will be understood that the p-contacts and n-contacts are not physically touching. Each diode represents one sub-pixel 1050. Each diode corresponds to a p-type region and an n-type region of a nanostructure group. Note that the diode could be a p-i-n diode.

Example bias voltages are shown applied to the contacts for photo-detector operation. One of the sub-pixels (in the center) is selected and the others are un-selected. By selected it is meant that the photo-active region is activated by the applied voltages. For a photo-detector, the sub-pixel may be reversed biased to detect light. However, note that the junction could be un-biased also. The amount of current that is generated by the selected sub-pixel is detected by the circuit. For example, an ammeter (A) detects the current. Leaving the circuit open is one way to de-select a sub-pixel. Note that no voltages need to be applied to some of the n-contacts and p-contact, as certain sub-pixels are not selected.

Specifically, the selected sub-pixel 1075 has the voltage Vhigh applied to its re-contact and Vlow is applied to its p-contact. As already mentioned, it may not be necessary to apply voltages so long as the circuit is closed. However, reverse biasing the junction may improve operation. Some of the unselected sub-pixels will have a voltage applied to one contact. However, the other contact may be floated (e.g., the circuit may be open at the other contact). Therefore, the junction will not be active.

Note that additional sub-pixels could be selected for photo-detector operation by reverse biasing diode junctions similar to how the selected sub-pixel 1075 is selected. For example, suitable Vhigh and Vlow voltages may be applied to other n-contacts and p-contacts.

In some embodiments, at least two of the three colors of sub-pixels are selected (e.g., "on" or "active") at the same time. For example, both a red and a blue sub-pixel in the same nanostructure group may be selected at the same time. As another example, a red sub-pixel is selected in one nanostructure group while a blue sub-pixel is selected in another nanostructure group.

In some embodiments, any color sub-pixel may be selected at one point in time. For example, all sub-pixels in the same nanostructure group may be selected at the same time. As another example, some nanostructure groups have their blue sub-pixel selected at the same time that other nanostructure groups have their red sub-pixel selected and at the same time that other nanostructure groups have their green sub-pixel selected. Many other combinations are possible.

Figure 11:
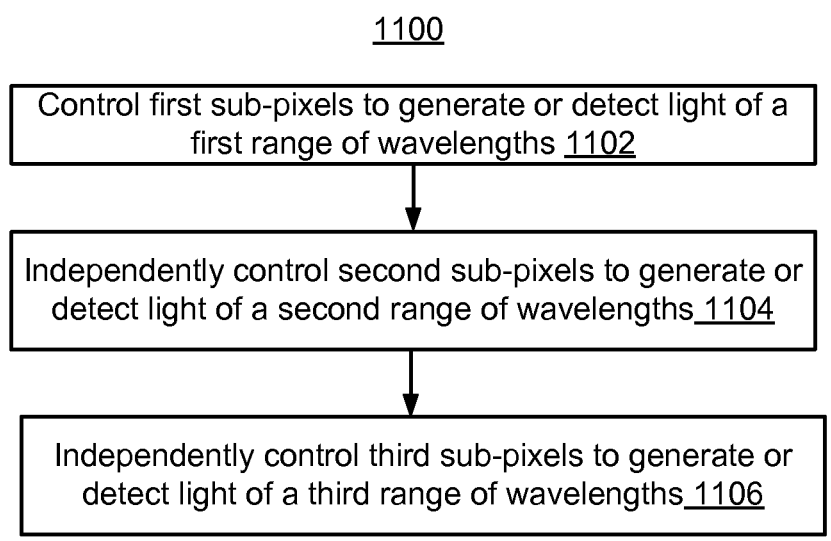
FIG. 11 depicts a flowchart of embodiment of a process of operating an optoelectronic device.

FIG. 11 depicts a flowchart of embodiment of a process 1100 of operating an optoelectronic device. The process 1100 may be used to operate a device 1000 such as the one depicted in FIG. 10A or 10B; however, the process is not limited to those devices. For example, the process could be used to operate a three color LED display. The process 1100 might also be used to operate a photo-detector, imaging device, or spectrometer. The optoelectronic device may include a nanostructure array with groups of one or more nanostructures in the array ("nanostructure groups") forming pixels having at least two sub-pixels.

In step 1102, first sub-pixels (e.g., blue sub-pixels) are controlled to generate or detect light of a first range of wavelengths. For example, the control logic 725 applies appropriate Vhigh and Vlow voltages to p-contacts 1012 and n-contacts 1014 that are associated with the blue sub-pixels. Examples of LED and photo-detector operation were described above. Other examples are described below. In one embodiment, the other sub-pixels are off when the blue sub-pixels are being controlled. One technique for keeping the other sub-pixels off is to float the other contacts. For example, p-contacts 1016 and n-contacts 1018 may be floated when Vhigh and Vlow are applied to the p-contacts 1012 and n-contacts 1014. However, other techniques can be used to keep the red and green sub-pixels off when controlling the blue sub-pixels.

In step 1104, second sub-pixels (e.g., green sub-pixels) are controlled to generate or detect light of a second range of wavelengths. For example, the control logic 725 applies appropriate Vhigh and Vlow voltages to n-contacts 1014 and p-contacts 1016 that are associated with the green sub-pixels. In one embodiment, the other sub-pixels are off when the green sub-pixels are being controlled. For example, p-contacts 1012 and n-contacts 1018 may be floated when Vhigh and Vlow are applied to the p-contacts 1014 and p-contacts 1016. However, other techniques can be used to keep the red and blue sub-pixels off when controlling the green sub-pixels.

In step 1106, third sub-pixels (e.g., red sub-pixels) are controlled to generate or detect light of a third range of wavelengths. For example, the control logic 725 applies appropriate Vhigh and Vlow voltages to p-contacts 1016 and n-contacts 1018 that are associated with the red sub-pixels. In one embodiment, the other sub-pixels are off when the red sub-pixels are being controlled. For example, p-contacts 1012 and n-contacts 1014 may be floated when Vhigh and Vlow are applied to the p-contacts 1016 and n-contacts 1018. However, other techniques can be used to keep the green and blue sub-pixels off when controlling the red sub-pixels.

Note that the first, second, and third ranges of wavelengths are different ranges. However, there may or may not be overlap in the ranges. For example, one sub-pixel may be configured to absorb/emit photons from A nm to B nm, another sub-pixel may be configured to absorb/emit photons from B nm to C nm, another sub-pixel may be configured to absorb/emit photons from C nm to D nm. As another example, one sub-pixel may be configured to absorb/emit photons from A nm to B nm, another may be configured to absorb/emit photons from B+x nm to C nm, another may be configured to absorb/emit photons from C+y nm to D nm (where x and y are positive values). As still another example, one sub-pixel may be configured to absorb/emit photons from A nm to B nm, another may be configured to absorb/emit photons from B-x nm to C nm, another may be configured to absorb/emit photons from C-y nm to D nm. Other variations are possible; the foregoing are intended as examples.

Note also that two or more of steps 1102, 1104, and 1106 may be performed simultaneously. In some embodiments, different colors of sub-pixels may be controlled at the same time. Therefore, a red sub-pixel could be selected at the same time that a blue sub-pixel is selected, for example. Further details of selecting different colors of sub-pixels at the same time are discussed below.

Using the process 1100 of FIG. 11, essentially any color of light may be generated. For example, white light could be generated by activating selected blue sub-pixels for a period of time (while green and red sub-pixels are off), activating selected green sub-pixels for a period of time (while green and blue sub-pixels are off), and activating selected red sub-pixels for a period of time (while green and blue sub-pixels are off). However, in some embodiments, two or more colors of sub-pixels are selected at the same time. For example, white light could be generated by selecting a blue sub-pixel, a green sub-pixel, and a red sub-pixel at the same time. Note that the blue, green and red sub-pixels may be in the same nanostructure group. Further details of such a technique are discussed below.

Another option for generating different colors is to select different color sub-pixels from adjacent nanostructure groups. As mentioned, because a nanostructure group of some embodiments has three colors of sub-pixels, a nanostructure group may be considered to be a pixel. However, another option for forming a "pixel" is to use three adjacent nanostructure groups. For example, a pixel could comprise the blue sub-pixel from one nanostructure group, the green sub-pixel from an adjacent nanostructure group, and the red sub-pixel from another adjacent nanostructure group. Thus, as one example, white light could be formed by selecting a blue, red and green sub-pixel from adjacent nanostructure groups at the same time.

Example Biasing Schemes for Operating Different Color Sub-Pixels Simultaneously

Figure 12A:
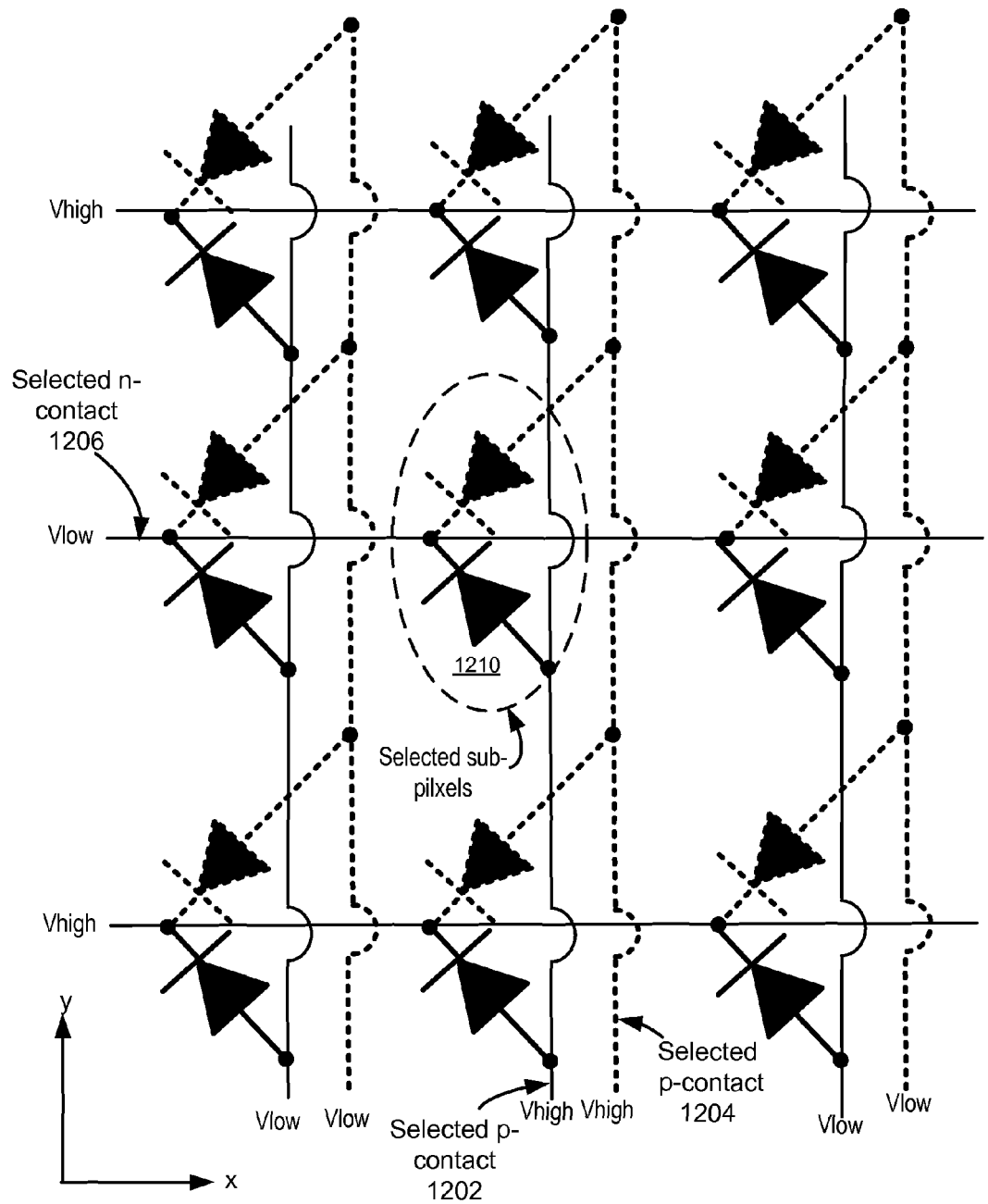
FIG. 12A, FIG. 12B, and FIG. 12C depict one embodiment of a biasing scheme for LED operation in which different color sub-pixels are operated simultaneously.
Figure 12B:
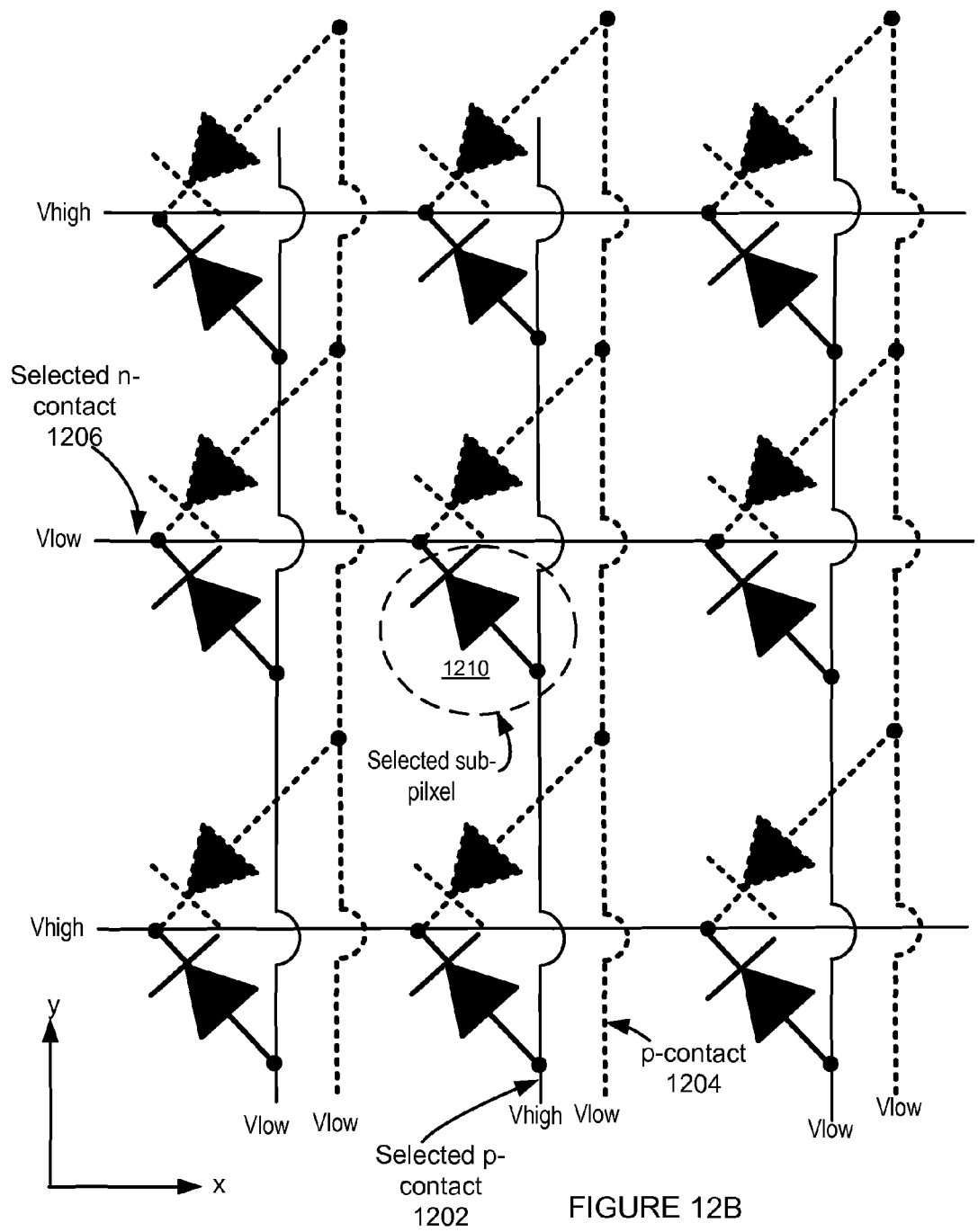
Figure 12C:
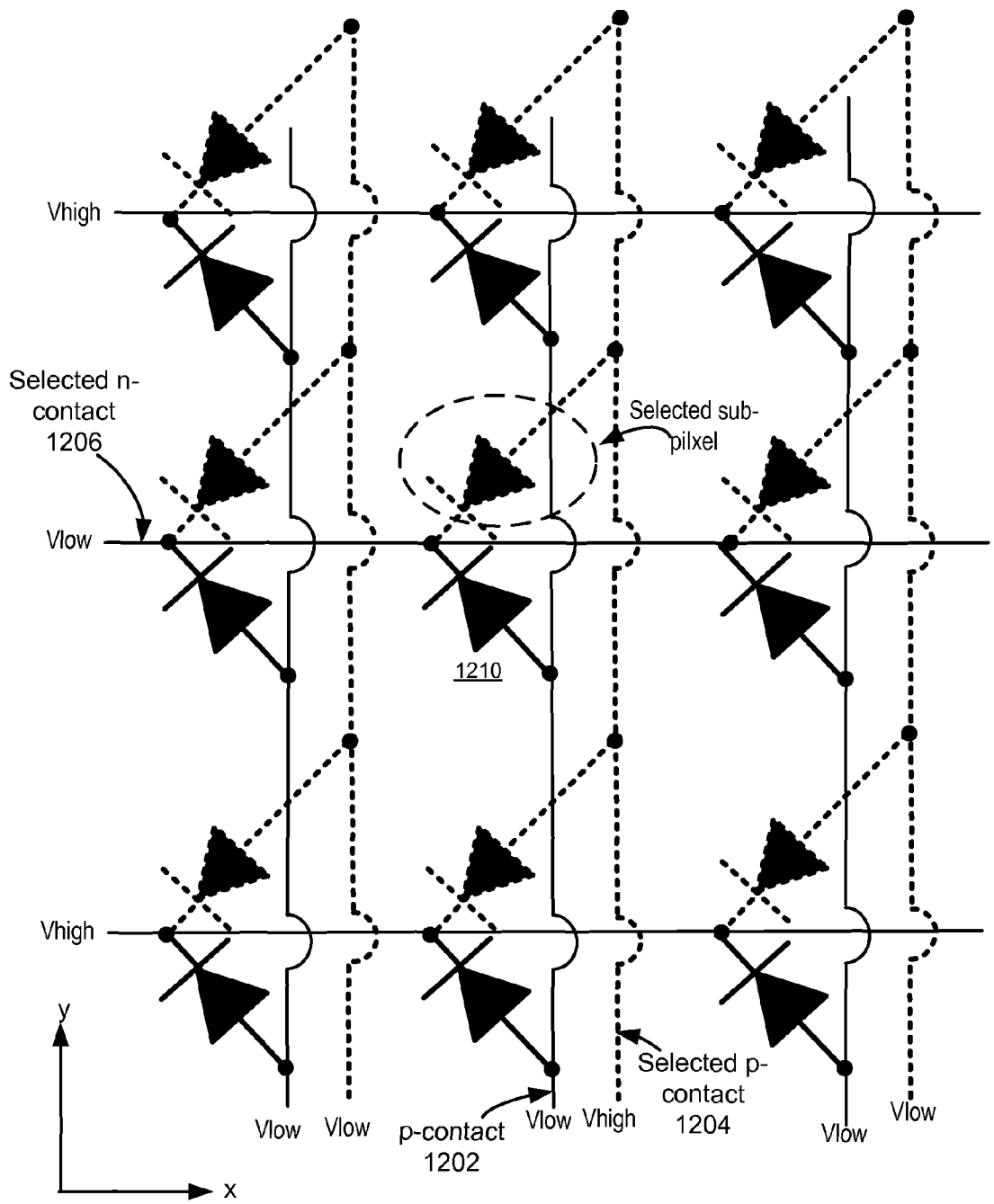

FIGS. 12A-12C depict one embodiment of a biasing scheme in which different colors of sub-pixels are controlled simultaneously. This scheme may be used for LED operation, for example. This allows different color of sub-pixels to be selected at the same time. In this embodiment, two sub-pixels in the same nanostructure group may be controlled simultaneously. For example, the red sub-pixels and the green sub-pixels may be controlled (or operated) at the same time. For example, a red sub-pixel and a green sub-pixel in the same nanostructure group may be selected at the same time. As another example, a red sub-pixel in one nanostructure group may be selected and at the same time that a green sub-pixel in another nanostructure group is selected. In some embodiments, steps 1102, 1104, and 1106 of FIG. 11 are performed using the biasing scheme depicted in FIGS. 12A-12C.

FIGS. 12A-12C depict three different levels of contacts. One set of p-contacts 1202 that run in the y-direction are shown as solid lines to depict they are at one level. A second set of p-contacts 1204 that run in the y-direction are shown as dashed lines to depict they are at another level. Also depicted as a set of n-contacts 1206 that run on the x-direction. The n-contacts are at a different level than the p-contacts. The three levels of contacts may correspond to three of the four levels of contacts from the device 1000 of FIG. 10A. One set of diodes is depicted as being connected between p-contacts 1202 and n-contacts 1206. Those diodes represent one color of sub-pixels. Another set of diodes is depicted as being connected between p-contacts 1204 and n-contacts 1206. Those diodes represent another color of sub-pixels.

In FIG. 12A, one sub-pixel of each color is circled to indicate that they are selected sub-pixels 1210. All of the other sub-pixels are off (not selected) in this example. The example voltages that are applied to the contacts are as follows. The voltage Vhigh is applied to the selected p-contact 1202, 1204 of each of the selected sub-pixels, while Vlow is applied to the selected n-contact 1206. Therefore, the diode junctions are forward biased to select the sub-pixel. Note that this pertains to operation as an LED, for example. All other diodes are either reverse biased or have no voltage applied across the diode. Therefore, the other sub-pixels are off (not selected).

In FIG. 12B, one sub-pixel is circled to indicate that it is the selected sub-pixel 1210. The example voltages that are applied to the contacts are as follows. The voltage Vhigh is applied to the selected p-contact 1202 of the selected sub-pixel, while Vlow is applied to the selected n-contact 1206. Therefore, the diode junction is forward biased to select the sub-pixel. The p-contact 1204 for the other color sub-pixel has Vlow applied such that its diode is un-biased. All other diodes are either reverse biased or have no voltage applied across the diode. Therefore, the other sub-pixels are off (not selected).

In FIG. 12C, one sub-pixel is circled to indicate that it is the selected sub-pixel 1210. The example voltages that are applied to the contacts are as follows. The voltage Vhigh is applied to the selected p-contact 1204 of the selected sub-pixel, while Vlow is applied to the selected n-contact 1206. Therefore, the diode junction is forward biased to select the sub-pixel. The p-contact 1202 for the other color sub-pixel has Vlow applied such that its diode is un-biased. All other diodes are either reverse biased or have no voltage applied across the diode. Therefore, the other sub-pixels are off (not selected).

In one embodiment, while the two colors of sub-pixels in FIGS. 12A-12C are being controlled (e.g., being selected or unselected), the sub-pixels for the other color is kept off. Then, while the two colors of sub-pixels in FIGS. 12A-12C are off, the sub-pixels for the other color are being controlled (e.g., being selected or unselected). For example, 50 percent of the time red and green sub-pixels are being controlled using the biasing scheme of FIGS. 12A-12C with blue sub-pixels off. The other 50 percent of the time blue sub-pixels are being controlled using the biasing scheme of FIG. 10C with red and green sub-pixels off.

Figure 12D:
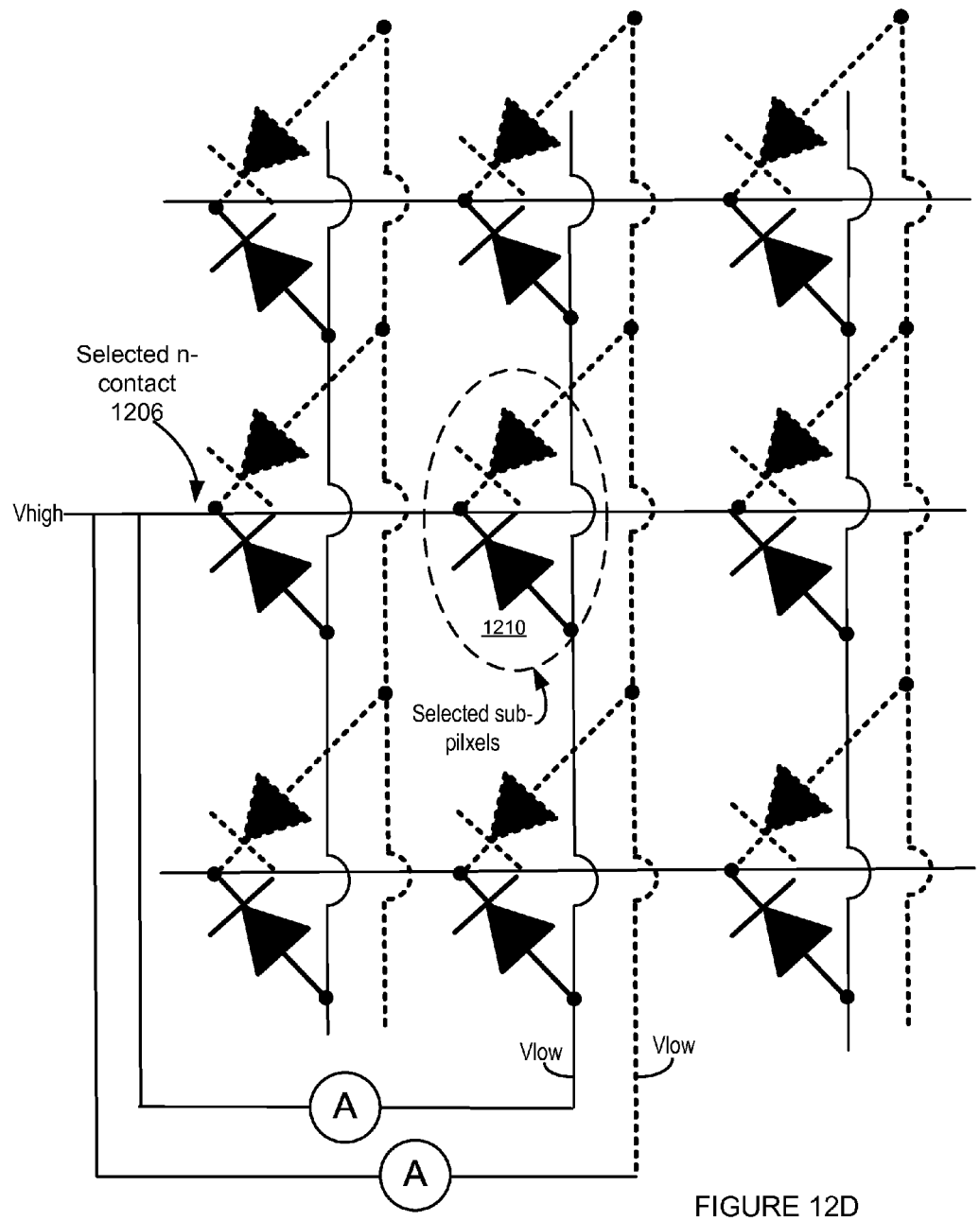
FIG. 12D shows one possible biasing scheme for selecting two different colors of sub-pixels in the same nanostructure for photo-detector operation.

Note that two different colors of sub-pixels may be simultaneously selected when operating as a photo-detector. FIG. 12D shows one possible biasing scheme for selecting two different colors of sub-pixels in the same nanostructure for photo-detector operation. As can be seen two sub-pixels are reversed biased and therefore, selected for photo-detector operation. Un-selected sub-pixels have open circuits, and do not require a voltage applied to each contact. As mentioned, operation may be possible without basing the contacts, so long as the circuit is closed. Also note that one color sub-pixel can be selected in one nanostructure, while selecting another color sub-pixel in another nanostructure. For example, a red (but not green) sub-pixel could be selected in one nanostructure while selecting a green (but not red) sub-pixel in the other nanostructure.

FIGS. 13A-13H depict one embodiment of a biasing scheme in which three different color sub-pixels are operated or controlled simultaneously. The scheme may be used for LED operation, for example. In this embodiment, three sub-pixels in the same nanostructure group may be controlled simultaneously. For example, any combination of a blue sub-pixel, a red sub-pixel and a green sub-pixel in the same nanostructure group may be selected at the same time. Also note that a different nanostructure group may have a different combination of sub-pixels selected at the same time. For example, one nanostructure group may have its blue and green sub-pixels selected at the same time that another nanostructure group has its red and blue sub-pixels selected. In some embodiments, steps 1102, 1104, and 1106 of FIG. 11 are performed using the biasing scheme depicted in FIGS. 13A-13H.

FIGS. 13A-13H depict four different levels of contacts. These may correspond to the contacts in FIG. 10A. One set of p-contacts 1012 that run in the y-direction are shown as solid lines to depict they are at one level. A second set of p-contacts 1016 that run in the y-direction are shown as dashed lines to depict they are at another level. Also depicted as two sets of n-contacts 1014, 1018 that run in the x-direction.

One set of diodes is depicted as being connected between p-contacts 1012 and n-contacts 1014. Those diodes represent one color of sub-pixels (e.g., blue sub-pixels). Another set of diodes is depicted as being connected between p-contacts 1016 and n-contacts 1014. Those diodes represent another color of sub-pixels (e.g., green sub-pixels). Still another set of diodes, which represent a third color of sub-pixels (e.g., red sub-pixels), is depicted as being connected between p-contacts 1016 and n-contacts 1018.

FIGS. 13A-13H show voltages that may be applied to the contacts in order to selectively operate different combinations of sub-pixels in the center pixel 1310. All other sub-pixels are off on each of FIGS. 13A-13H. However, note that the other sub-pixels could be on if suitable voltages were applied to their contacts. In this example, the voltage Vhigh may be a turn on voltage of a diode. The voltage Vlow may be –Vhigh. In general, forward biasing the diode may be used to select the sub-pixel. Diodes that are either un-biased or reverse biased result in off sub-pixels. The foregoing assumes operation as an LED.

Figure 13B:
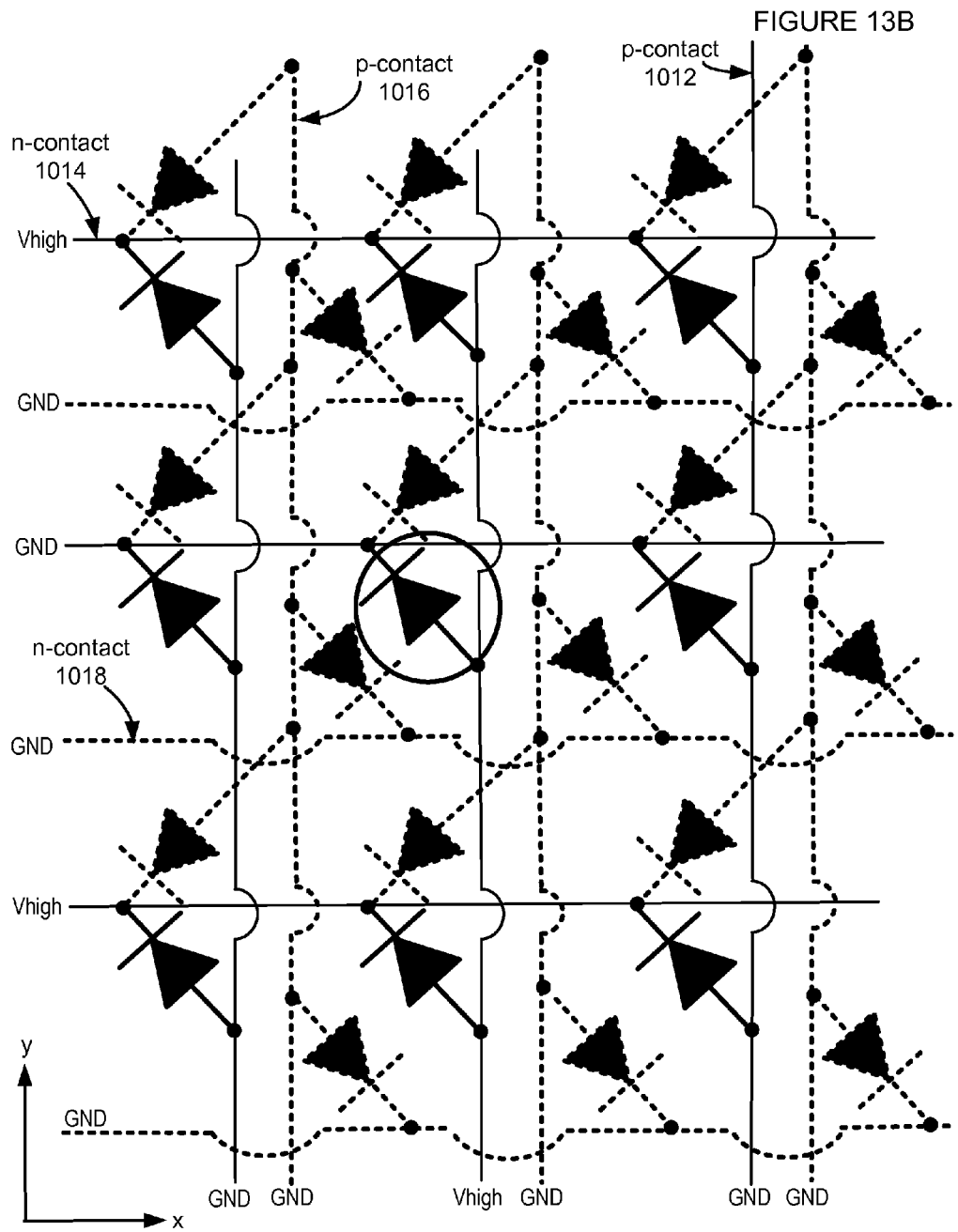
Figure 13C:
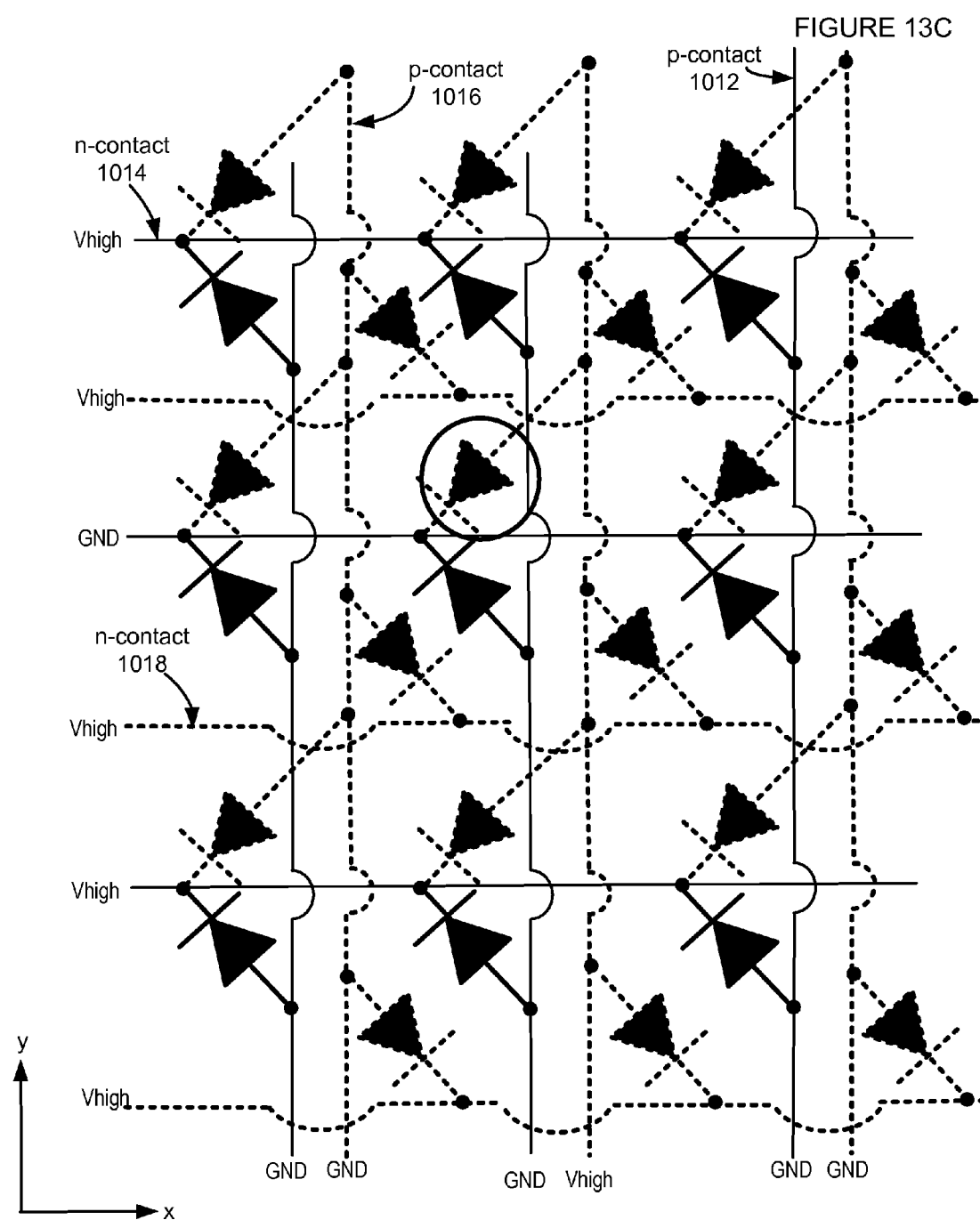
Figure 13D:
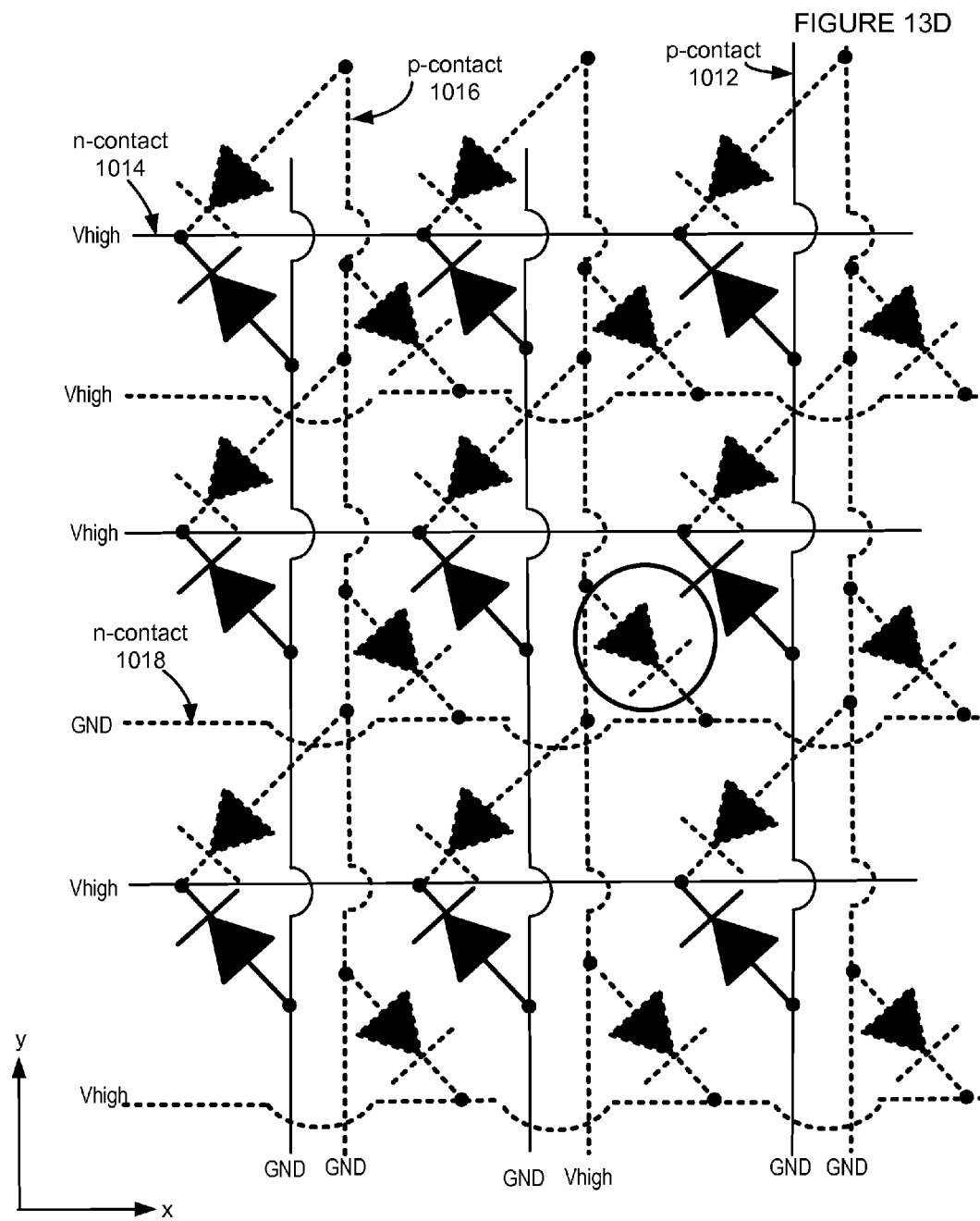
Figure 13E:
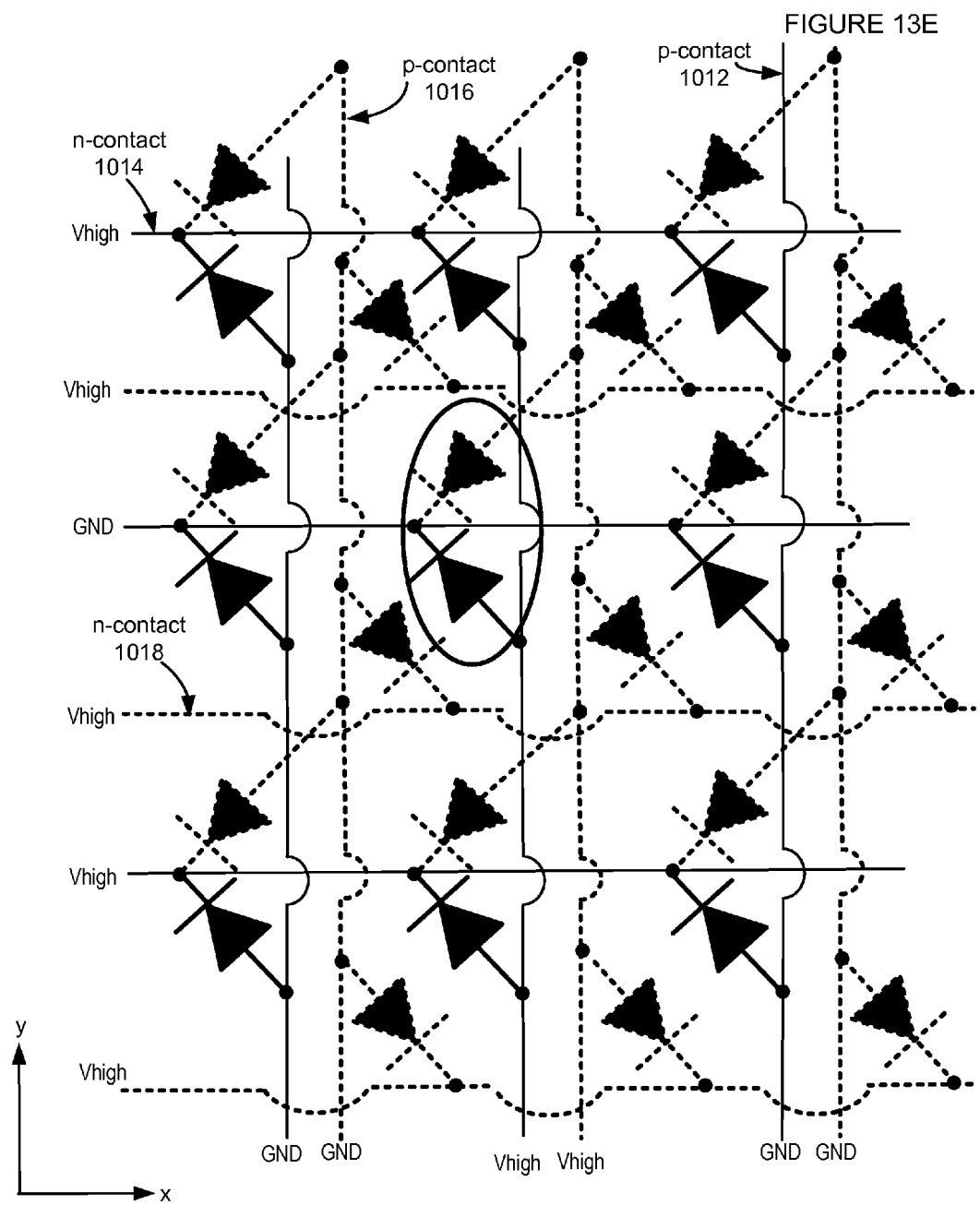
Figure 13F:
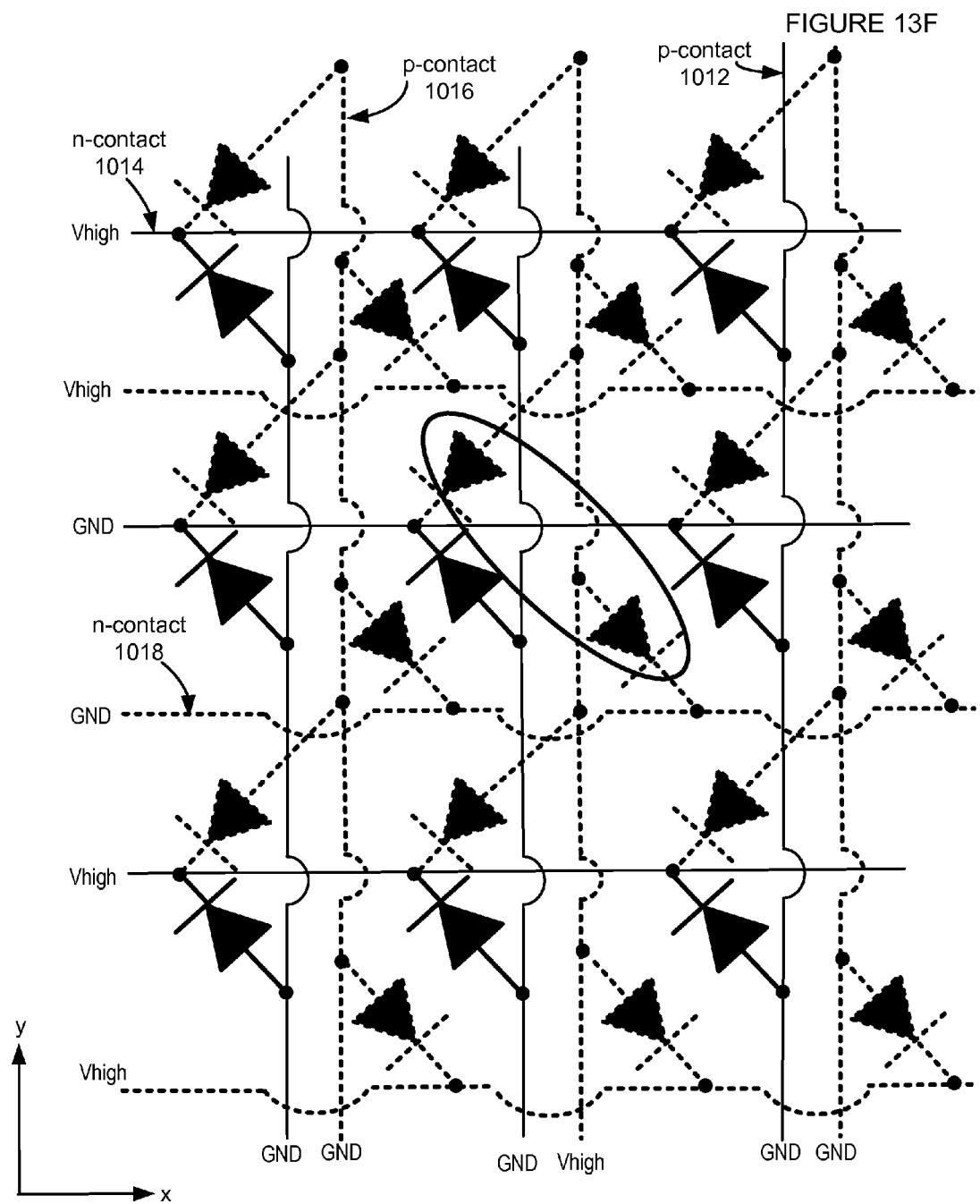
Figure 13G:
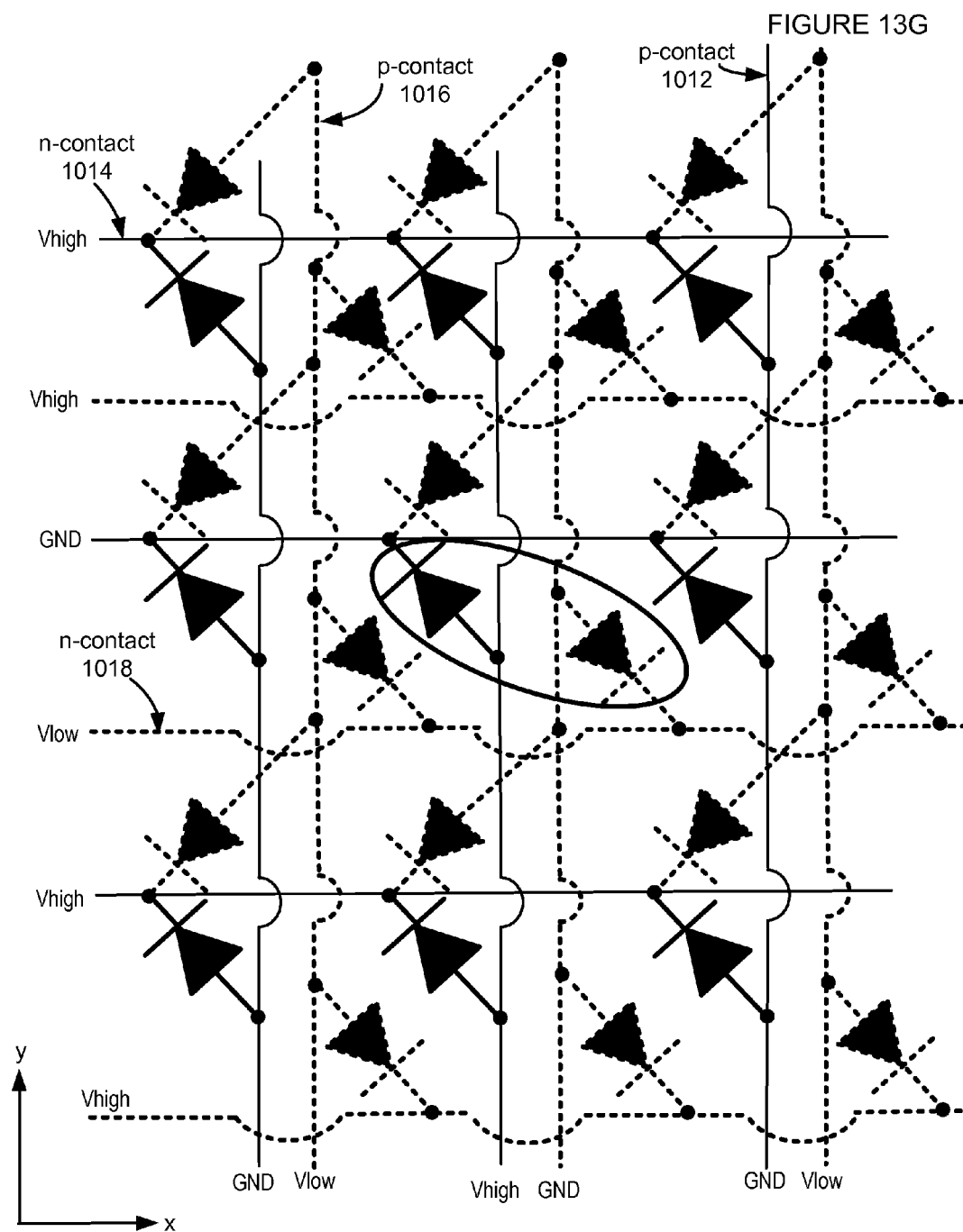
Figure 13H:
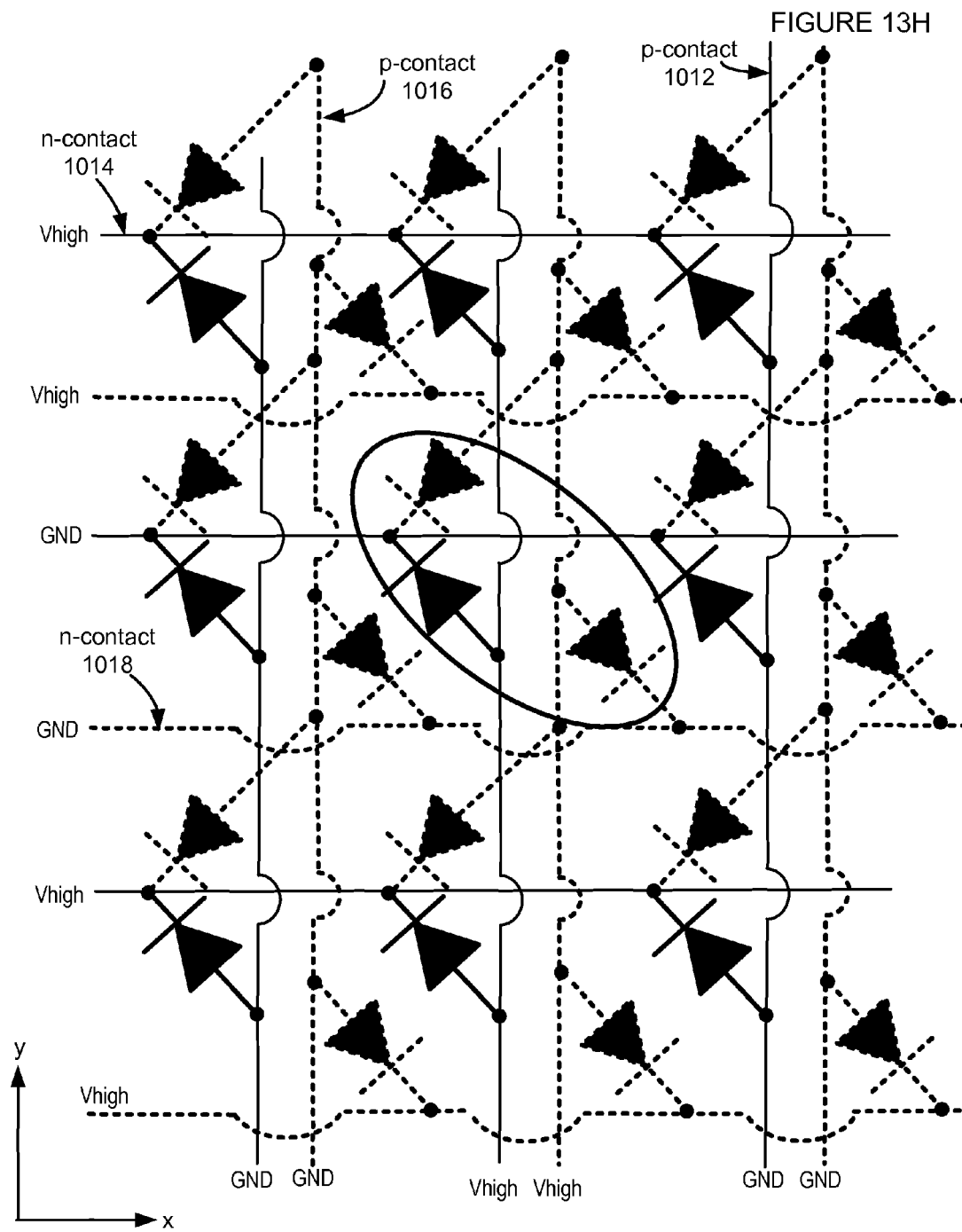

In FIG. 13A all sub-pixels are off due to grounding all contacts. Note that even the circled sub-pixels are off in FIG. 13A; however, they are circled to highlight that those three sub-pixels form the pixel that this discussion is focused upon. In FIG. 13B, the blue (circled) sub-pixel is on, whereas the green and red sub-pixels are off. In FIG. 13C, the green (circled) sub-pixel is on, whereas the blue and red sub-pixels are off. In FIG. 13D, the red sub-pixel (circled) is on, whereas the green and red sub-pixels are off. In FIG. 13E, the green and blue sub-pixels are on, whereas the red sub-pixel is off. In FIG. 13F, the green and red sub-pixels (circled) are on, whereas the blue sub-pixel is off. In FIG. 13G, the red and blue sub-pixels are on, whereas the green sub-pixel is off. Note that this is the only case in which the voltage Vlow is used. For example, the red sub-pixel is biased by the applying GND to one terminal and Vlow to the other terminal to forward bias the diode. In FIG. 13H, the red, blue and green sub-pixels (circled) of the pixel under discussion are all on.

Figure 13I:
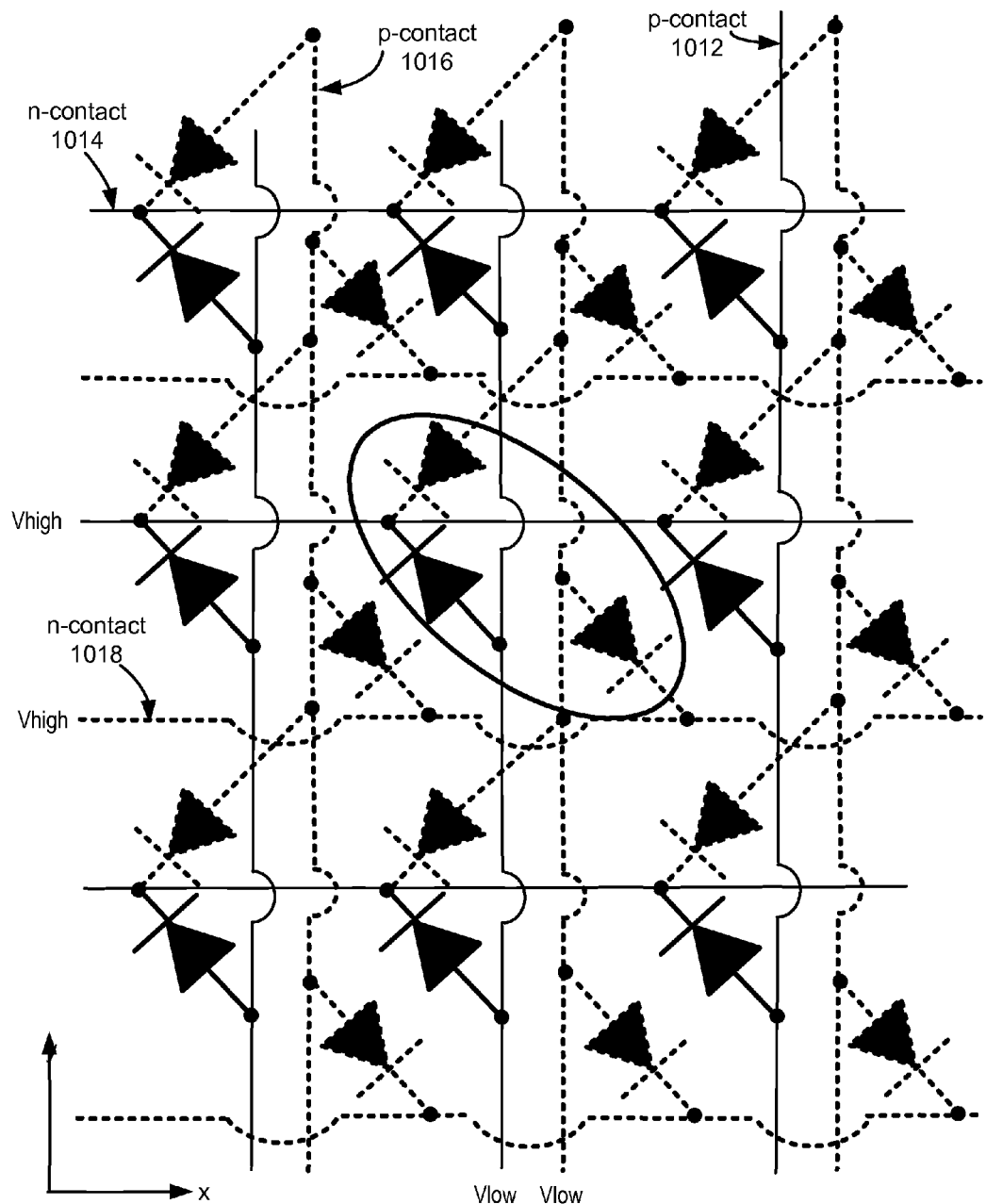
FIG. 13I depicts one embodiment of a biasing scheme in which three different color sub-pixels are operated simultaneously for photo-detector operation.

Note that three different colors of sub-pixels may be simultaneously selected when operating as a photo-detector. For example, FIG. 13I shows one possible biasing scheme for selecting three different colors of sub-pixels in the same nanostructure for photo-detector operation. As can be seen three sub-pixels are reversed biased and therefore, selected for photo-detector operation. Circuits for detecting the generated currents are not explicitly shown in FIG. 13I. Unselected sub-pixels have open circuits, and do not require a voltage applied to both of their contacts. As mentioned, operation may be possible without basing the contacts, so long as the circuit is closed. Also note that any combination of colors of sub-pixels can be selected in one nanostructure, while selecting a different combination of colors of sub-pixels in another nanostructure. For example, a red and a blue (but not green) sub-pixel could be selected in one nanostructure while selecting a green and red (but not blue) sub-pixel in the other nanostructure.

Example Process of Fabricating a Pixilated Optoelectronic Device

Figure 14:
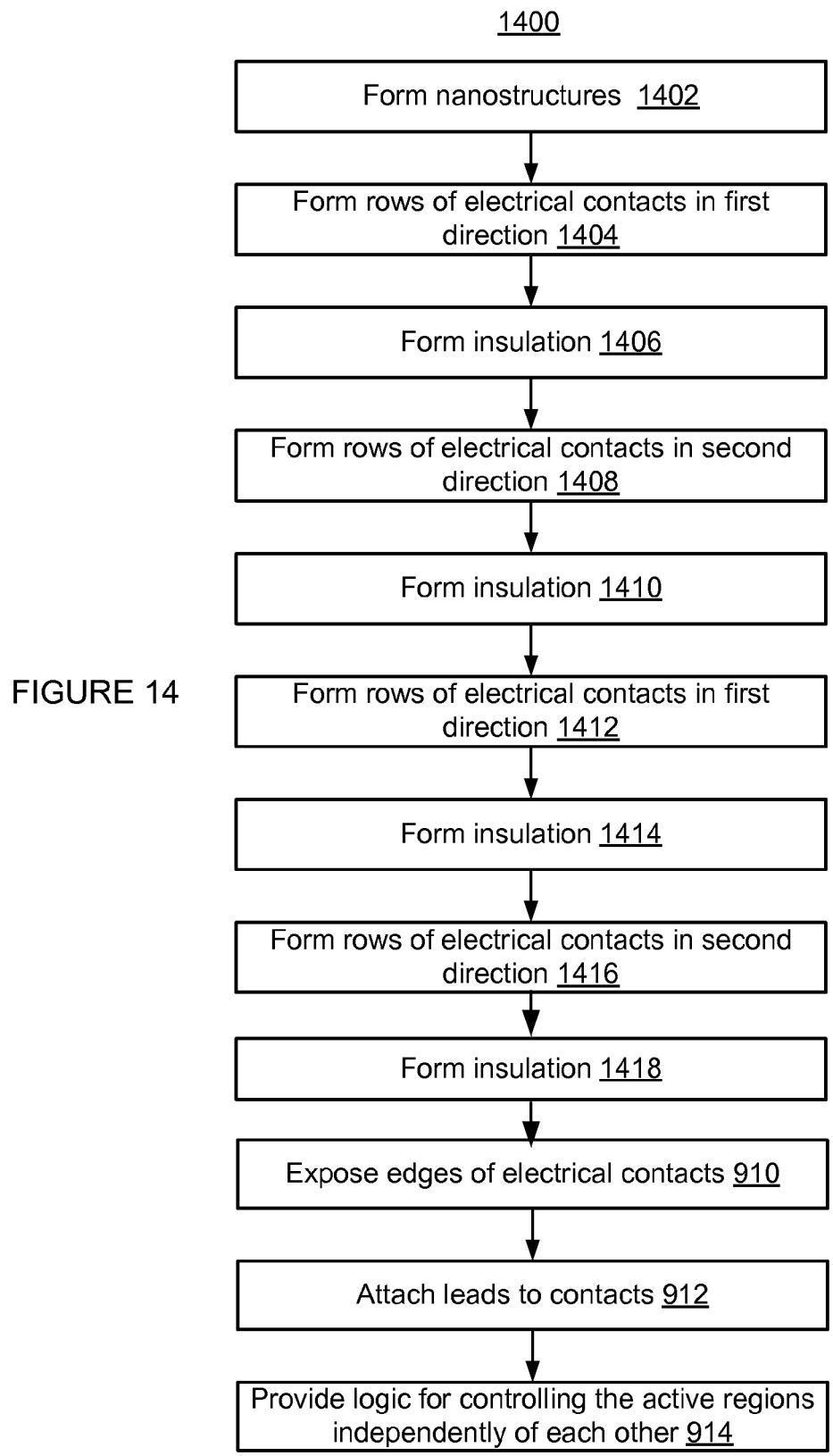
FIG. 14 depicts one embodiment of a process of fabricating a pixilated optoelectronic device.

FIG. 14 depicts one embodiment of a process 1400 of fabricating an optoelectronic device. Process 1400 may be used to form a device such as devices 1000 depicted in FIGS. 10A and 10B. Reference will be made to those devices, but process 1400 is not so limited. In step 1402, nanostructures are formed. Step 1402 may be similar to step 502 of process 500 and will not be discussed in detail. In step 1404, a row of electrical contacts that run in a first direction is formed. Step 1404 may be performed by depositing metal, then patterning and etching to form rows of contacts. As one example, n-contacts 1018 are formed. Note that this row could be p-contacts, depending on the doping of the nanostructures 96.

In step 1406 insulation is formed. For example, SOG, silicon dioxide, photoresist or another material is deposited. The insulation may fill spaces between the rows of contacts and also may form a layer over the rows to serve as a base for the next row of contacts.

In step 1408, a row of electrical contacts that run in a second direction is formed. The second direction may be orthogonal to the first. Step 1408 may be performed by depositing metal, then patterning and etching to form rows of contacts. As one example, p-contacts 1016 are formed. In step 1410, additional insulation is formed. For example, SOG, silicon dioxide, photoresist or another material is deposited. The insulation may fill spaces between the rows of contacts 1016 and also may form a layer over the rows of contacts 1016 to serve as a base for the next row of contacts.

In step 1412, another row of electrical contacts that run in the first direction is formed. Step 1412 may be performed by depositing metal, then patterning and etching to form rows of contacts. As one example, n-contacts 1014 are formed. In step 1414, additional insulation is formed. For example, SOG, silicon dioxide, photoresist or another material is deposited. The insulation may fill spaces between the rows of contacts 1014 and also may form a layer over the rows of contacts 1014 to serve as a base for the next row of contacts.

In step 1416, another row of electrical contacts that run in the second direction is formed. Step 1416 may be performed by depositing metal, then patterning and etching to form rows of contacts. As one example, p-contacts 1012 are formed. In step 1418, additional insulation is formed (optional). For example, SOG, silicon dioxide, photoresist or another material is deposited. The insulation may fill spaces between the rows of contacts 1012.

In step 910, edges of the electrical contacts are exposed. The edges may be exposed using a wide variety of techniques including etching and photolithography. In step 912 leads are attached to the electrical contacts. FIG. 10A depicts an example of a device 1000 having exposed edges with leads 112 attached.

In step 914, control logic 725 is provided. Step 725 may include forming switches to connect the contacts 104 to different voltage sources, and providing hardware or software to control the switches. The control logic 725 may be operable to perform functions such as those discussed in connection with FIGS. 7A-7C, 8A-8C and 11. The control logic 725 may include any combination of hardware and/or software.

Other Variations of Pixilated Nanostructure Optoelectronic Devices

FIG. 15A is a diagram of one embodiment of a pixilated nanostructure optoelectronic device. The device is similar to the one depicted in FIG. 10A. However, it has an additional set of p-contacts 1015 that run in the y-direction. There is also an additional layer of insulation 1025, which is located between the p-contacts 1015 and p-contacts 1016.

Figure 15B:
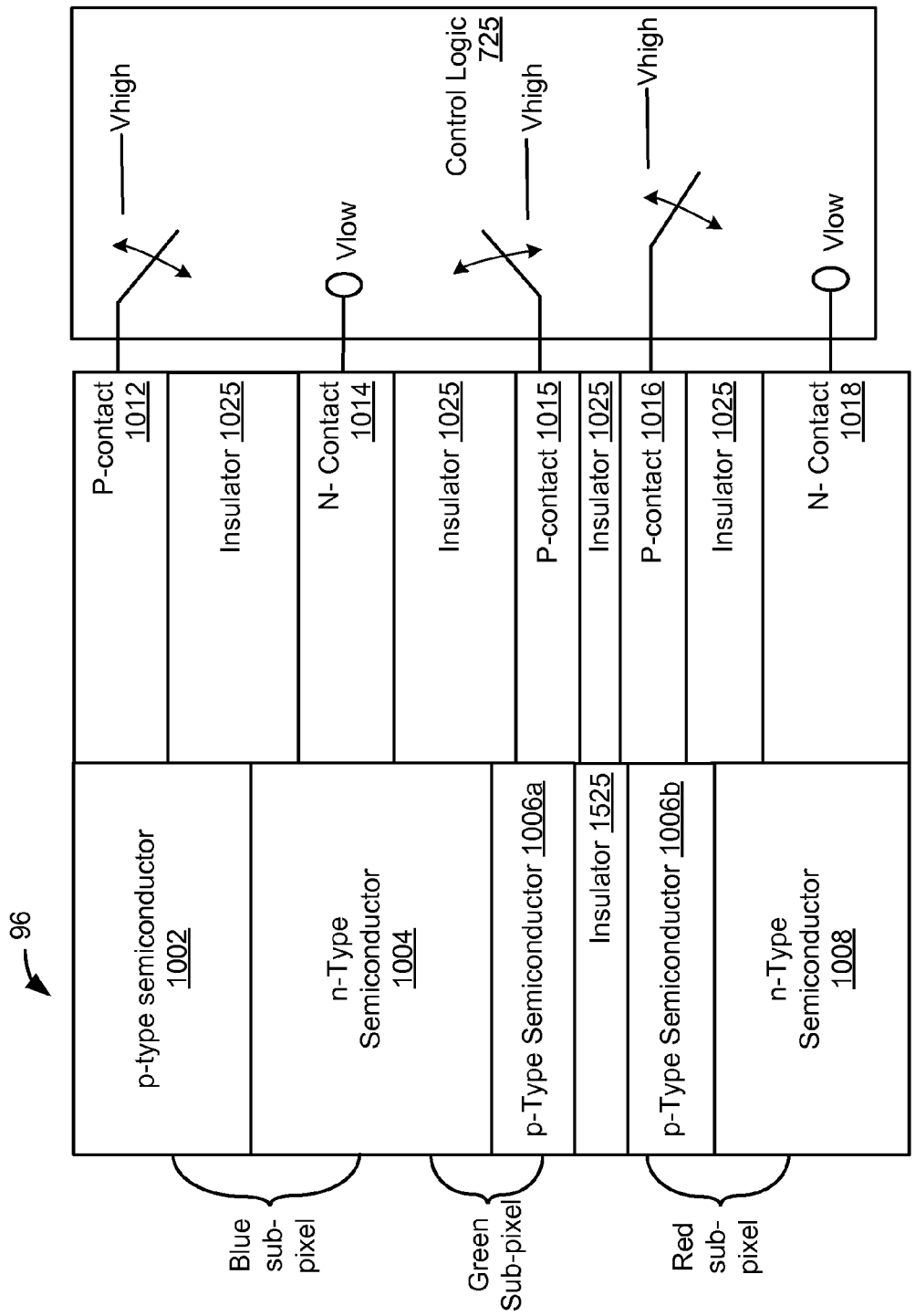
FIG. 15B is a side perspective view of the device of FIG. 15A.

FIG. 15B is a side cross-sectional view of the device 1500 of FIG. 15A. This view shows how the contacts and insulation make connection to one of the nanostructures 96. Note that the p-type semiconductor 1006 is separated into two regions 1006a, 1006b by a layer of insulation 1525. This may aid is allowing the red sub-pixel to be operated independent of the green sub-pixel. The insulation 1525 may be an insulating semiconductor that is formed during growth of the nanostructures 96. Therefore, the nanostructures 96 have a region having alternating layers of a semiconductor having a first type of conductivity (e.g., region 1006a), an insulator (e.g., 1525), and a semiconductor having the first type of conductivity (e.g., 1006b).

In this example, the n-contacts 1014 and 1018 are connected to ground. The control logic 725 connects p-contact 1012 to Vhigh to select the blue sub-pixel. The control logic 725 connects p-contact 1015 to Vhigh to select the green sub-pixel. The control logic 725 connects p-contact 1016 to Vhigh to select the red sub-pixel. In one embodiment, the control logic 725 connects the p-contact 1012 to GND to unselect (turn off) the blue sub-pixel. In one embodiment, the control logic 725 connects the p-contact 1015 to GND to unselect (turn off) the green sub-pixel. In one embodiment, the control logic 725 connects the p-contact 1016 to GND to unselect (turn off) the red sub-pixel. Therefore, the control logic 725 is able to independently select any of the sub-pixels. Note that a different biasing scheme may be used to select the sub-pixels.

Note that alternatives to the structure of FIGS. 15A and 15B is to have the extra layer of insulation separate the blue and green sub-pixels instead of (or in addition to) the insulation 1025 that separates the red and green sub-pixels. For example, n-type semiconductor 1004 could be separated into two regions by an insulator. In such an embodiment, the n-contact 1014 could be replaced by two contacts separated by an insulator.

Note that numerous examples have been provided in which the devices have three colors of sub-pixels. However, the device may have any number of sub-pixels. These sub-pixels may correspond to many different wavelengths of light. It is not required that a sub-pixel corresponds to a wavelength of visible light.

In some embodiment, an optoelectronic device with sidewall electrical contacts may be operated as a spectrometer. For example, additional layers may be added to the device 1000 of FIGS. 10A-10B or the device 300 of FIGS. 3A-3C to allow for detection of light at many more distinct wavelength ranges. The control logic 725 may be configured to separately control each layer to detect light of each distinct wavelength range. Note that there may be some overlap in the range of wavelengths that two different sub-pixels correspond to.

Example Computing Platform

In various embodiments, the control logic 725 executes computer readable instructions that are stored on computer readable media. For example, process 800, 815, 840, and 1100 may be implemented at least in part by executing, on a processor, instructions that are stored on a computer readable storage medium. Computer readable media can be any available media that can be accessed by the electronic devices. By way of example, and not limitation, computer readable media may comprise computer storage media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the computer readable instructions and which can accessed by the electronic devices.

The computer executable instructions may include program modules. Generally, program modules include routines, programs, objects, components, data structures, etc., that perform particular tasks or implement particular abstract data types. Embodiments may also be practiced in distributed computing environments where tasks are performed by remote processing devices that are linked through a communication network. In a distributed computing environment, program modules may be located in both local and remote computer storage media including memory storage devices.

Figure 16:
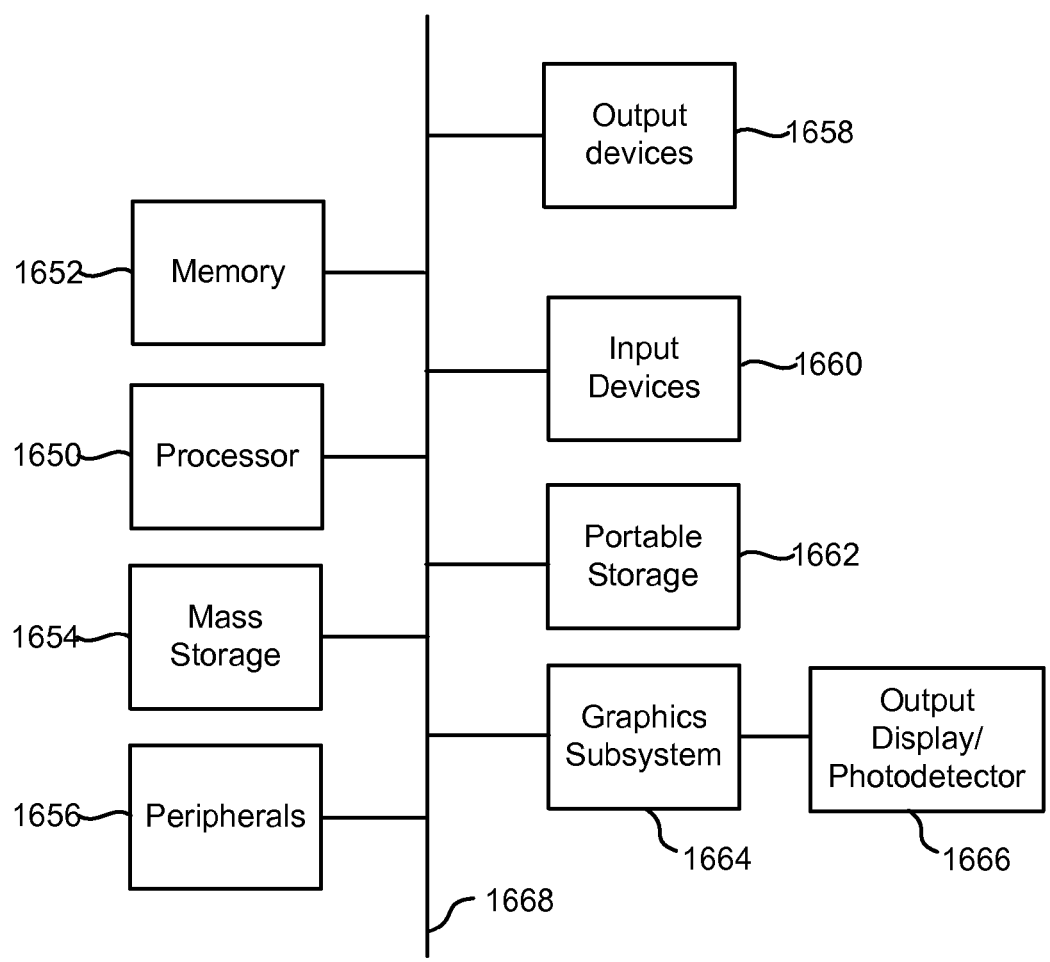
FIG. 16 is a block diagram of one embodiment of a computing system for use with embodiments of technology disclosed herein.

FIG. 16 is a block diagram of one embodiment of a computing system for use with the present technology. Note that some embodiments do not require all of the elements depicted in FIG. 16. In some embodiments, the output display/photo-detector 1666 is an LED display. For example, technology described herein may be used to form pixels of the LED. The computing device is able to implement the control logic 725 in order to control the LED. In some embodiments, at least some of the functionality of the control logic 725 is implemented by executing instructions on the processor 1650. In some embodiments, the output display/photo-detector 1666 is able to function as a photo-detector. For example, technology described herein may be used to form pixels of a photo-detector.

The computer system includes one or more processors 1650 and main memory 1652 which stores, in part, instructions and data for execution by processor unit 1650. If the system of the present invention is wholly or partially implemented in software, main memory 1652 can store the executable code when in operation. Also provided are a mass storage device 1654, peripheral device(s) 1656, user input device(s) 1660, output devices 1658, portable storage medium drive(s) 1662, a graphics subsystem 1664 and an output display 1666. For simplicity, the components are depicted as being connected via a single bus 1668. However, the components may be connected through one or more data transport means. For example, processor unit 1650 and main memory 1652 may be connected via a local microprocessor bus, and the mass storage device 1654, peripheral device(s) 1656, portable storage medium drive(s) 1662, and graphics subsystem 1664 may be connected via one or more input/output (I/O) buses. Mass storage device 1654, which may be implemented with a magnetic disk drive or an optical disk drive, is a non-volatile storage device for storing data and instructions for use by processor unit 1650. In one embodiment, mass storage device 1654 stores the system software for implementing the present invention for purposes of loading to main memory 1652.

Portable storage medium drive 1662 operates with a portable non-volatile storage medium, such as a floppy disk, to input and output data and code to and from the computer system. In one embodiment, the system software for implementing the embodiments is stored on such a portable medium, and is input to the computer system via the portable storage medium drive 1662. Peripheral device(s) 1656 may include any type of computer support device, such as an input/output (I/O) interface, to add additional functionality to the computer system. For example, peripheral device(s) 1656 may include a network interface for connecting the computer system to a network, a modem, a router, etc.

User input device(s) 1660 provides a portion of a user interface. User input device(s) 1660 may include an alphanumeric keypad for inputting alpha-numeric and other information, or a pointing device, such as a mouse, a trackball, stylus, or cursor direction keys. In order to display textual and graphical information, the computer system includes graphics subsystem 1664 and output display 1666. Graphics subsystem 1664 receives textual and graphical information, and processes the information for output to output display 1666. Additionally, the computer system includes output devices 1658. Examples of suitable output devices include speakers, printers, network interfaces, monitors, etc.

The components contained in the computer system are those typically found in computer systems suitable for use with the embodiments, and are intended to represent a broad category of such computer components that are well known in the art. Thus, the computer system can be a personal computer, hand held computing device, telephone, mobile computing device, workstation, server, minicomputer, mainframe computer, or any other computing device. The computer system can also include different bus configurations, networked platforms, multi-processor platforms, etc. Various operating systems can be used including Unix®, Linux®, Windows®, Macintosh® OS, Palm OS®, and other suitable operating systems.

One embodiment disclosed herein includes an optoelectronic device comprising a plurality of nanostructures that include photo-active regions. The nanostructures have tops, bottoms, and sidewalls. The device has a bottom electrical contact in electrical contact with the bottoms of the plurality of nanostructures, and a top electrical contact in electrical and physical contact with sidewalls of the plurality of nanostructures, wherein the top electrical contact leaves a top portion of the plurality of nanostructures exposed to allow light to enter or leave the plurality of nanostructures from the tops of the plurality of nanostructures without passing through the top electrical contact.

One embodiment disclosed herein includes a method for forming an optoelectronic device comprising: forming a plurality of nanostructures, the nanostructures including photoactive regions, the plurality of nanostructures having tops, bottoms, and sidewalls; forming a bottom electrical contact in electrical contact with the bottoms of the plurality of nanostructures; and forming a top electrical contact in electrical and physical contact with sidewalls of the plurality of nanostructures, wherein the top electrical contact leaves a top portion of the plurality of nanostructures exposed to allow light to enter or leave the plurality of nanostructures from the tops of the plurality of nanostructures without passing through the top electrical contact.

One embodiment disclosed herein includes an optoelectronic device comprising an array of nanostructures formed from a material that includes one more semiconductors, the nanostructures including one or more p-n junctions, the nanostructures including photo-active regions associated with the p-n junctions, the plurality of nanostructures having tops, bottoms, and sidewalls, the nanostructures have spaces between them; a bottom electrical contact in electrical contact with the bottoms of the nanostructures; and a top electrical contact in electrical and physical contact with the sidewalls of the nanostructures, wherein the top electrical contact is substantially opaque to light having a wavelength that is absorbed or generated by the photo-active regions.

One embodiment disclosed herein includes a multi junction solar cell comprising a plurality of nanostructures, the plurality of nanostructures having first regions of a first conductivity type and second regions of a second conductivity type to form first p-n junctions, the plurality of nanostructures having third regions of the first conductivity type and fourth regions of the second conductivity type to form second p-n junctions; and a bi-layer electrical interconnect having a first material in electrical and physical contact with the second regions and a second material in electrical and physical contact with the third regions, the first material and the second material are in electrical contact with each other to allow charge to flow between the second regions and the third regions through the bi-layer electrical interconnect.

One embodiment disclosed herein includes method for forming a multi junction solar cell comprising: forming a plurality of nanostructures, the plurality of nanostructures having first regions of a first conductivity type and second regions of a second conductivity type to form first p-n junctions, the plurality of nanostructures having third regions of the first conductivity type and fourth regions of the second conductivity type to form second p-n junctions; and forming a bi-layer electrical interconnect having a first material in electrical and physical contact with the second regions and a second material in electrical and physical contact with the third regions, the first material and the second material are in electrical contact with each other to allow charge to flow between the second regions and the third regions through the bi-layer electrical interconnect.

One embodiment disclosed herein includes a multi junction solar cell comprising: an array of nanostructures, nanostructures in the array of nanostructures having a plurality of photo-active regions, each photo-active regions is configured to absorb light of a different range of frequencies; and a bi-layer electrical interconnect providing a path for electrical current flow between adjacent ones of the photo-active regions, each bi-layer electrical interconnect having a first layer that makes Ohmic contact with a p-type semiconductor and a second layer that makes Ohmic contact with an n-type semiconductor.

One embodiment disclosed herein includes an optoelectronic device comprising a plurality of nanostructures, the plurality of nanostructures having first regions of a first conductivity type and second regions of a second conductivity type associated with first photo-active junctions, the plurality of nanostructures having third regions of the first conductivity type, the second regions and third regions are associated with second photo-active junctions; a first electrical contact in electrical contact with the first regions; a second electrical contact in electrical and physical contact with the second regions; a third electrical contact in electrical contact with the third regions; and logic coupled to the first electrical contact, the second electrical contact, and the third electrical contact, the logic controls the first photo-active junctions independently of the second photo-active junctions.

One embodiment disclosed herein includes a method of operating an optoelectronic device that includes a plurality of nanostructures, the plurality of nanostructures having first regions of a first conductivity type and second regions of a second conductivity type to form first photo-active junctions, the plurality of nanostructures having third regions of the first conductivity type that form second photo-active junctions with the second regions, a first electrical contact in electrical contact with the first regions, a second electrical contact in electrical and physical contact with the second regions, a third electrical contact in electrical contact with the third regions. The method comprises: controlling the first photo-active junctions to either generate or detect light of a first range of wavelengths; and controlling the second photo-active junctions to either generate or detect light of a second range of wavelengths, controlling the first photo-active junctions and the second photo-active junctions are performed independently of each other.

One embodiment disclosed herein includes a method of forming an optoelectronic device, the method comprising: forming a plurality of nanostructures, the plurality of nanostructures having first regions of a first conductivity type and second regions of a second conductivity type to form first photo-active junctions, the plurality of nanostructures having third regions of the first conductivity type that form second photo-active junctions with the second regions; forming a first electrical contact in electrical contact with the first regions; forming a second electrical contact in electrical and physical contact with the second regions; forming a third electrical contact in electrical contact with the third regions; and providing logic coupled to the first electrical contact, the second electrical contact, and the third electrical contact, the logic controls the first photo-active junctions independently of the second photo-active junctions.

One embodiment disclosed herein includes an optoelectronic device comprising: a nanostructure array, the nanostructures having sidewalls, groups of one or more nanostructures in the array forming pixels; a first group of electrical contacts physically and electrically connected to the sidewalls, the first group of electrical contacts are aligned in a first direction; and a second group of electrical contacts physically and electrically coupled to the sidewalls, the second group of electrical contacts are aligned in a second direction that is orthogonal to the first direction; wherein the pixels are individually controllable by applying appropriate voltages to the first group of electrical contacts and to the second group of electrical contacts.

One embodiment disclosed herein includes a method of operating an optoelectronic device that includes a nanostructure array, groups of one or more nanostructures in the array forming pixels having at least two sub-pixels, the method comprising: controlling first sub-pixels to generate or detect light of a first range of wavelengths; and controlling second sub-pixels to generate or detect light of a second range of wavelengths. The first and second sub-pixels are controlled independently.

In the foregoing specification, several examples have been provided in which active regions of devices are associated with p-type and n-type regions. Note that there may be an unintentionally doped region between the p-type and n-type regions. Also note that p-type and n-type regions may be switched with suitable adjustments to operation of the device (such as reversing the polarity of applied voltages). Further note that example shapes of nanostructures having been depicted for illustrative purposes. However, other shapes are possible. Thus, embodiments are not to be limited to columnar shapes, for example. Also note that different shaped tops of nanostructures have been provided for illustration. Other top shapes are possible.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A multi junction solar cell comprising:
    a plurality of nanostructures having tops, bottoms, and sidewalls between the tops and bottoms, the plurality of nanostructures having first regions of a first conductivity type and second regions of a second conductivity type to form first p-n junctions, the plurality of nanostructures having third regions of the first conductivity type and fourth regions of the second conductivity type to form second p-n junctions, the first and second regions form a first diode, the third and fourth regions form a second diode; and
    a bi-layer sidewall electrical interconnect that surrounds the sidewalls and is in physical contact with the sidewalls, the bi-layer sidewall electrical interconnect having a first material in electrical and physical contact with the second regions and a second material in electrical and physical contact with the third regions, the first material and the second material are in electrical contact with each other to allow current generated by absorption of photons in the first and second p-n junctions to flow between the first diode and the second diode through the bi-layer sidewall electrical interconnect.

2. The multi junction solar cell of claim 1, wherein the first material forms an Ohmic contact with the second regions, and the second material forms an Ohmic contact with the third regions.

3. The multi junction solar cell of claim 1, further including a top electrical contact in electrical and physical contact with a portion of the sidewalls of the plurality of nanostructures.

4. The multi junction solar cell of claim 3, wherein the top electrical contact leaves a top portion of the plurality of nanostructures exposed to allow light to enter or leave the plurality of nanostructures from the tops of the plurality of nanostructures without passing through the top electrical contact.

5. The multi junction solar cell of claim 4, wherein the top electrical contact is in electrical and physical contact with the first regions.

6. The multi junction solar cell of claim 1, further including a bottom electrical contact in electrical and physical contact with a portion of the sidewalls of the plurality of nanostructures.

7. The multi junction solar cell of claim 6, wherein the bottom electrical contact is in electrical and physical contact with the fourth regions.

8. The multi junction solar cell of claim 1, wherein the first and second regions include a first photo-active region configured to absorb light of a first range of frequencies, the third and fourth regions include a second photo-active region configured to absorb light of a second range of frequencies that is different from the first range of frequencies.

9. A method for forming a multi junction solar cell comprising:
    forming a plurality of nanostructures having tops, bottoms, and sidewalls running between the tops and bottoms, the plurality of nanostructures having first regions of a first conductivity type and second regions of a second conductivity type to form first p-n junctions, the plurality of nanostructures having third regions of the first conductivity type and fourth regions of the second conductivity type to form second p-n junctions, the first and second regions form a first diode, the third and fourth regions form a second diode; and forming a bi-layer sidewall electrical interconnect that surrounds the sidewalls and is in physical contact with the sidewalls, the bi-layer sidewall electrical interconnect having a first material in electrical and physical contact with the second regions and a second material in electrical and physical contact with the third regions, the first material and the second material are in electrical contact with each other to allow charge to flow between the second regions and the third regions through the bi-layer electrical interconnect, the bi-layer sidewall bi layer electrical interconnect provides a path for current generated by absorption of photons in the first and second p-n junctions to flow between the first diode and the second diode.

10. The method of claim 9, wherein the first material forms an Ohmic contact with the second regions, and the second material forms an Ohmic contact with the third regions.

11. The method of claim 9, further including forming a top electrical contact in electrical and physical contact with a portion of the sidewalls of the plurality of nanostructures.

12. The method of claim 11, wherein the top electrical contact leaves a top portion of the plurality of nanostructures exposed to allow light to enter or leave the plurality of nanostructures from the tops of the plurality of nanostructures without passing through the top electrical contact.

13. The method of claim 12, wherein the top electrical contact is in electrical and physical contact with the first regions.

14. The method of claim 11, further including forming a bottom electrical contact in electrical and physical contact with a portion of the sidewalls of the plurality of nanostructures.

* * * * *

UNITED STATES PATENT AND TRADEMARK OFFICE
CERTIFICATE OF CORRECTION

PATENT NO. : 8,431,817 B2
APPLICATION NO. : 12/796589
DATED : April 30, 2013
INVENTOR(S) : J. Kim et al.

It is certified that error appears in the above-identified patent and that said Letters Patent is hereby corrected as shown below:

In the Claims:

At column 31, line 10 (claim 9, line 22) of the printed patent, please delete "bi layer" after "sidewall".

Signed and Sealed this
Tenth Day of September, 2013

Teresa Stanek Rea
*Acting Director of the United States Patent and Trademark Office*